(12) United States Patent
Masuoka et al.

(10) Patent No.: US 9,224,835 B2
(45) Date of Patent: Dec. 29, 2015

(54) METHOD FOR PRODUCING SGT-INCLUDING SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/689,640

(22) Filed: Apr. 17, 2015

(65) Prior Publication Data

US 2015/0221750 A1    Aug. 6, 2015

Related U.S. Application Data

(63) Continuation of application No. PCT/JP2013/071968, filed on Aug. 15, 2013.

(51) Int. Cl.
| | |
|---|---|
| H01L 21/336 | (2006.01) |
| H01L 21/20 | (2006.01) |
| H01L 29/66 | (2006.01) |
| H01L 29/78 | (2006.01) |
| H01L 27/092 | (2006.01) |
| H01L 21/8238 | (2006.01) |
| H01L 27/11 | (2006.01) |
| H01L 21/8234 | (2006.01) |
| H01L 29/423 | (2006.01) |

(52) U.S. Cl.
CPC .. *H01L 29/66666* (2013.01); *H01L 21/823412* (2013.01); *H01L 21/823425* (2013.01); *H01L 21/823885* (2013.01); *H01L 27/092* (2013.01); *H01L 27/1104* (2013.01); *H01L 27/1108* (2013.01); *H01L 29/4238* (2013.01); *H01L 29/66787* (2013.01); *H01L 29/7827* (2013.01)

(58) Field of Classification Search
USPC .......................................... 438/268, 270, 396
See application file for complete search history.

(56) References Cited

U.S. PATENT DOCUMENTS

| | | |
|---|---|---|
| 2010/0200913 A1 | 8/2010 | Masuoka et al. |
| 2011/0115011 A1 | 5/2011 | Masuoka et al. |

(Continued)

FOREIGN PATENT DOCUMENTS

| | | |
|---|---|---|
| JP | H02-188966 | 7/1990 |
| JP | 2011-108702 A | 6/2011 |
| WO | WO 2009/096000 A1 | 8/2009 |

OTHER PUBLICATIONS

International Search Report with English Translation for PCT/JP2013/071968 dated Oct. 30, 2013, 2 pages.

(Continued)

*Primary Examiner* — Marc Armand
*Assistant Examiner* — Wilner Jean Baptiste
(74) *Attorney, Agent, or Firm* — Brinks Gilson & Lione

(57) ABSTRACT

Isotropic etching is conducted by using SiN layers that are disposed on i-layers having an island structure on an i-layer substrate and have the same rectangular shape in a plan view as the i-layers. As a result, $SiO_2$ layers each having a circular shape in a plan view are formed. Then the SiN layers are removed and the i-layers are etched by using the $SiO_2$ layers as a mask to form Si pillars. Then surrounding gate MOS transistors are formed in the Si pillars.

8 Claims, 44 Drawing Sheets

(56) References Cited

U.S. PATENT DOCUMENTS

| | | | |
|---|---|---|---|
| 2011/0143509 A1* | 6/2011 | Fujimoto | H01L 27/10876 438/270 |
| 2012/0270374 A1 | 10/2012 | Masuoka et al. | |
| 2013/0069149 A1* | 3/2013 | Masuoka | H01L 21/84 257/330 |

OTHER PUBLICATIONS

Takato et al., "Impact of Surrounding Gate Transistor (SGT) for Ultra-High-Density LSI's", *IEEE Transactions on Electron Devices*, vol. 38, No. 3, Mar. 1991, pp. 573-578.

* cited by examiner

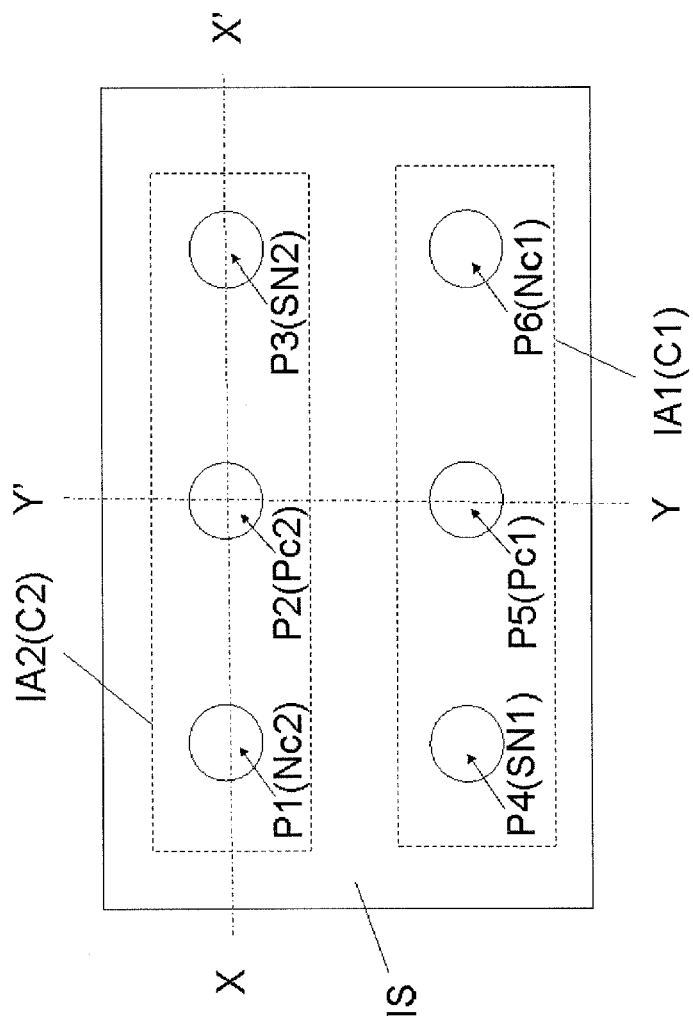

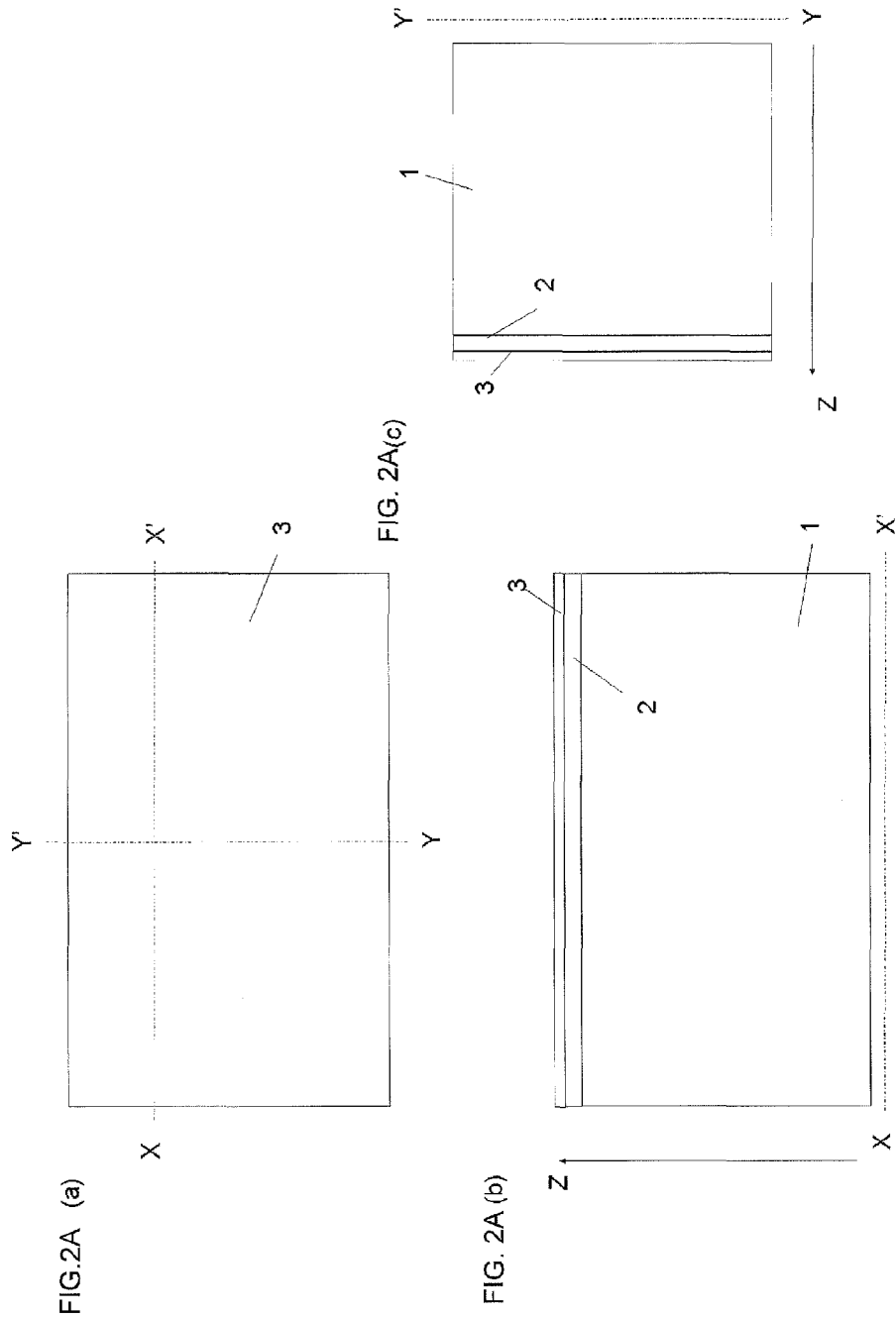

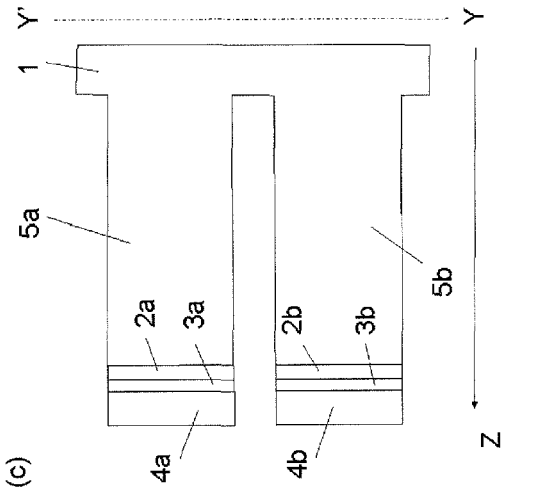
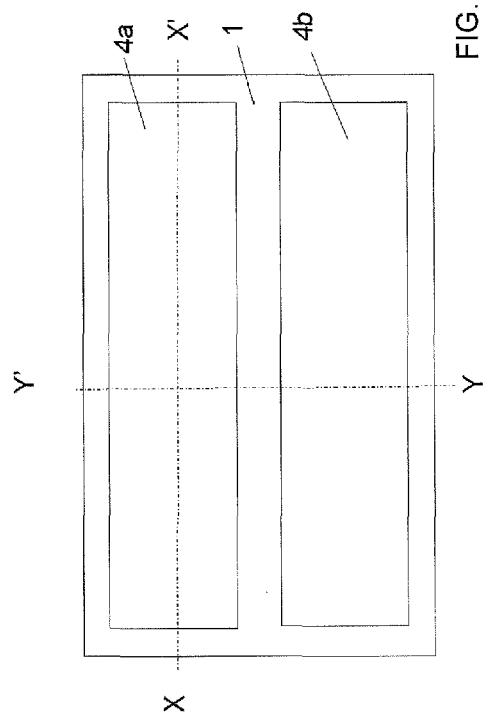
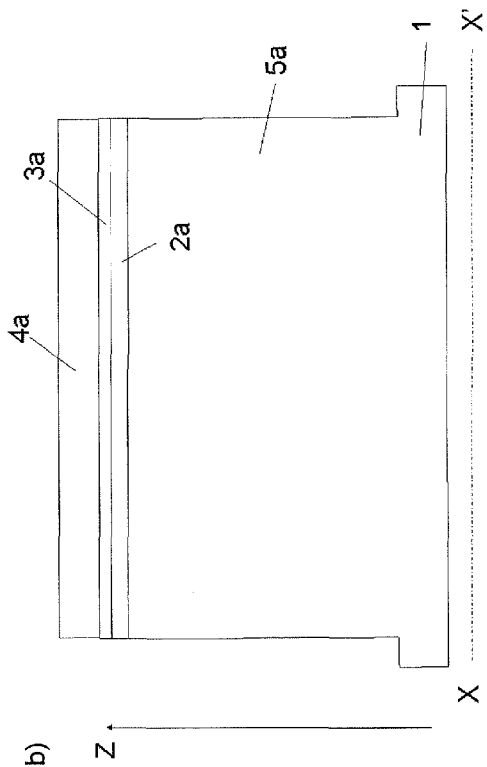

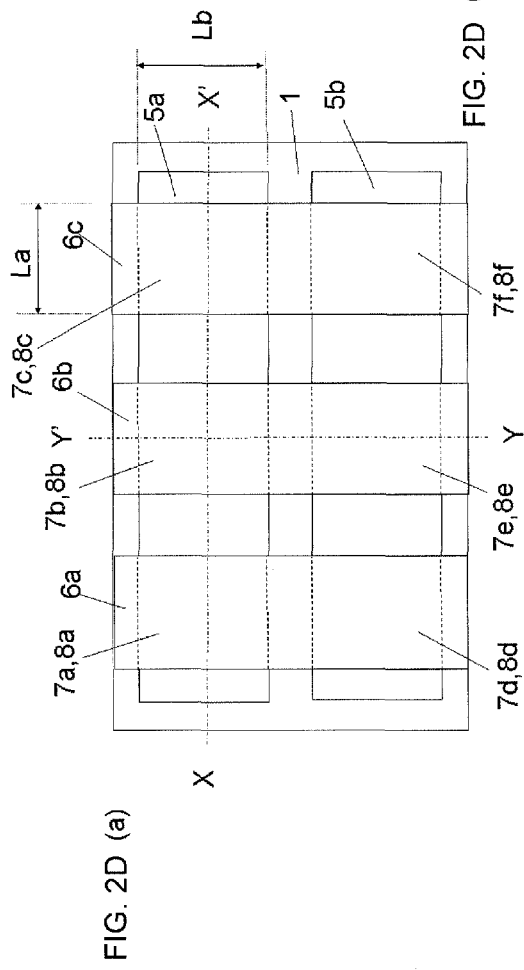
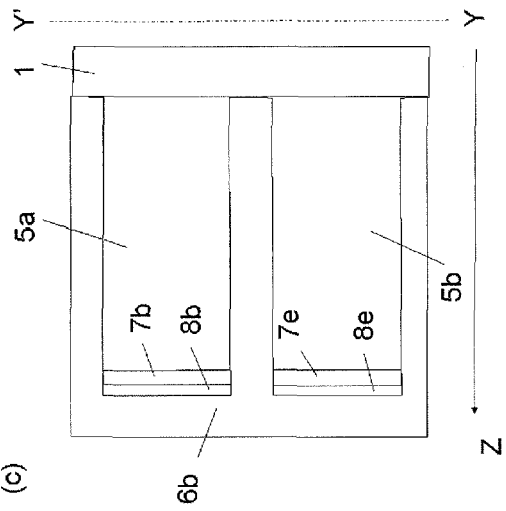
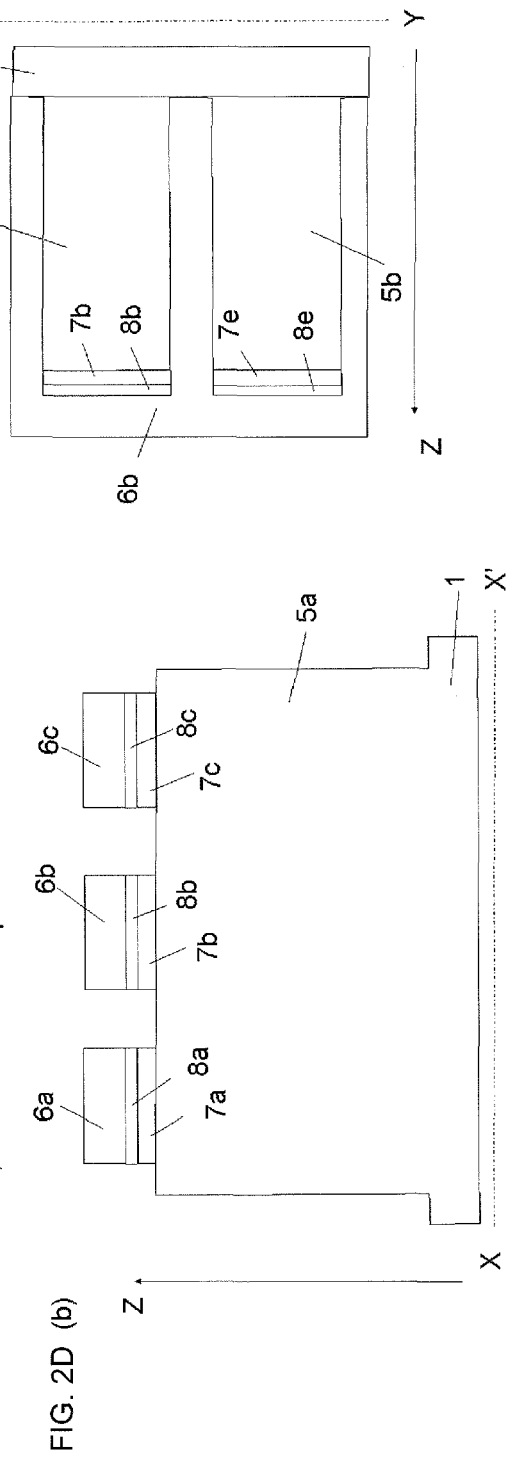
FIG. 2D (a)
FIG. 2D (b)
FIG. 2D (c)

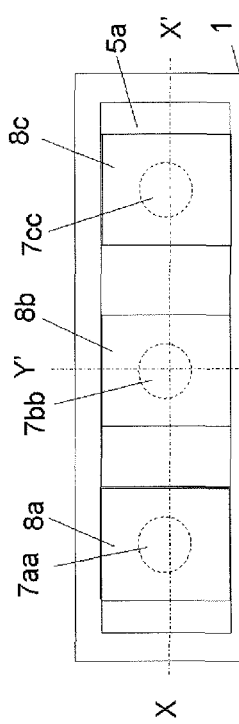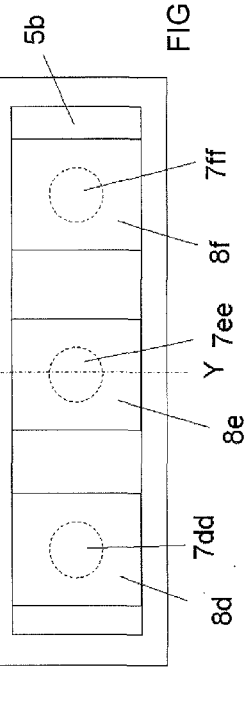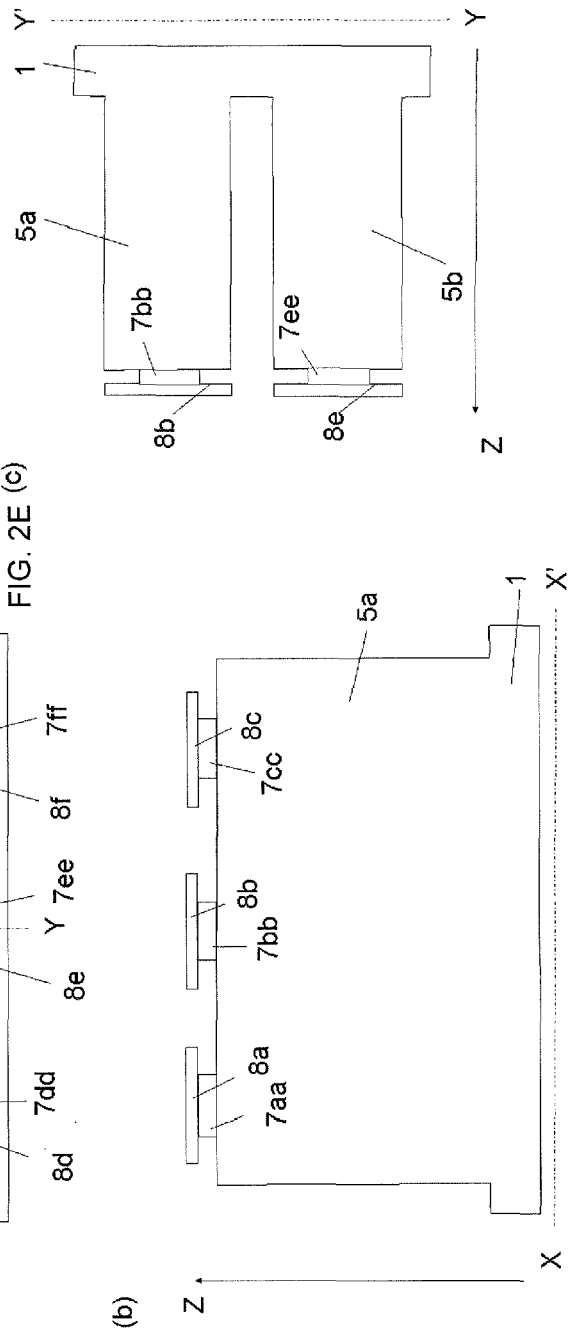
FIG. 2E (a)
FIG. 2E (b)
FIG. 2E (c)

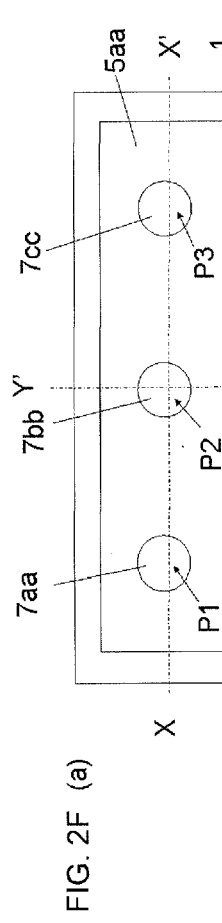
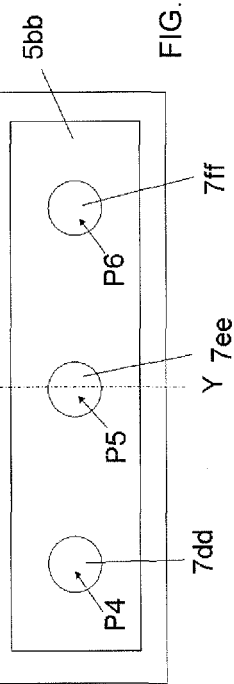
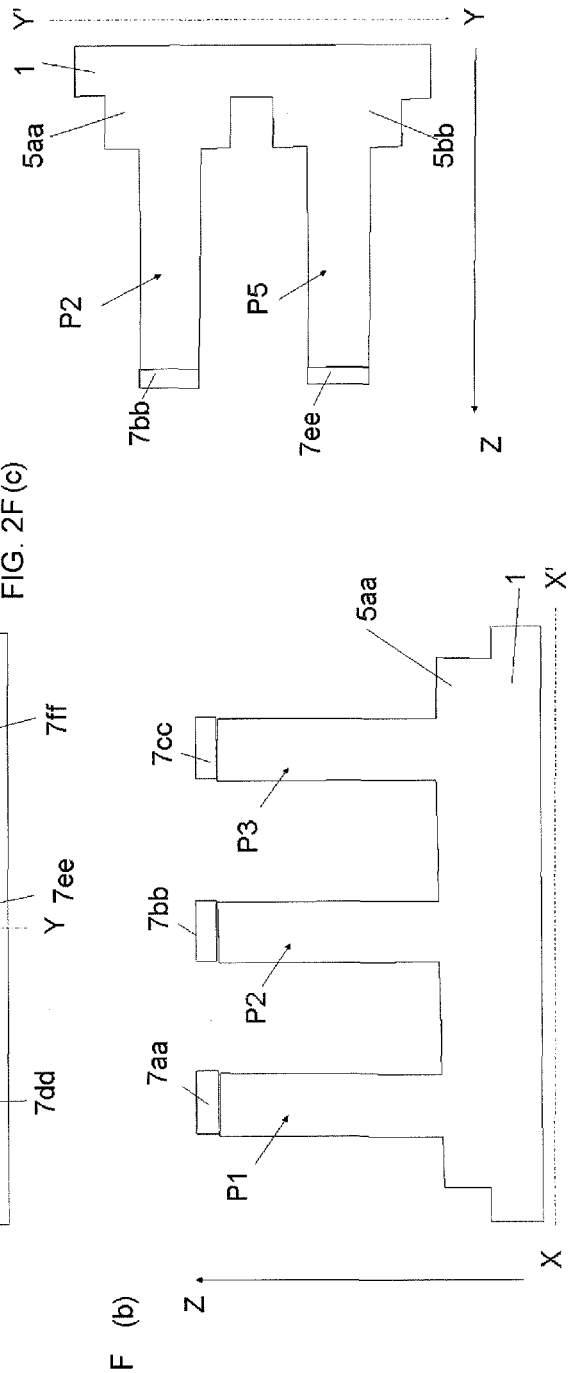
FIG. 2F (a)
FIG. 2F (b)
FIG. 2F (c)

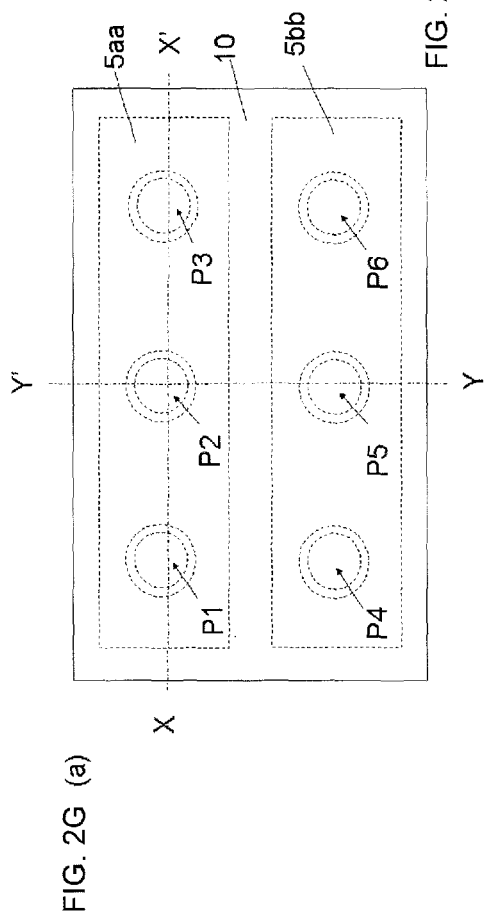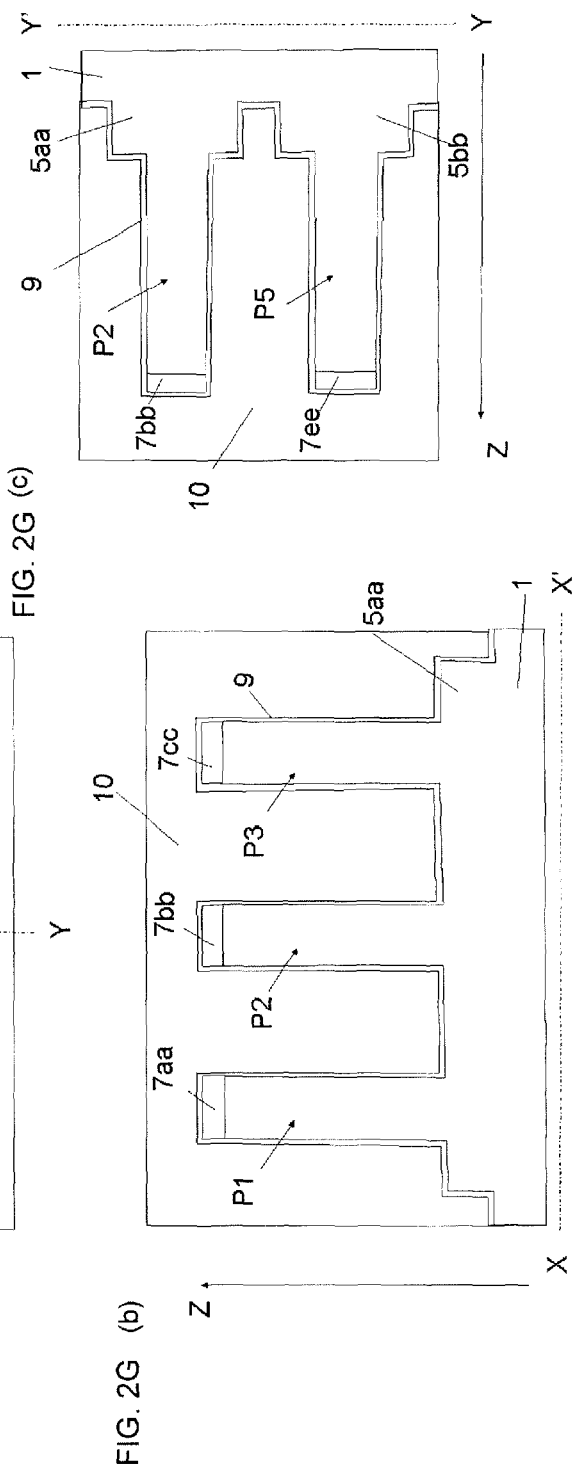

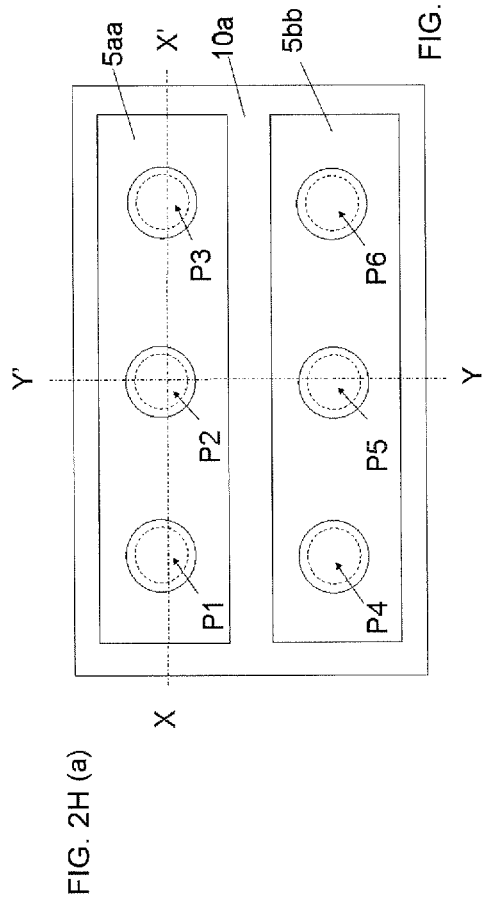
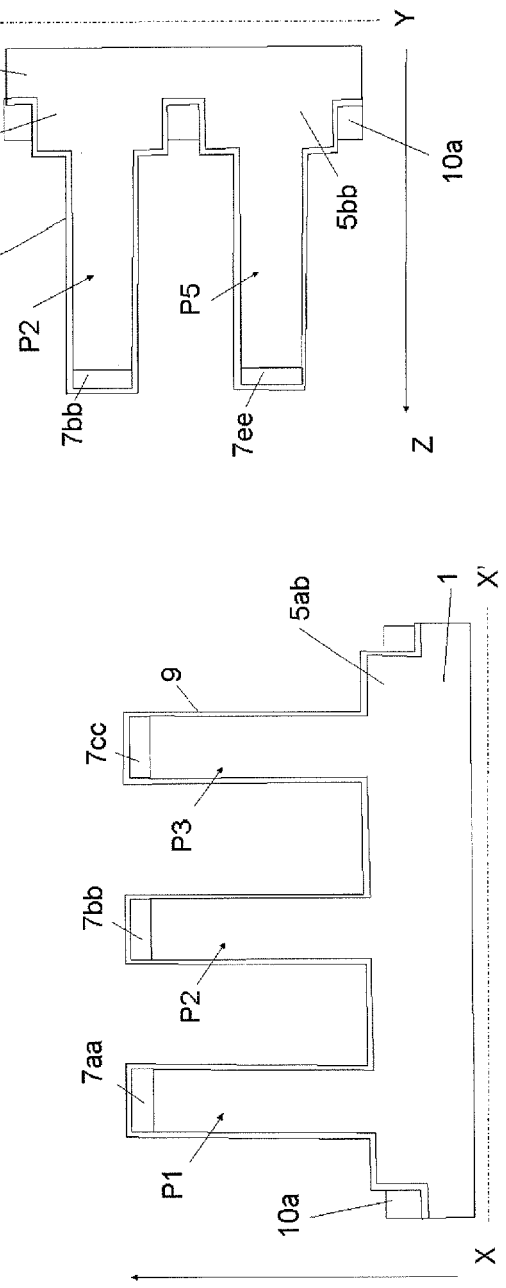
FIG. 2H (a)
FIG. 2H (b)
FIG. 2H (c)

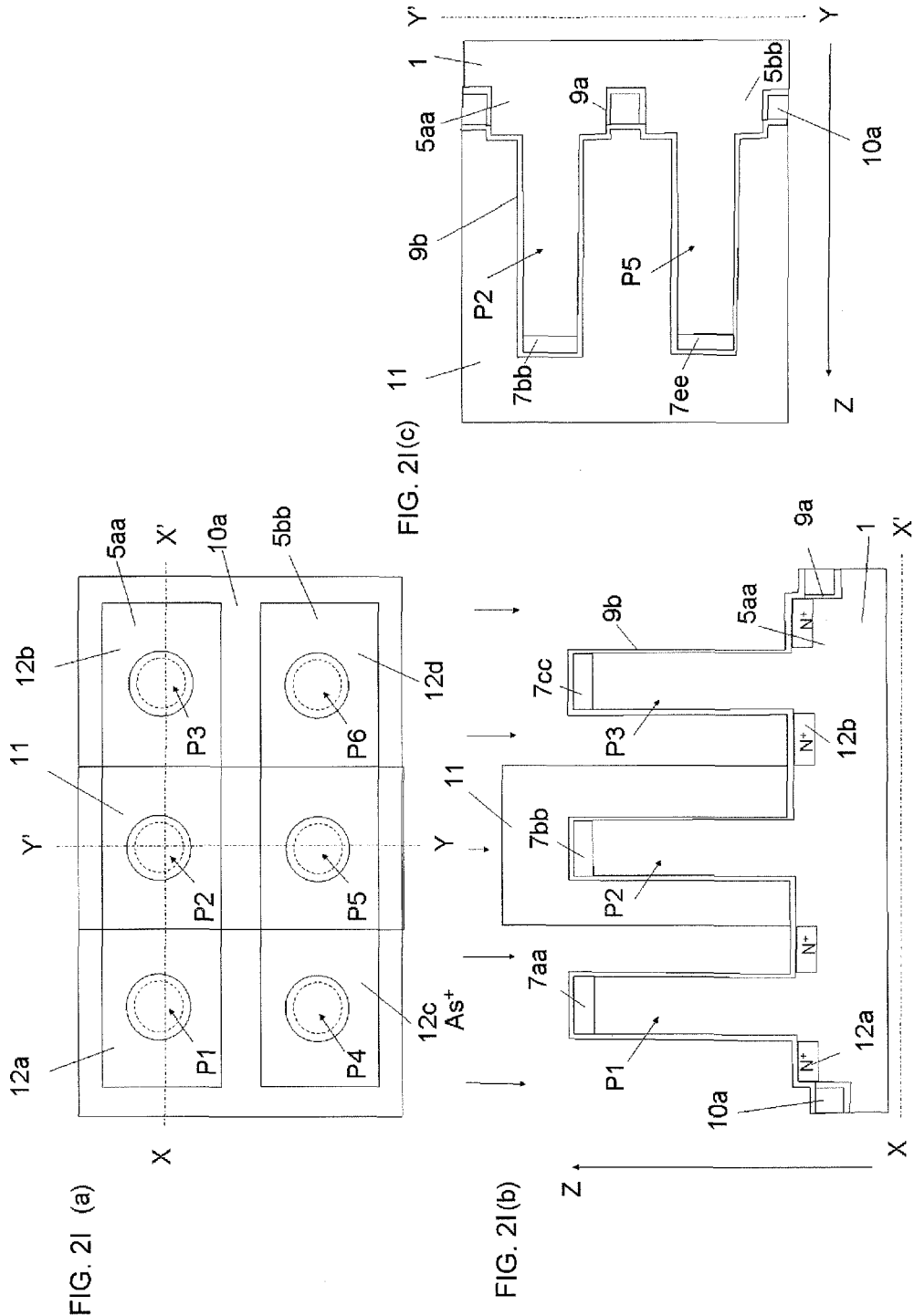

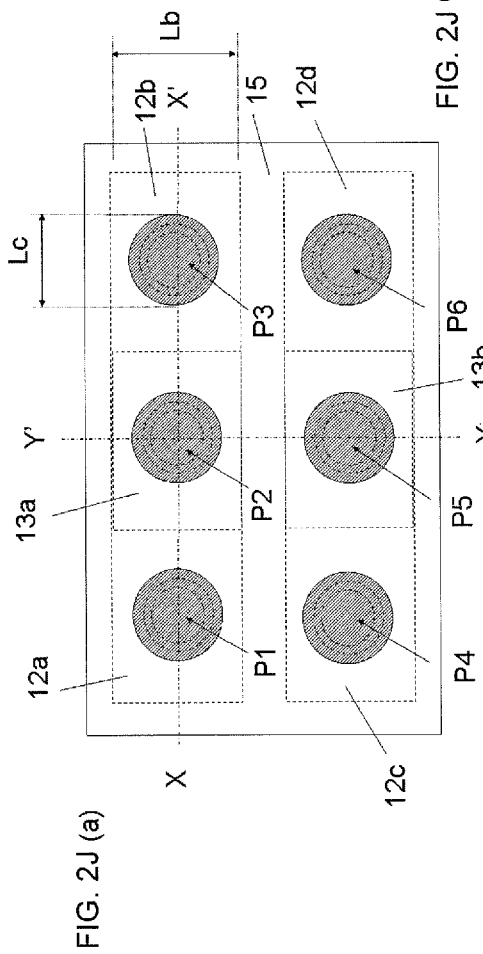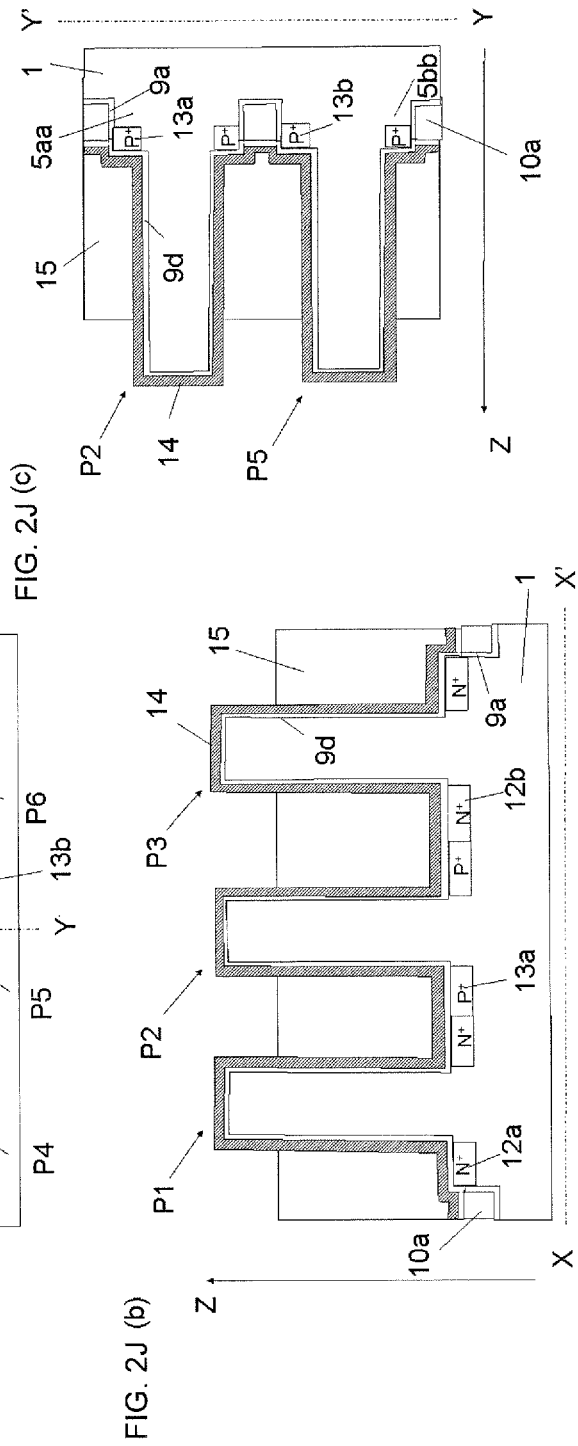
FIG. 2J (a)
FIG. 2J (b)
FIG. 2J (c)

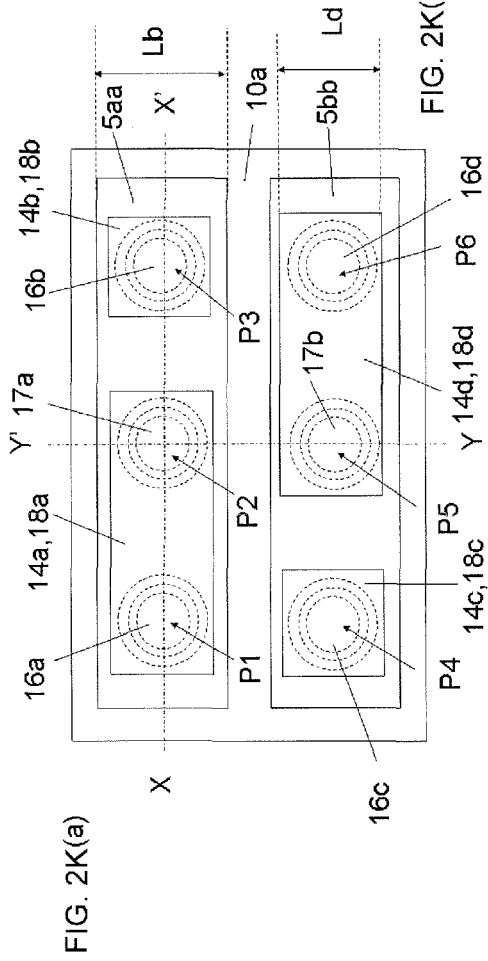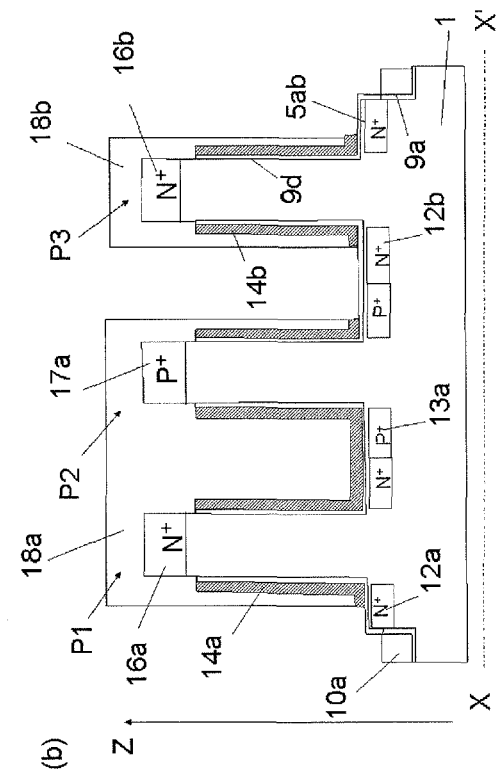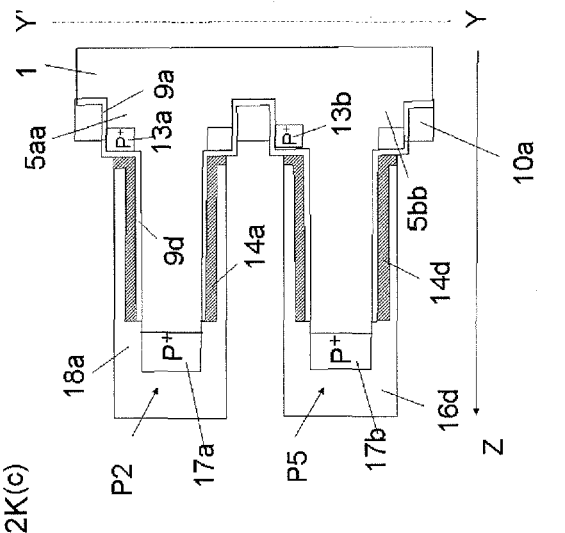
FIG. 2K(a)
FIG. 2K(b)
FIG. 2K(c)

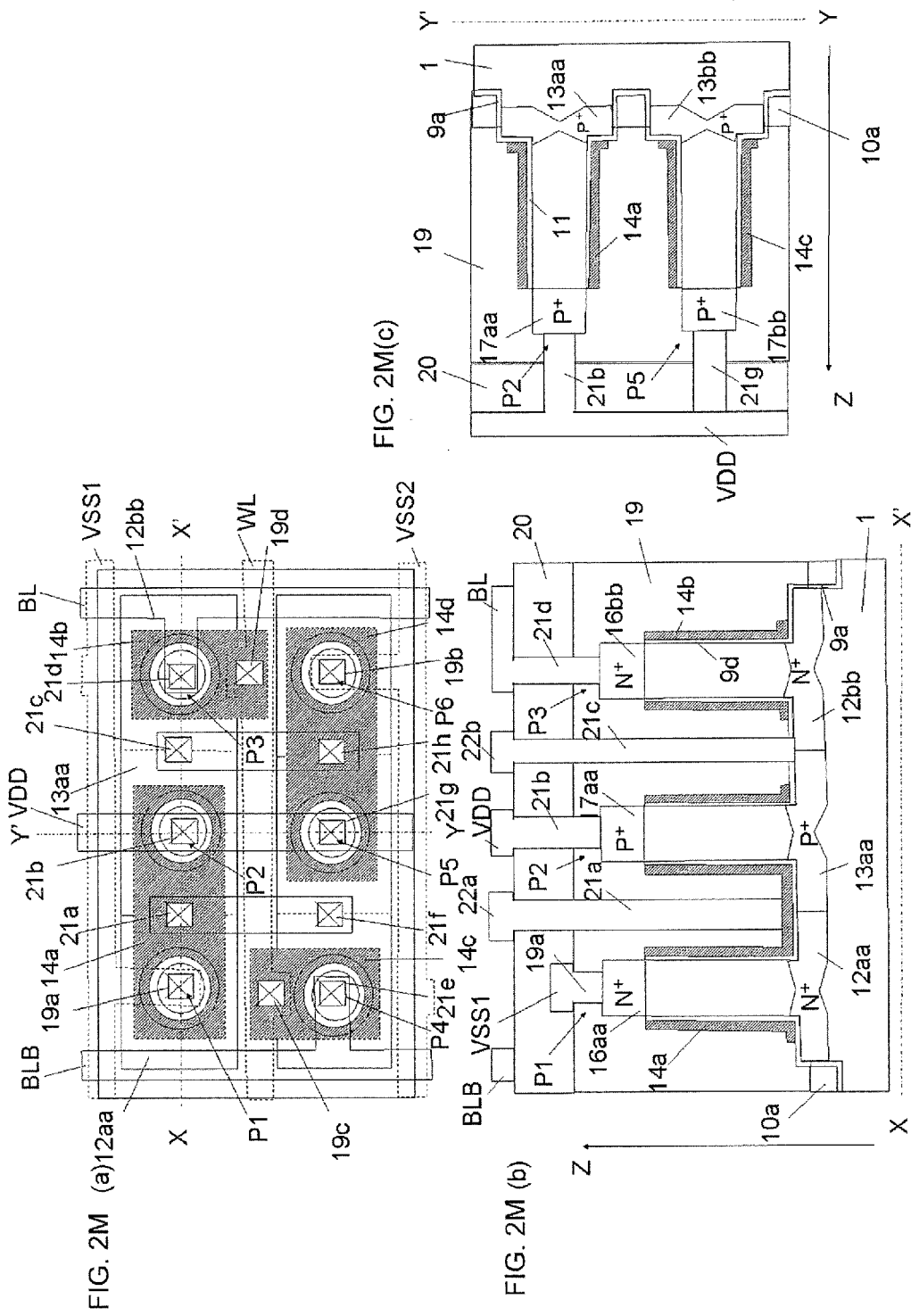

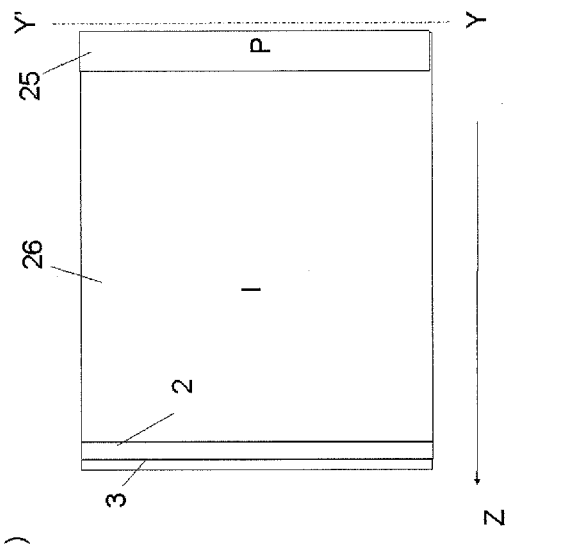
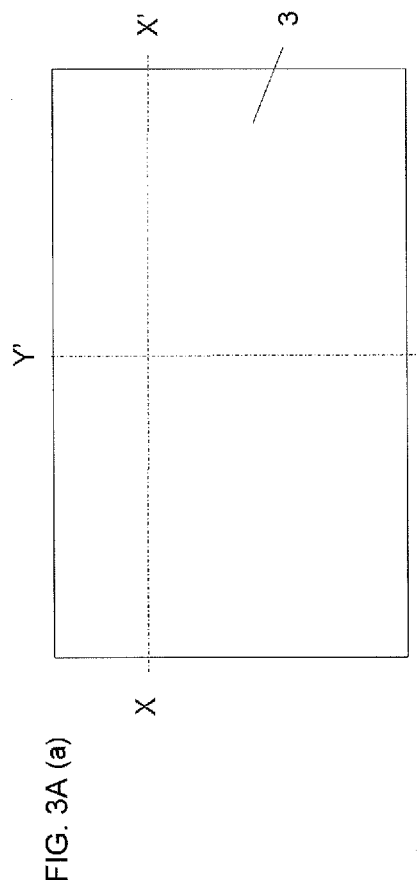
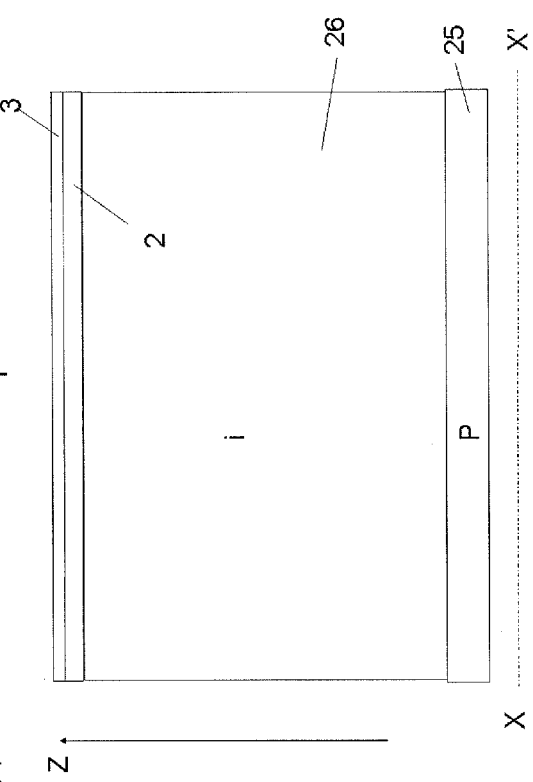
FIG. 3A(a)
FIG. 3A(b)
FIG. 3A(c)

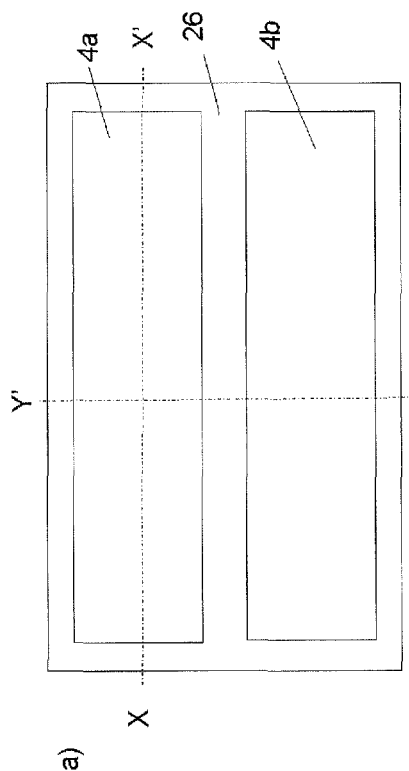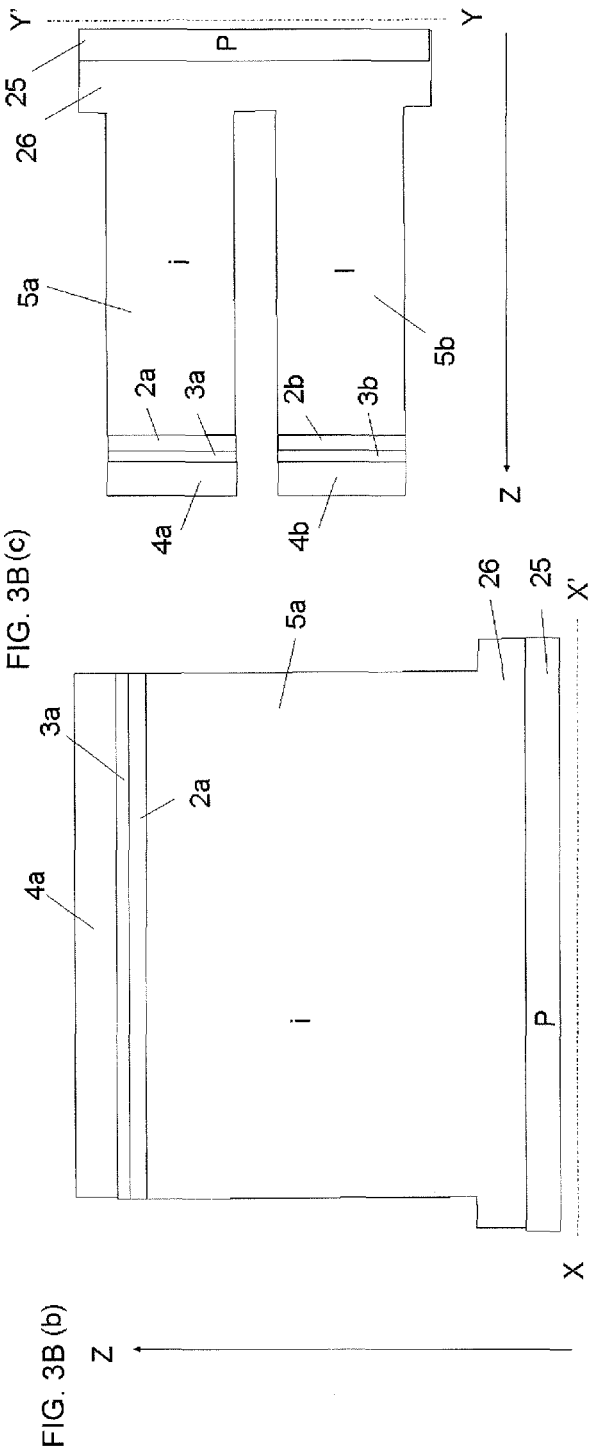

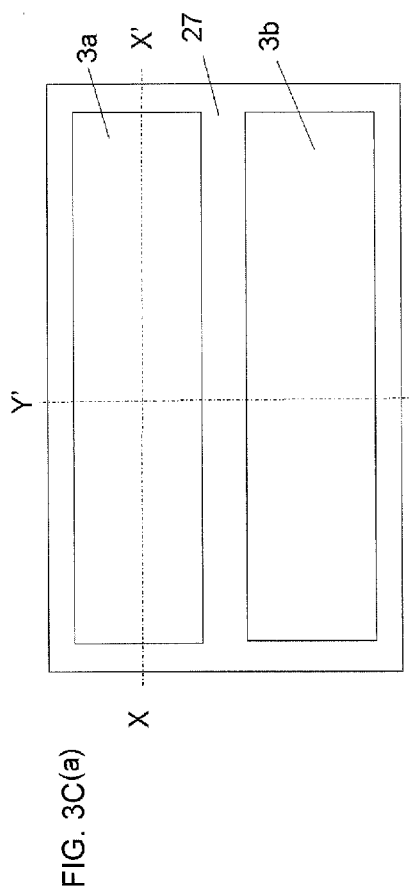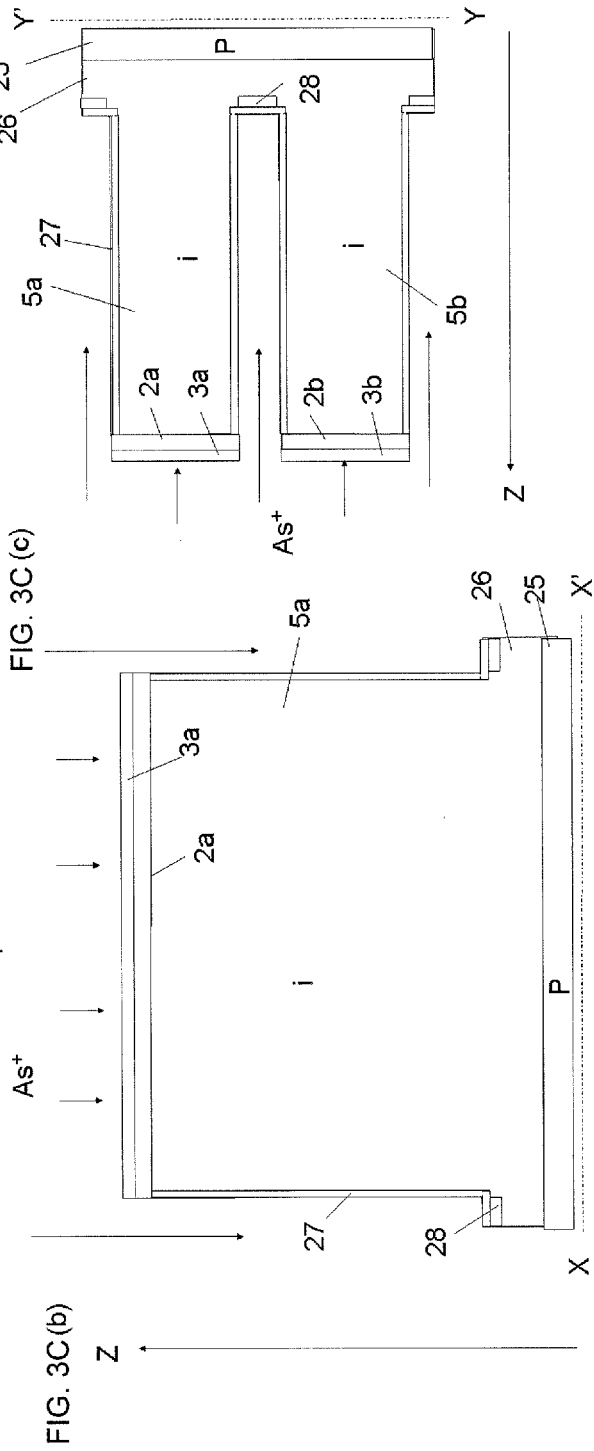

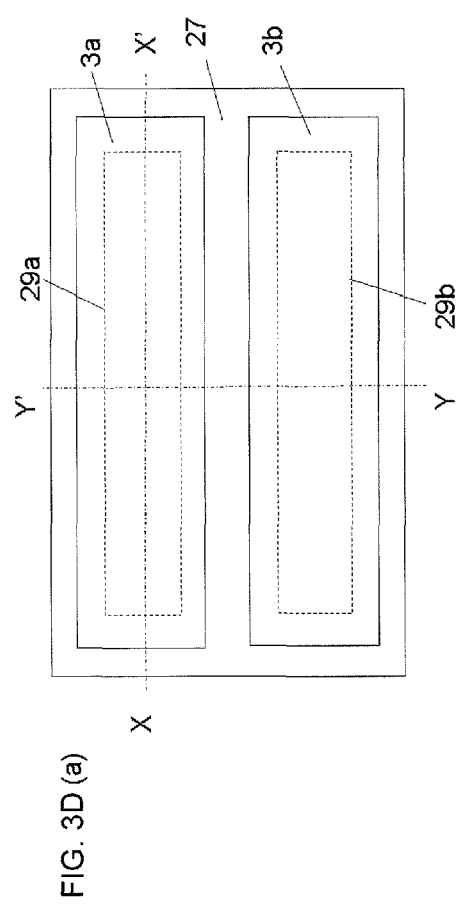
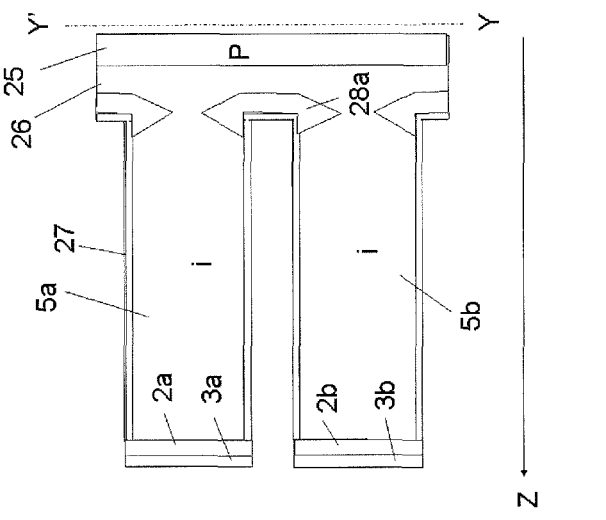
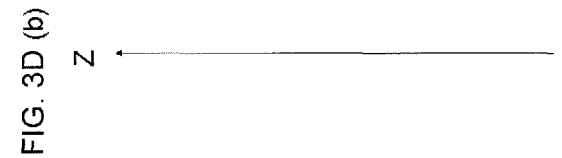
FIG. 3D(a)
FIG. 3D(b)
FIG. 3D(c)

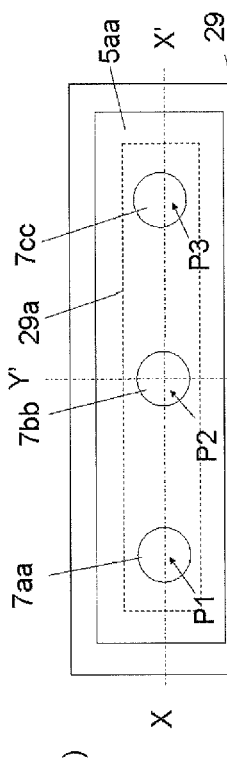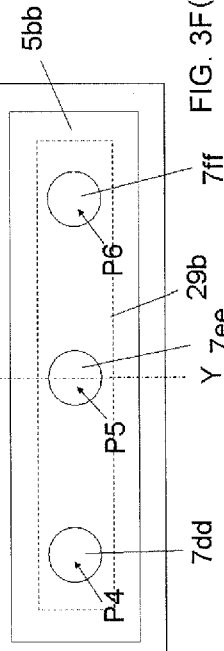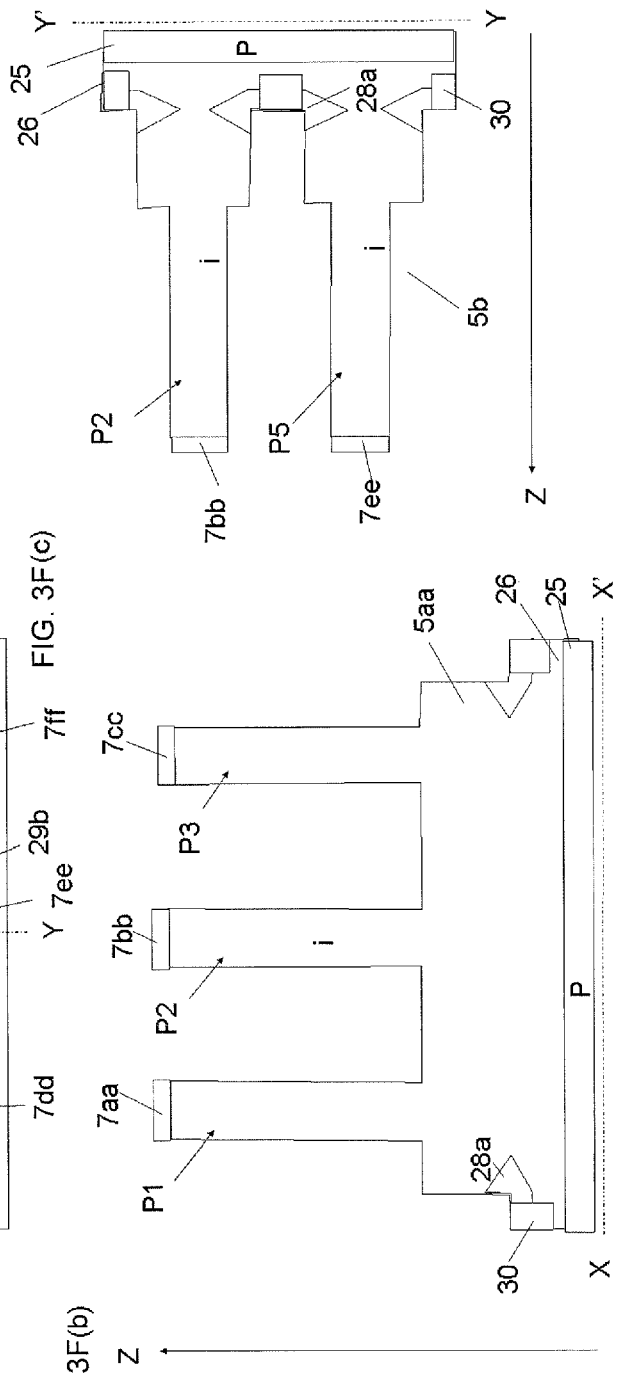
FIG. 3F(a)
FIG. 3F(b)
FIG. 3F(c)

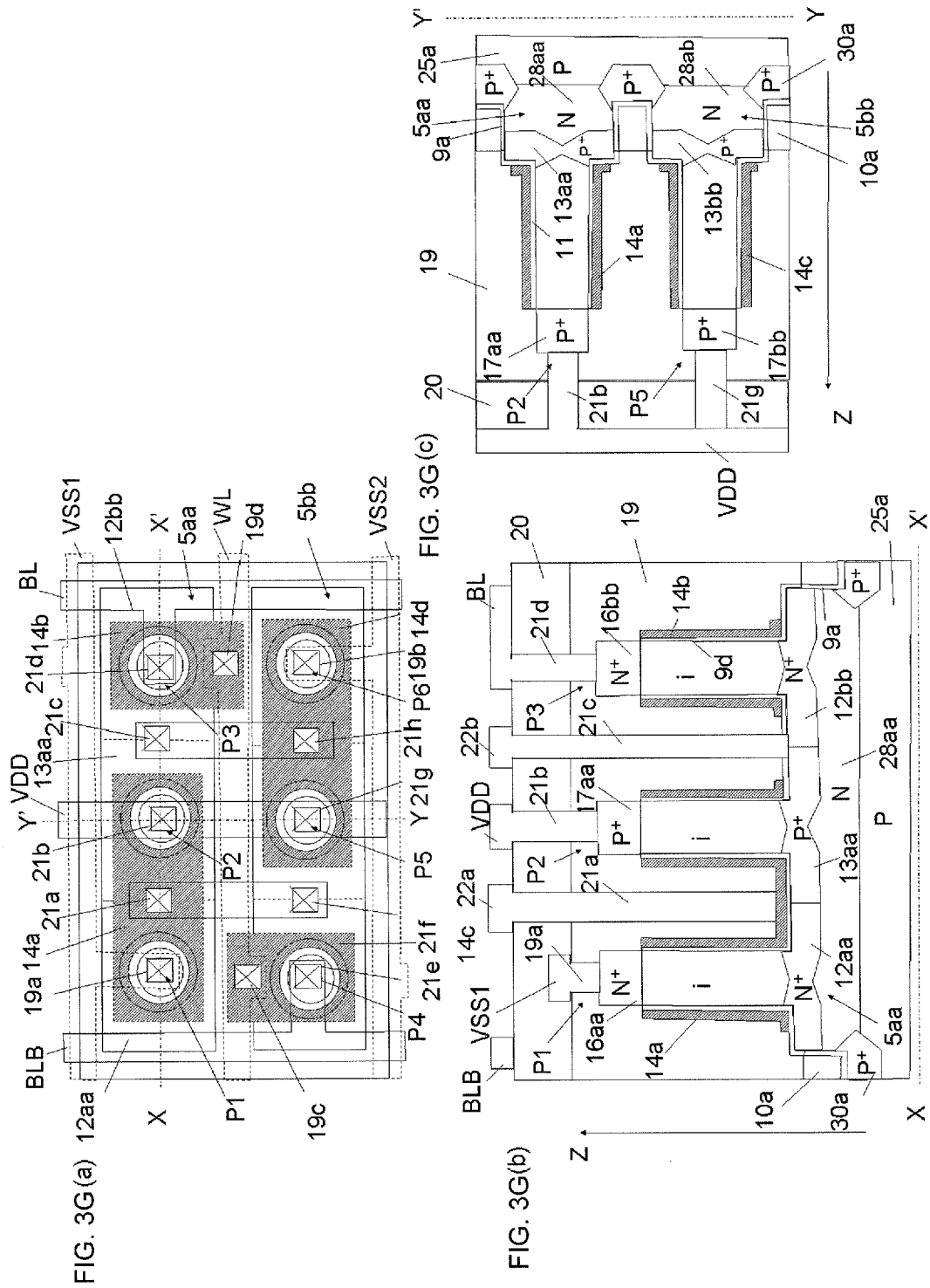

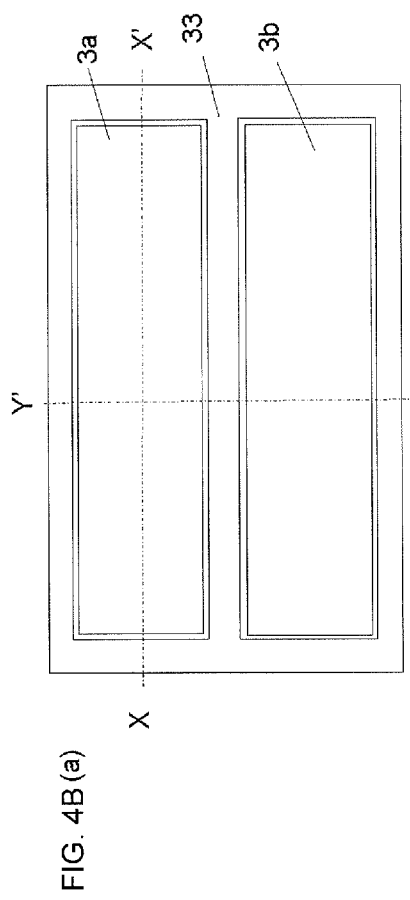
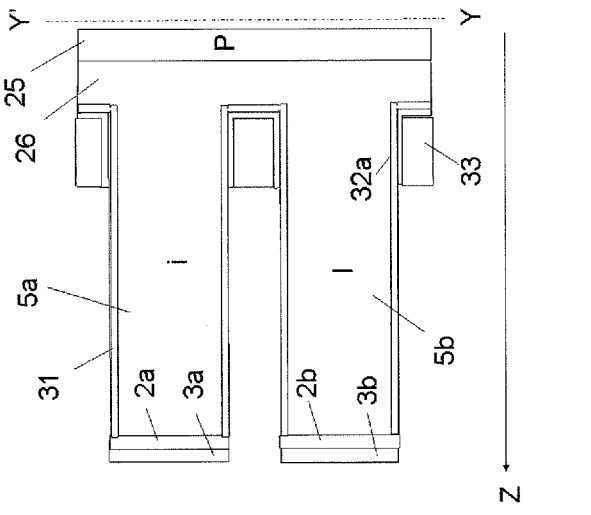
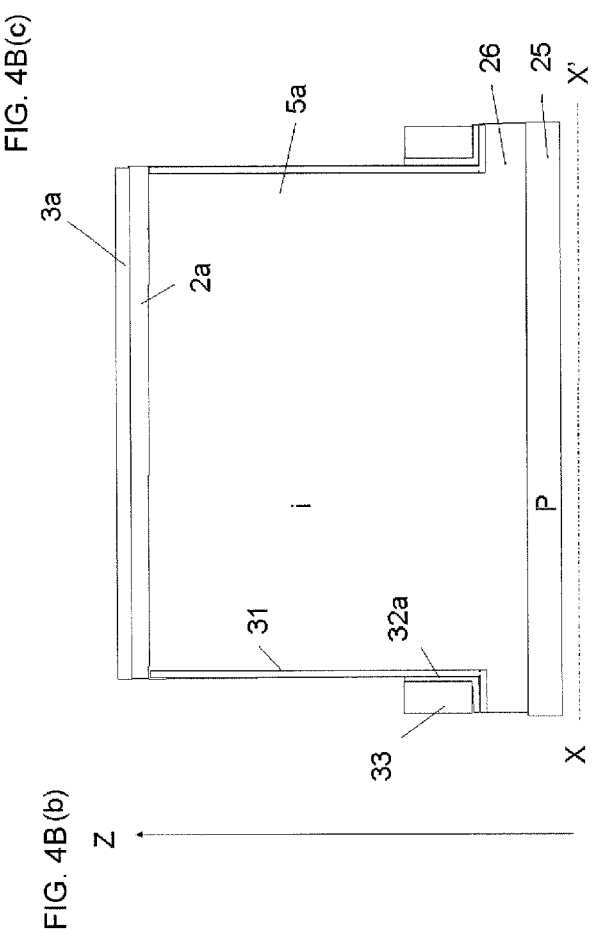
FIG. 4B(a)
FIG. 4B(b)
FIG. 4B(c)

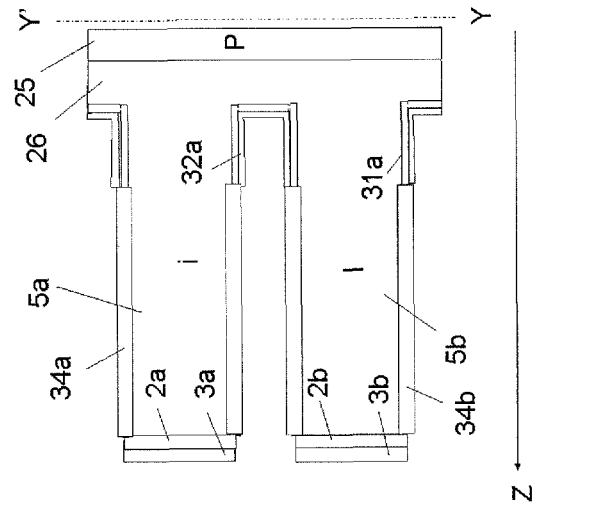
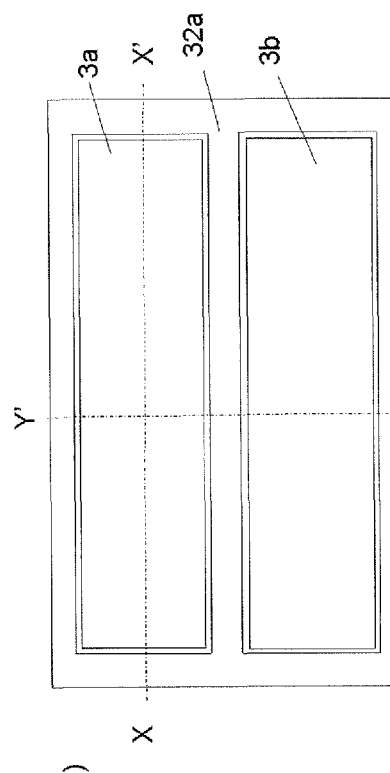
FIG. 4C (a)
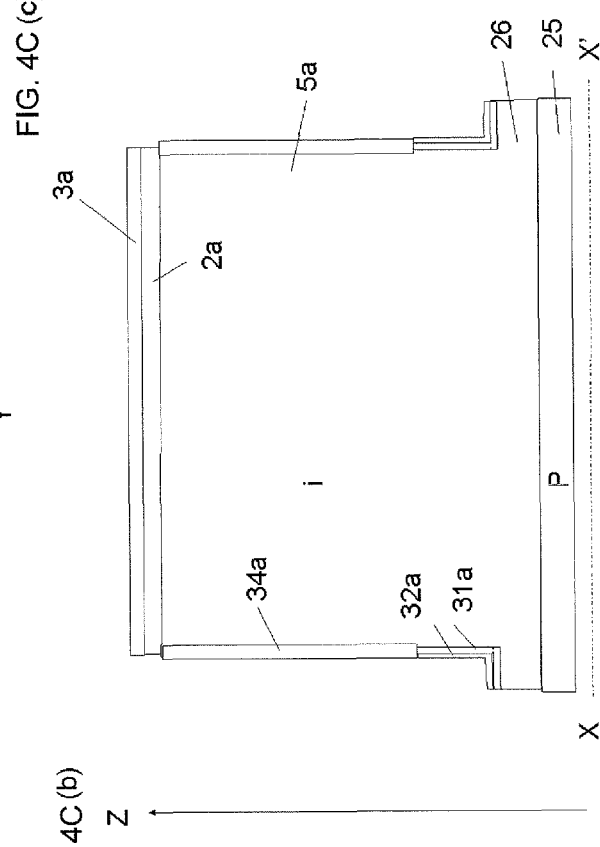
FIG. 4C (b)
FIG. 4C (c)

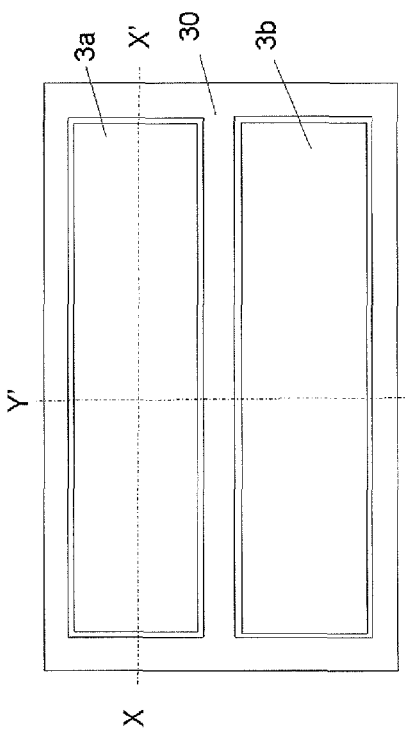
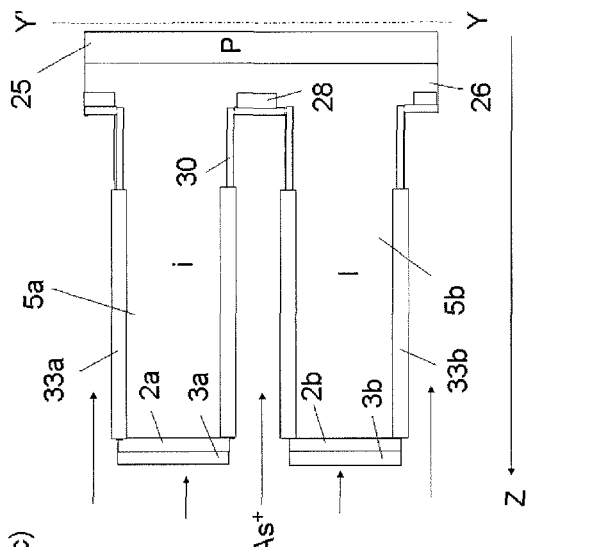
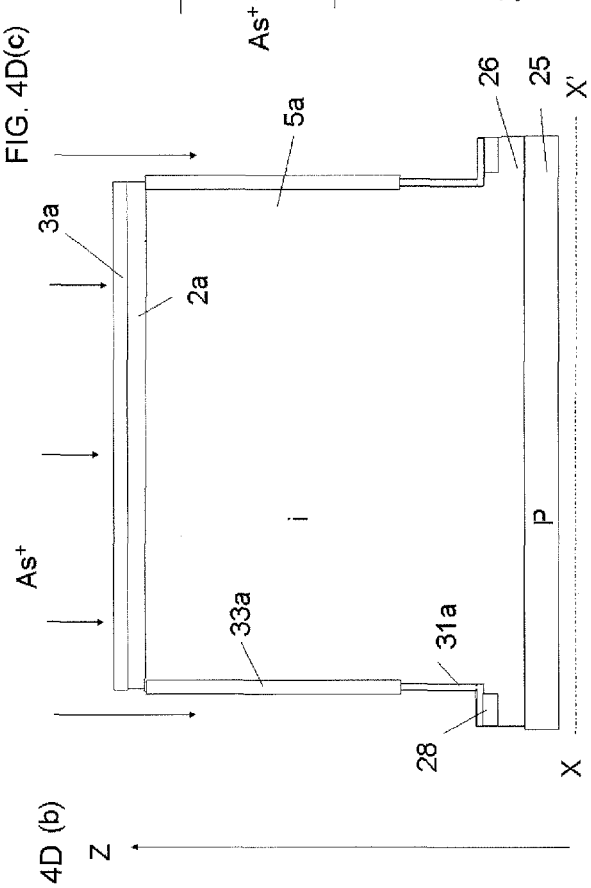

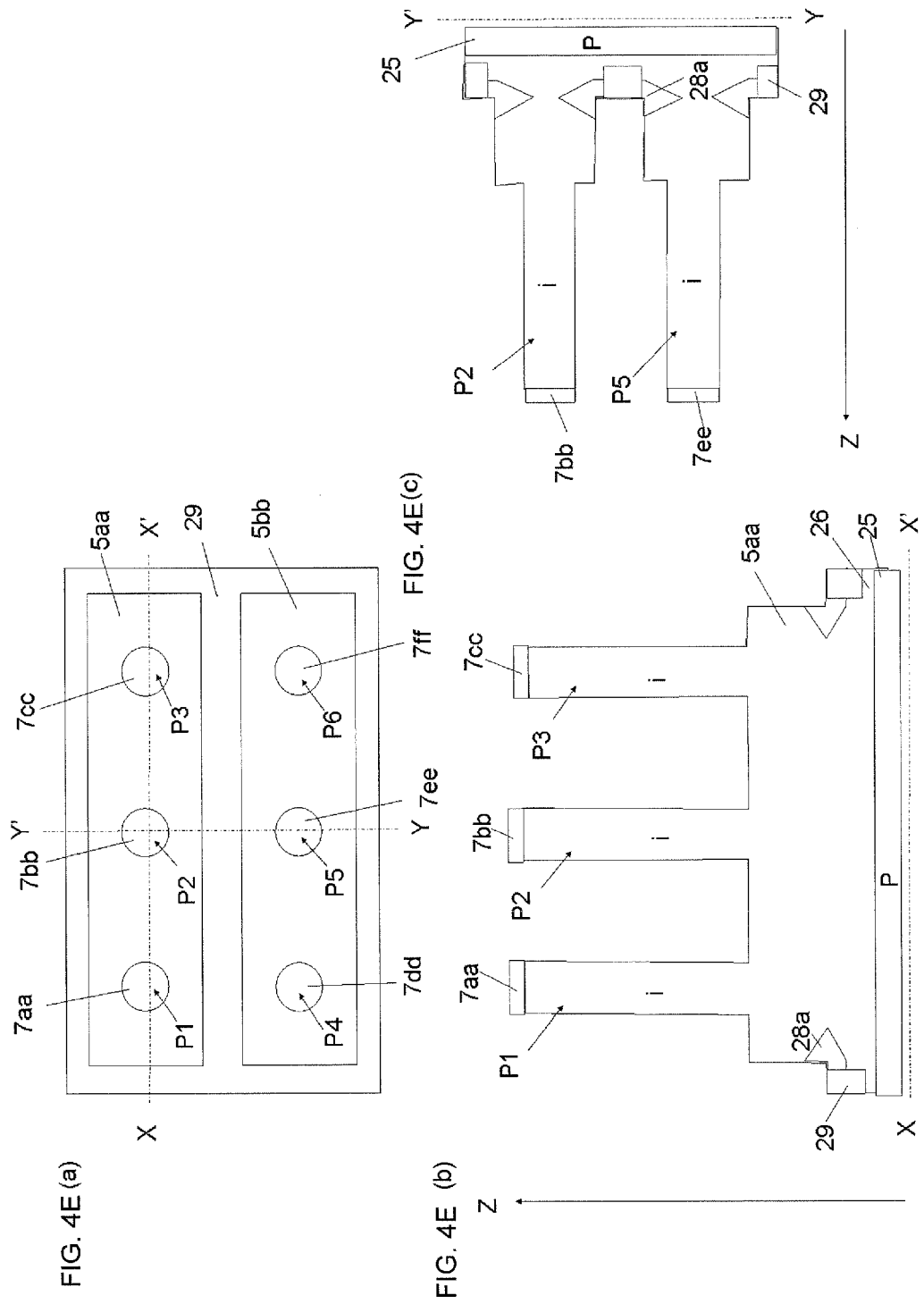

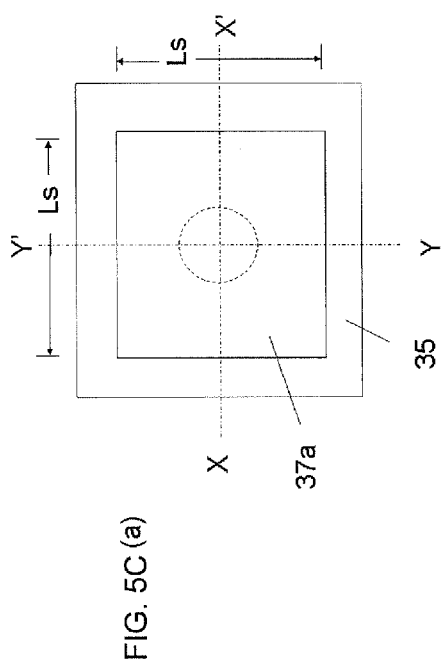
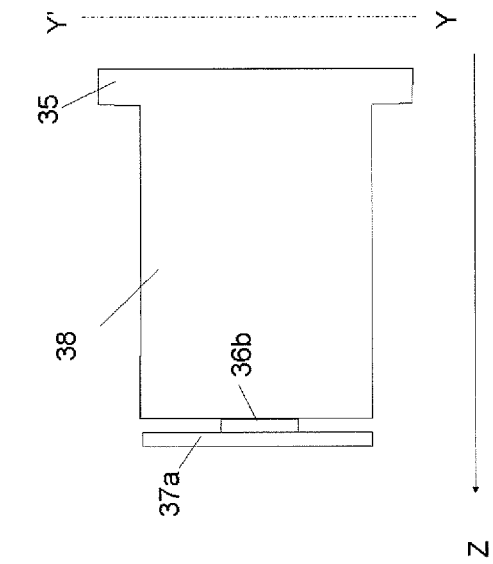
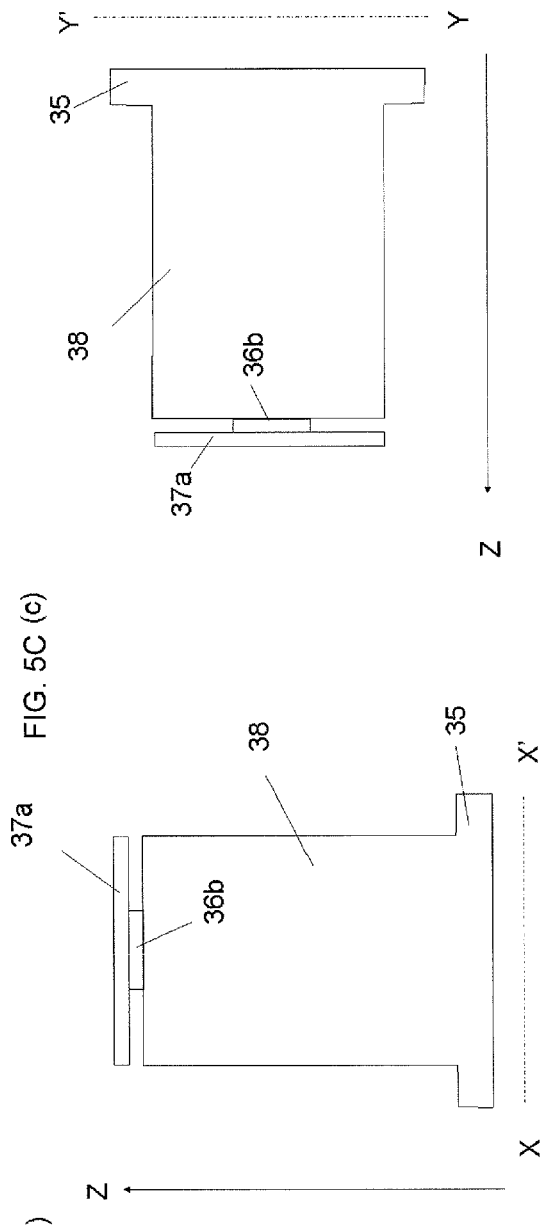
FIG. 5C(a)
FIG. 5C(b)
FIG. 5C(c)

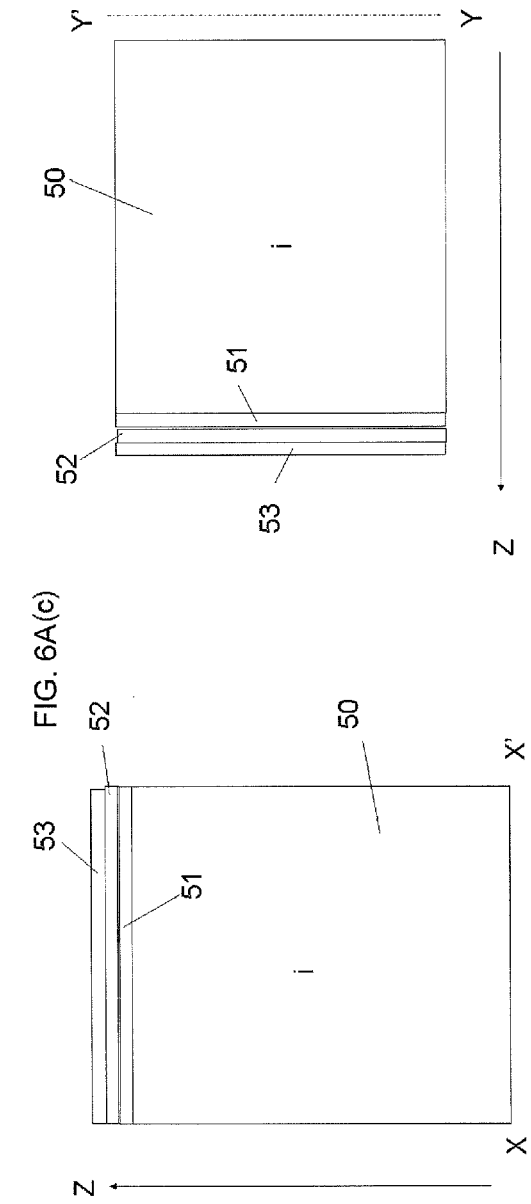
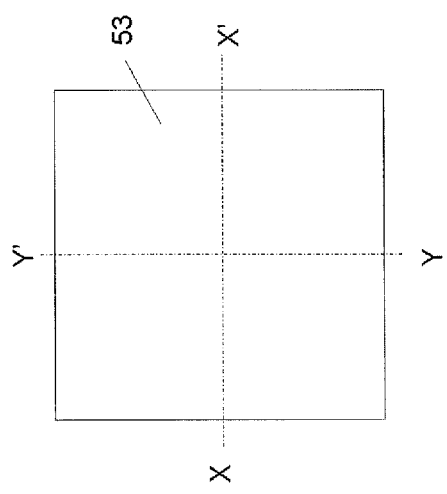
FIG. 6A (a)
FIG. 6A (b)
FIG. 6A (c)

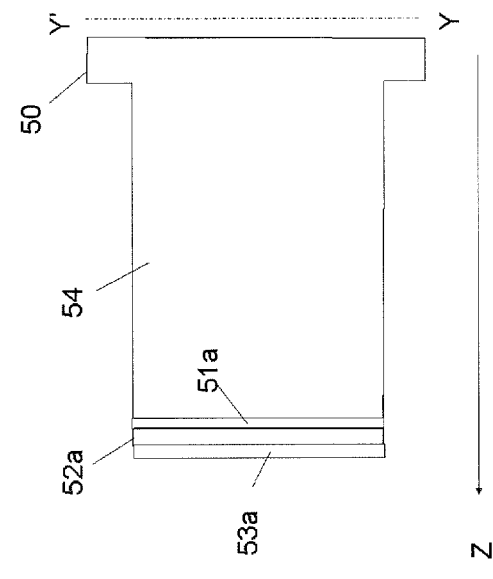
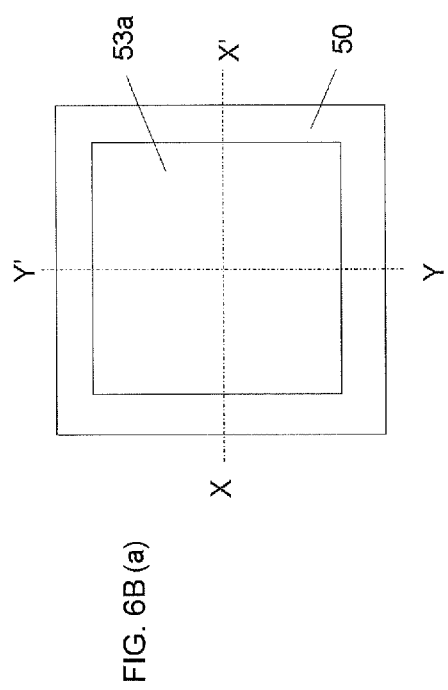
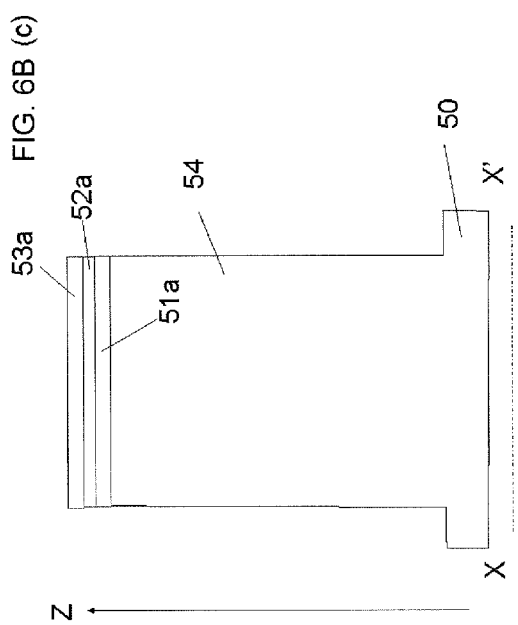
FIG. 6B (a)
FIG. 6B (b)
FIG. 6B (c)

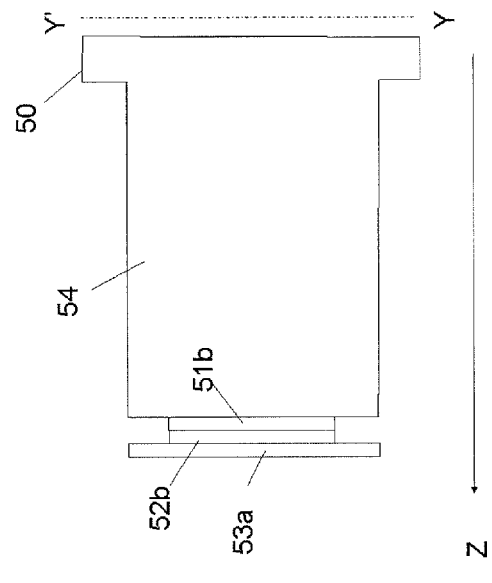
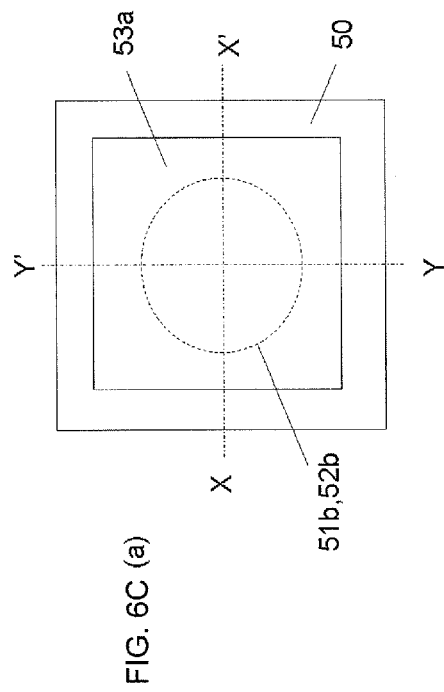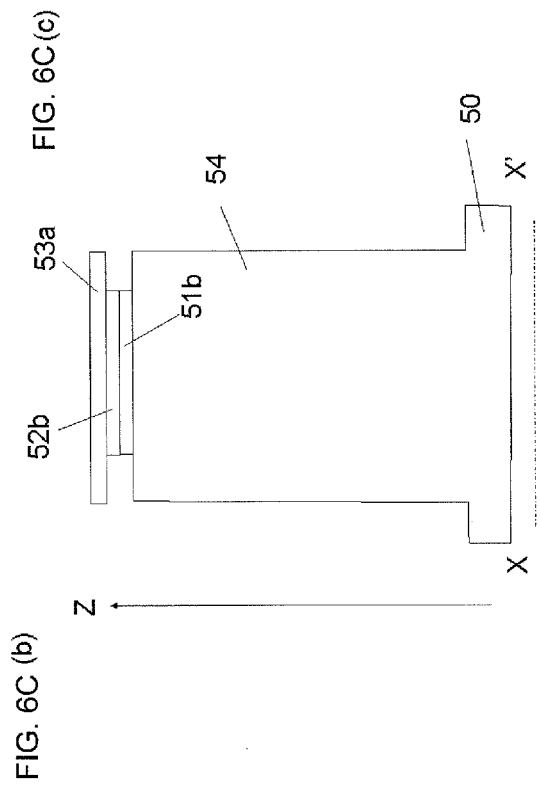
FIG. 6C (a)
FIG. 6C (b)
FIG. 6C (c)

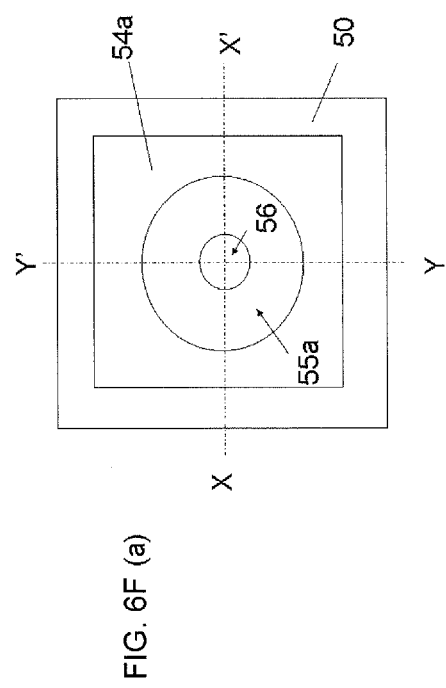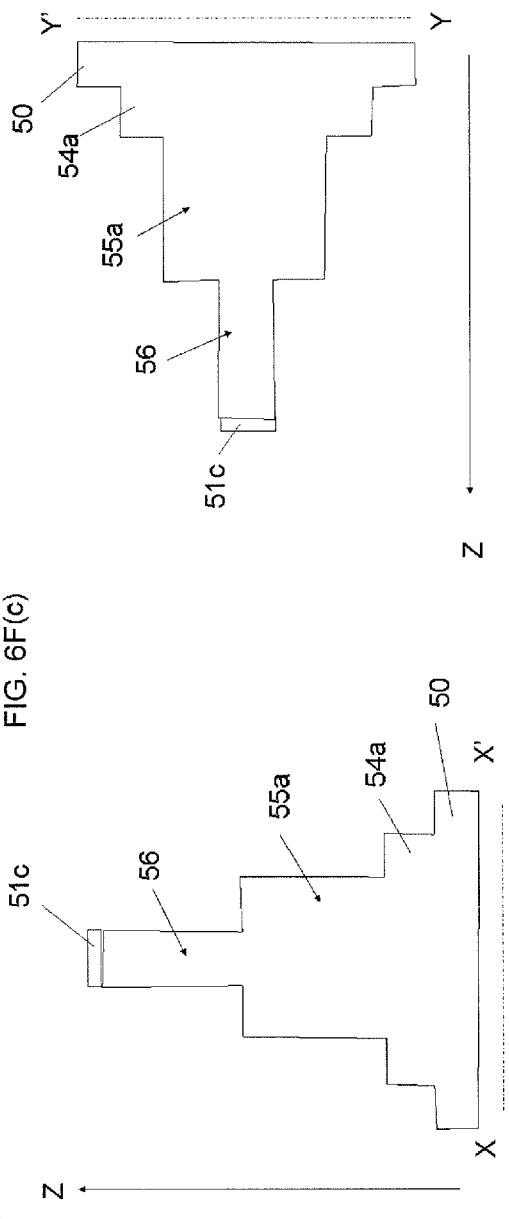

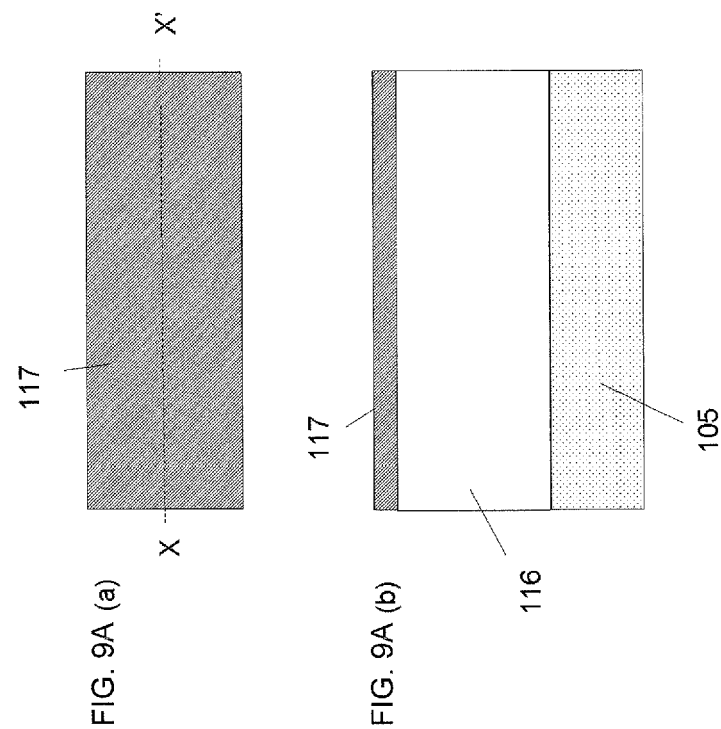

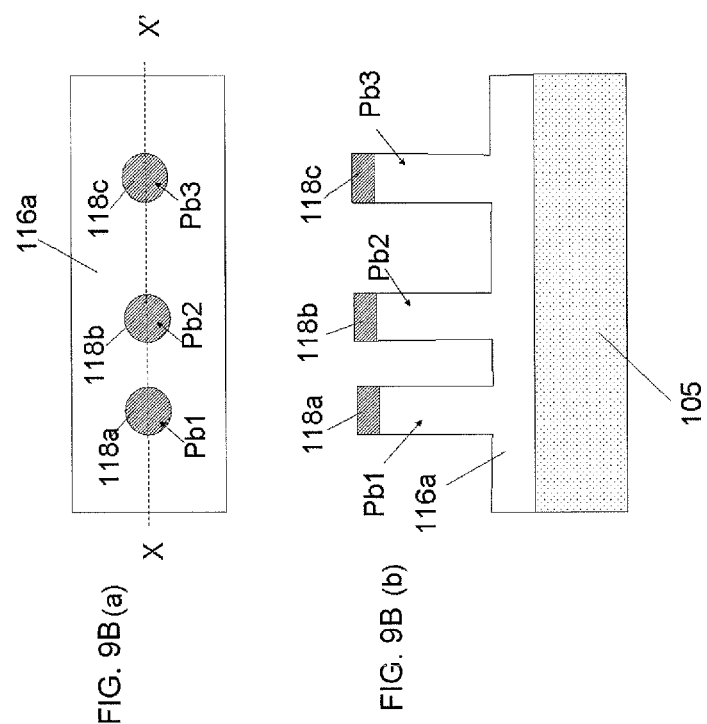

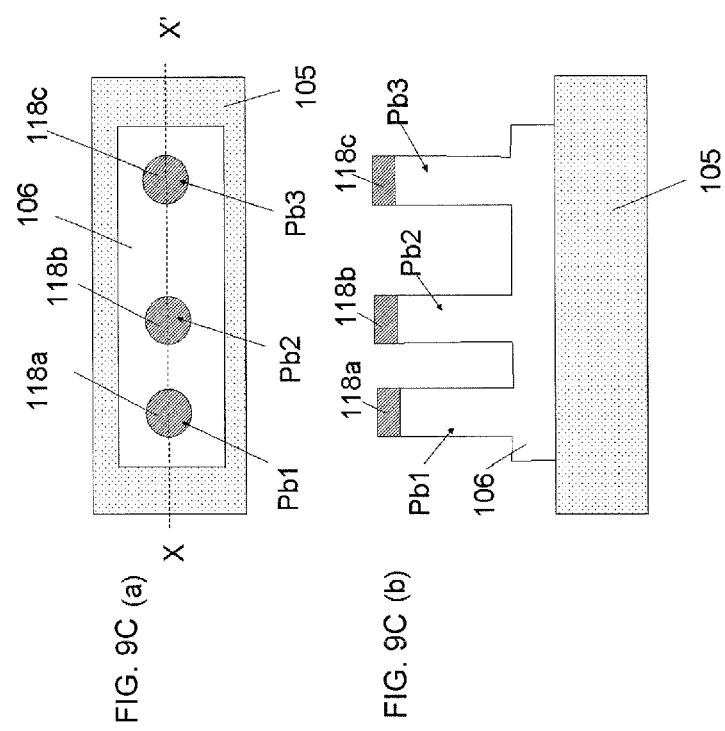

METHOD FOR PRODUCING SGT-INCLUDING SEMICONDUCTOR DEVICE

RELATED APPLICATIONS

The present application is a continuation application of PCT/JP2013/071968, filed Aug. 15, 2013, the entire contents of which are incorporated herein by reference.

BACKGROUND OF THE INVENTION

1. Field of the Invention

The present invention relates to a semiconductor device that includes surrounding gate MOS transistors (hereinafter, referred to as an SGT-including semiconductor device).

2. Description of the Related Art

Recent years saw increasing use of surrounding gate MOS transistors (SGTs) in semiconductor devices to be used in highly integrated semiconductor apparatuses. Under such trends, SGT-including semiconductor devices are increasingly required to achieve higher densities.

In a planar-type MOS transistor, the channel of a P- or N-channel MOS transistor lies between the source and the drain and in the surface direction. In contrast, the channel of an SGT lies perpendicular to the semiconductor substrate surface (for example, refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, semiconductor devices with higher densities can be achieved with SGTs compared to when planar-type MOS transistors are used.

FIG. 7 is a schematic diagram of an N-channel SGT. A Si pillar Pa having a P-type conductivity or an intrinsic (i-type) conductivity (a silicon semiconductor pillar is referred to as "Si pillar") has an $N^+$ region 100a in a lower part thereof and an $N^+$ region 100b in an upper part thereof (a region having a high donor impurity concentration is referred to as "$N^+$ region"). One of the $N^+$ region 100a and the $N^+$ region 100b serves as a source while the other serves as a drain. A portion of the Si pillar Pa that lies between the $N^+$ region 100a and the $N^+$ region 100b respectively serving as a source and a drain constitutes a channel region 101. A gate insulating layer 102 is formed to surround the channel region 101, and a gate conductor layer 103 is formed to surround the gate insulating layer 102. In an SGT, the $N^+$ region 100a and the $N^+$ region 100b that respectively serve as a source and a drain, the channel region 101, the gate insulating layer 102, and the gate conductor layer 103 are formed in or on a single Si pillar Pa. The shape of a horizontal cross section of the Si pillar Pa is preferably circular. In this manner, the area of the surface that an SGT occupies corresponds to the area of one source or drain $N^+$ region of a planar MOS transistor in appearance. Accordingly, a circuit chip that includes SGTs can be further scaled down compared to a circuit chip having planar-type MOS transistors, and thus the density of semiconductor device can be increased.

FIG. 8 is a cross-sectional view of a CMOS inverter circuit that includes SGTs (for example, refer to US Patent Application Publication No. 2012/0270374).

An i-layer 106 ("i-layer" refers to an intrinsic Si layer) is formed on an insulating layer substrate 105, and Si pillars Pb1 and Pb2 for P-channel SGTs and a Si pillar Pb3 for an N-channel SGT are formed on the i-layer 106 (the two P-channel SGTs connected in parallel serve as a load transistor and one N-channel SGT serves as a drive transistor, thereby forming an inverter circuit). The i-layer 106 is a region that defines a region where a CMOS inverter circuit is to be formed and is isolated from other adjacent circuits by the insulating layer substrate 105.

A drain $P^+$ region 109a ("$P^+$ region" refers to a region having a high acceptor impurity concentration) for a P channel SGT lies at the same level as the i-layer 106 connected to the lower portions of the Si pillars Pb1 and Pb2 for P-channel SGTs. The drain $P^+$ region 109a surrounds the lower portions of the Si pillars Pb1 and Pb2. A drain $N^+$ region 110a for an N-channel SGT is formed at the same level as the i-layer 106 so as to surround a lower portion of the Si pillar Pb3.

A source $P^+$ region 109ba for a P-channel SGT is formed in a top portion of the Si pillar Pb1 for a P-channel SGT and a source $P^+$ region 109bb for a P-channel SGT is formed in a top portion of the Si pillar Pb2 for a P-channel SGT. A source $N^+$ region 110b for an N-channel SGT is formed in a top portion of the Si pillar Pb3 for an N-channel SGT.

As shown in FIG. 8, gate insulating layers 107a, 107b, and 107c are formed so as to surround the Si pillars Pb1, Pb2, and Pb3. A P-channel SGT gate conductor layer 108a and an N-channel SGT gate conductor layer 108b are formed so as to surround the gate insulating layers 107a, 107b, and 107c.

Insulating layers (sidewall nitride films) 111a and 111b are formed so as to surround the gate conductor layers 108a and 108b and the $P^+$ regions 109ba and 109bb and the source $N^+$ region 110b in top portions of the Si pillars Pb1, Pb2, and Pb3. The $P^+$ region 109a of a P-channel SGT is connected to a drain $N^+$ region 110a of an N-channel SGT through a silicide layer 113.

A CMOS inverter circuit that includes such SGTs is, for example, obtained as follows. That is, as shown in FIG. 8, a $SiO_2$ layer 112 is formed by chemical vapor deposition (CVD) over the insulating layer substrate 105, the i-layer 106, and the Si pillars Pb1, Pb2, and Pb3. Then contact holes 114a, 114b, 114c, 114d, 114e, and 114f are formed in the $SiO_2$ layer 112 so as to lie on the gate conductor layer 108a, the gate conductor layer 108b, the $P^+$ region 109ba, the $P^+$ region 109bb, the $N^+$ region 110b, and the silicide layer 113, respectively.

As shown in FIG. 8, a power supply wiring metal layer Vcc formed on the $SiO_2$ layer 112 is connected to the source $P^+$ region 109ba and the source $P^+$ region 109bb of P-channel SGTs through the contact holes 114b and 114c. An output wiring metal layer Vout formed on the $SiO_2$ layer 112 is connected to the drain $P^+$ region 109a of a P-channel SGT and the drain $N^+$ region 110a of an N-channel SGT through the contact hole 114d and the silicide layer 113, respectively. An input wiring metal layer Vin1 formed on the $SiO_2$ layer 112 is connected to the gate conductor layer 108a of a P-channel SGT through the contact hole 114a. An input wiring metal layer Vin2 formed on the $SiO_2$ layer 112 is connected to the gate conductor layer 108b of a P-channel SGT through the contact hole 114f. A ground wiring metal layer Vss formed on the $SiO_2$ layer 112 is connected to the source $N^+$ region 110b of an N-channel SGT through the contact hole 114e.

In this SGT-including CMOS inverter circuit in which P-channel SGTs and an N-channel SGT are formed in the Si pillars Pb1, Pb2, and Pb3, respectively, the area of the circuit as viewed in a perpendicular direction is reduced and the circuit can be further scaled down compared to conventional examples of inverter circuits that use planar-type MOS transistors.

As described above, in an SGT-including CMOS inverter circuit, the Si pillars Pb1, Pb2, and Pb3 are formed on the i-layer 106. The Si pillars Pb1, Pb2, and Pb3 are required to be formed at high accuracy so as not to protrude from the outer periphery of the i-layer 106 in a plan view.

A method for producing Si pillars Pb1, Pb2, and Pb3 on the i-layer 106 will now be described with reference to FIGS. 9A(a) to 9C(b). In each drawing, part (a) is a plan view and part (b) is a cross-sectional view taken along line X-X' in (a).

Referring to FIGS. 9A(a) and 9A(b), an i-layer 116 is formed on an insulating substrate 105 (corresponding to the insulating substrate 105 in FIG. 8). Then a $SiO_2$ layer 117 is formed on the i-layer 116 by a thermal oxidation process.

Next, referring to FIGS. 9B(a) and 9B(b), a lithographic process and a $SiO_2$ film etching process are employed to form $SiO_2$ layers 118a, 118b, and 118c from the $SiO_2$ layer 117. The $SiO_2$ layers 118a, 118b, and 118c correspond to top portions of the Si pillars Pb1, Pb2, and Pb3 and each have a circular shape in a plan view. Then the i-layer 116 is etched by using the $SiO_2$ layers 118a, 118b, and 118c having a circular shape in a plan view as a mask so as to form Si pillars Pb1, Pb2, and Pb3 (correspond to the Si pillars Pb1, Pb2, and Pb3 in FIG. 8). During etching, an i-layer 116a is allowed to remain between the insulating substrate 105 and each of the Si pillars Pb1, Pb2, and Pb3.

Next, referring to FIGS. 9C(a) and 9C(b), a lithographic process involving mask alignment and a Si etching process are employed to etch the i-layer 116a located outside the Si pillars Pb1, Pb2, and Pb3 so as to form an i-layer 106 (corresponds to the i-layer 106 in FIG. 8) in alignment with the Si pillars Pb1, Pb2, and Pb3. As a result, the Si pillars Pb1, Pb2, and Pb3 are formed on the i-layer 106.

As described above, in a conventional production method, the i-layer 106 that defines the CMOS circuit region is formed after the Si pillars Pb1, Pb2, and Pb3 have been formed and by using a lithographic process that involves mask alignment with respect to the Si pillars Pb1, Pb2, and Pb3. The Si pillars Pb1, Pb2, and Pb3 must be formed at high positional accuracy without protruding from the outer periphery of the i-layer 106 in a plan view. With high positional accuracy, size reduction of SGT-including CMOS inverter circuits is achieved.

SUMMARY OF THE INVENTION

In order to increase the degree of integration of an SGT-including CMOS inverter circuit, semiconductor pillars (corresponding to Si pillars Pb1, Pb2, and Pb3 in FIGS. 9C(a) and 9C(b)) in which SGTs are formed and a horizontal cross-section has a circular shape in a plan view are desirably formed in a circuit-forming region (corresponding to the i-layer 106 in FIGS. 9C(a) and 9C(b)) at high positional accuracy.

A first aspect of the present invention provides a method for producing an SGT-including semiconductor device, The method includes a first and second material layers forming step of forming a first material layer on a semiconductor substrate and forming a second material layer on the first material layer; a third and fourth material layers forming step of etching the first material layer and the second material layer by using a mask having a rectangular shape in a plan view so as to form a third material layer and a fourth material layer that have the same rectangular shape in a plan view and that are on top of each other; a first island-shaped semiconductor layer forming step of etching the semiconductor substrate, the third material layer, and the fourth material layer by using a mask having a rectangular shape extending in a lengthwise direction or a crosswise direction in a plan view or a mask having a square shape in a plan view so as to form the third material layer and the fourth material layer that have the same rectangular shape in a plan view and are on top of each other and form a first island-shaped semiconductor layer that has at least one side that extends in the lengthwise or crosswise direction and aligns with at least one side of the third material layer and at least one side of the fourth material layer that extend in the lengthwise or crosswise direction; a fifth material layer forming step of isotropically etching the third material layer by using the fourth material layer as a mask so that etching proceeds from an outer periphery of the fourth material layer toward an inner side of the fourth material layer so as to form a fifth material layer having a circular shape in a plan view; a material layer removing step of removing the fourth material layer; a first semiconductor pillar forming step of etching the first island-shaped semiconductor layer by using the fifth material layer as a mask so as to form, from the first island-shaped semiconductor layer, a first semiconductor pillar having a circular shape in a plan view and a second island-shaped semiconductor layer located below the first semiconductor pillar; a first gate insulating layer forming step of forming a first gate insulating layer on an outer periphery of the first semiconductor pillar; a first gate conductor layer forming step of forming a first gate conductor layer on an outer periphery of the first gate insulating layer; a first and second impurity regions forming step of forming a first impurity region in the semiconductor substrate located below the first semiconductor pillar, the first impurity region containing a donor or acceptor impurity, and forming a second impurity region inside the first semiconductor pillar and at a position distant from and above the first impurity region, the second impurity region having the same conductivity type as the first impurity region. In the SGT-including semiconductor device, a first surrounding gate MOS transistor (SGT) is configured in which one of the first impurity region and the second impurity region serves as a source while the other serves as a drain, the first semiconductor pillar that lies between the first impurity region and the second impurity region serves as a first channel, the first gate insulating layer formed on the outer periphery of the first semiconductor pillar surrounds the first channel, and the first gate conductor layer is formed on the outer periphery of the first gate insulating layer.

Preferably, the method further includes a third impurity region forming step of forming a third impurity region containing a donor or acceptor impurity by implanting ions into a surface of the semiconductor substrate located at an outer periphery of the first island-shaped semiconductor layer, and the third impurity region forming step is performed after the first island-shaped semiconductor layer forming step and before the first semiconductor pillar forming step.

Preferably, the method further includes a sixth material layer forming step of forming a sixth material layer having a low oxidation rate so as to cover the first island-shaped semiconductor layer and the semiconductor substrate located at the outer periphery of the first island-shaped semiconductor layer; a sixth material layer processing step of causing the sixth material layer to remain at a side surface of a lower portion of the first island-shaped semiconductor layer; and an oxide layer forming step of forming an oxide layer on a side surface of the first island-shaped semiconductor layer not covered with the sixth material layer. The sixth material layer forming step, the sixth material layer processing step, and the oxide layer forming step are preferably performed after the first island-shaped semiconductor forming step and before the first semiconductor pillar forming step. The third impurity region forming step is preferably performed after the oxide layer forming step.

The first semiconductor pillar is preferably formed so as to be within an inner periphery of the third impurity region that has thermally diffused into an interior of the first island-shaped semiconductor layer after the third impurity region forming step.

Shapes of the third material layer and the fourth material layer that are on top of each other are preferably square shapes in a plan view.

The outer periphery of the first gate conductor layer surrounding the first semiconductor pillar is preferably located above the second island-shaped semiconductor layer.

The first island-shaped semiconductor layer is preferably formed so as to have a side extending in the lengthwise direction and aligning with sides of the third material layer and the fourth material layer extending in the lengthwise direction, and have a side extending in the crosswise direction and aligning with sides of the third material layer and the fourth material layer extending in the crosswise direction.

A second aspect of the present invention provides a method for producing an SGT-including semiconductor device. The method includes a first and second material layers forming step of forming a first material layer on a semiconductor substrate and a second material layer on the first material layer; a sixth material layer forming step of forming a sixth material layer on the second material layer; a third, fourth, and seventh material layers forming step of forming a third material layer, a fourth material layer, and a seventh material layer that have the same square shape in a plan view and are on top of one another, by etching the first material layer, the second material layer, and the sixth material layer by using a mask having a square shape in a plan view; a third island-shaped semiconductor layer forming step of forming a third island-shaped semiconductor layer by etching the semiconductor substrate by using the third material layer, the fourth material layer, and the seventh material layer as a mask so that the third island-shaped semiconductor layer has a side extending in a lengthwise direction and aligning with sides of the third material layer, the fourth material layer, and the seventh material layer extending in the lengthwise direction, and has a side extending in a crosswise direction and aligning with sides of the third material layer, the fourth material layer, and the seventh material layer extending in the crosswise direction; an eighth and ninth material layers forming step of forming an eighth material layer having a circular shape in a plan view and a ninth material having a circular shape in a plan view by isotropically etching the third material layer and the fourth material layer by using the seventh material layer as a mask so that etching proceeds from an outer periphery of the seventh material layer toward an inner side of the seventh material layer; a seventh material layer removing step of removing the seventh material layer; a second semiconductor pillar forming step of forming a second semiconductor pillar from the third island-shaped semiconductor layer by etching the third island-shaped semiconductor layer by using the eighth material layer and the ninth material layer as a mask; a tenth material layer forming step of forming a tenth material layer from the eighth material layer by isotropically etching the eighth material layer by using the ninth material layer as a mask so that etching proceeds from an outer periphery of the ninth material layer toward an inner side of the ninth material layer; a ninth material layer removing step of removing the ninth material layer; a third and fourth semiconductor pillars forming step of forming a third semiconductor pillar having a circular shape in a plan view and a fourth semiconductor pillar having a circular shape in a plan view by etching the second semiconductor pillar by using the tenth material layer as a mask; a fourth and fifth impurity regions forming step of forming a fourth impurity region in a bottom portion of the fourth semiconductor pillar and forming a fifth impurity region inside the fourth semiconductor pillar and at a position distant from and above the fourth impurity region, the fourth impurity region containing a donor or acceptor impurity, the fifth impurity region having the same conductivity type as the fourth impurity region; a sixth and seventh impurity regions forming step of forming a sixth impurity region in a bottom portion of the third semiconductor pillar and forming a seventh impurity region inside the third semiconductor pillar and at a position distant from and above the sixth impurity region, the sixth impurity region containing a donor or acceptor impurity, the seventh impurity region having the same conductivity type as the sixth impurity region; a second gate insulating layer forming step of forming a second gate insulating layer between the fourth impurity region and the fifth impurity region and on an outer periphery of the fourth semiconductor pillar; a second gate conductor layer forming step of forming a second gate conductor layer on an outer periphery of the second gate insulating layer; a third gate insulating layer forming step of forming a third gate insulating layer between the sixth impurity region and the seventh impurity region and on an outer periphery of the third semiconductor pillar; and a third gate conductor layer forming step of forming a third gate conductor layer on an outer periphery of the third gate insulating layer. In the SGT-including semiconductor device, a second SGT is formed in which one of the fourth impurity region and the fifth impurity region serves as a source while the other serves as a drain, the fourth semiconductor pillar that lies between the fourth impurity region and the fifth impurity region serves as a second channel, the second gate insulating layer on the outer periphery of the fourth semiconductor pillar surrounds the second channel, and the second gate conductor layer is formed on the outer periphery of the second gate insulating layer. In the SGT-including semiconductor device, a third SGT is formed in which one of the sixth impurity region and the seventh impurity region serves as a source while the other serves as a drain, the third semiconductor pillar that lies between the sixth impurity region and the seventh impurity region serves as a third channel, the third gate insulating layer on the outer periphery of the third semiconductor pillar surrounds the third channel, and the third gate conductor layer is formed on the outer periphery of the third gate insulating layer.

According to the present invention, a semiconductor pillar constituting an SGT is formed in a circuit-forming region at high positional accuracy. Thus, the density of SGT-including CMOS inverter circuits can be increased.

BRIEF DESCRIPTION OF THE DRAWINGS

FIG. 1B is a diagram showing an arrangement of Si pillars of a CMOS-type SRAM cell circuit illustrating the method for forming an SGT-including semiconductor device according to the first embodiment.

FIG. 2A(a) is a plan view of and FIGS. 2A(b) and 2A(c) are cross-sectional views of a CMOS-type SRAM cell circuit for illustrating the method for producing an SGT-including semiconductor device according to the first embodiment.

FIG. 2C(a) is a plan view of and FIGS. 2C(b) and 2C(c) are cross-sectional views of a CMOS-type SRAM cell circuit illustrating the method for producing an SGT-including semiconductor device according to the first embodiment.

FIG. 2D(a) is a plan view of and FIGS. 2D(b) and 2D(c) are cross-sectional views of a CMOS-type SRAM cell circuit illustrating the method for producing an SGT-including semiconductor device according to the first embodiment.

FIG. 2E(a) is a plan view of and FIGS. 2E(b) and 2E(c) are cross-sectional views of a CMOS-type SRAM cell circuit illustrating the method for producing an SGT-including semiconductor device according to the first embodiment.

FIG. 2F(a) is a plan view of and FIGS. 2F(b) and 2F(c) are cross-sectional views of a CMOS-type SRAM cell circuit illustrating the method for producing an SGT-including semiconductor device according to the first embodiment.

FIG. 2G(a) is a plan view of and FIGS. 2G(b) and 2G(c) are cross-sectional views of a CMOS-type SRAM cell circuit illustrating the method for producing an SGT-including semiconductor device according to the first embodiment.

FIG. 2H(a) is a plan view of and FIGS. 2H(b) and 2H(c) are cross-sectional views of a CMOS-type SRAM cell circuit illustrating the method for producing an SGT-including semiconductor device according to the first embodiment.

FIG. 2I(a) is a plan view of and FIGS. 2I(b) and 2I(c) are cross-sectional views of a CMOS-type SRAM cell circuit illustrating the method for producing an SGT-including semiconductor device according to the first embodiment.

FIG. 2J(a) is a plan view of and FIGS. 2J(b) and 2J(c) are cross-sectional views of a CMOS-type SRAM cell circuit illustrating the method for producing an SGT-including semiconductor device according to the first embodiment.

FIG. 2K(a) is a plan view of and FIGS. 2K(b) and 2K(c) are cross-sectional views of a CMOS-type SRAM cell circuit illustrating the method for producing an SGT-including semiconductor device according to the first embodiment.

FIG. 2M(a) is a plan view of and FIGS. 2M(b) and 2M(c) are cross-sectional views of a CMOS-type SRAM cell circuit illustrating the method for producing an SGT-including semiconductor device according to the first embodiment.

FIG. 3A(a) is a plan view of and FIGS. 3A(b) and 3A(c) are cross-sectional views of a CMOS-type SRAM cell circuit illustrating a method for producing an SGT-including semiconductor device according to a second embodiment.

FIG. 3B(a) is a plan view of and FIGS. 3B(b) and 3B(c) are cross-sectional views of a CMOS-type SRAM cell circuit illustrating the method for producing an SGT-including semiconductor device according to the second embodiment.

FIG. 3C(a) is a plan view of and FIGS. 3C(b) and 3C(c) are cross-sectional views of a CMOS-type SRAM cell circuit illustrating the method for producing an SGT-including semiconductor device according to the second embodiment.

FIG. 3D(a) is a plan view of and FIGS. 3D(b) and 3D(c) are cross-sectional views of a CMOS-type SRAM cell circuit illustrating the method for producing an SGT-including semiconductor device according to the second embodiment.

FIG. 3F(a) is a plan view of and FIGS. 3F(b) and 3F(c) are cross-sectional views of a CMOS-type SRAM cell circuit illustrating the method for producing an SGT-including semiconductor device according to the second embodiment.

FIG. 3G(a) is a plan view of and FIGS. 3G(b) and 3G(c) are cross-sectional views of a CMOS-type SRAM cell circuit illustrating the method for producing an SGT-including semiconductor device according to the second embodiment.

FIG. 4B(a) is a plan view of and FIGS. 4B(b) and 4B(c) are cross-sectional views of a CMOS-type SRAM cell circuit illustrating the method for producing an SGT-including semiconductor device according to the third embodiment.

FIG. 4C(a) is a plan view of and FIGS. 4C(b) and 4C(c) are cross-sectional views of a CMOS-type SRAM cell circuit illustrating the method for producing an SGT-including semiconductor device according to the third embodiment.

FIG. 4D(a) is a plan view of and FIGS. 4D(b) and 4D(c) are cross-sectional views of a CMOS-type SRAM cell circuit illustrating the method for producing an SGT-including semiconductor device according to the third embodiment.

FIG. 4E(a) is a plan view of and FIGS. 4E(b) and 4E(c) are cross-sectional views of a CMOS-type SRAM cell circuit illustrating the method for producing an SGT-including semiconductor device according to the third embodiment.

FIG. 5C(a) is a plan view of and FIGS. 5C(b) and 5C(c) are cross-sectional views of an SGT illustrating the method for producing an SGT-including semiconductor device according to the fourth embodiment.

FIG. 6A(a) is a plan view of and FIGS. 6A(b) and 6A(c) are cross-sectional views of a CMOS-type inverter circuit illustrating a method for producing an SGT-including semiconductor device according to a fifth embodiment.

FIG. 6B(a) is a plan view of and FIGS. 6B(b) and 6B(c) are cross-sectional views of a CMOS-type inverter circuit illustrating the method for producing an SGT-including semiconductor device according to the fifth embodiment.

FIG. 6C(a) is a plan view of and FIGS. 6C(b) and 6C(c) are cross-sectional views of a CMOS-type inverter circuit illustrating the method for producing an SGT-including semiconductor device according to the fifth embodiment.

FIG. 6F(a) is a plan view of and FIGS. 6F(b) and 6F(c) are cross-sectional views of a CMOS-type inverter circuit illustrating the method for producing an SGT-including semiconductor device according to the fifth embodiment.

FIG. 9A(a) is a plan view and FIG. 9A(b) is a cross-sectional view illustrating a method for producing an SGT-including CMOS inverter circuit according to related art.

FIG. 9B(a) is a plan view and FIG. 9B(b) is a cross-sectional view illustrating an SGT-including CMOS inverter circuit according to related art.

FIG. 9C(a) is a plan view and FIG. 9C(b) is a cross-sectional view illustrating an SGT-including CMOS inverter circuit according to related art.

DETAILED DESCRIPTION OF THE PREFERRED EMBODIMENTS

Methods for producing SGT-including semiconductor devices according to embodiments of the present invention will now be described with reference to the drawings.

First Embodiment

A method for producing an SGT-including CMOS-type static random access memory (SRAM) cell circuit according to a first embodiment of the present invention is described below with reference to FIGS. 1A, 1B, and 2A(a) to 2M(c).

Figure 1A:
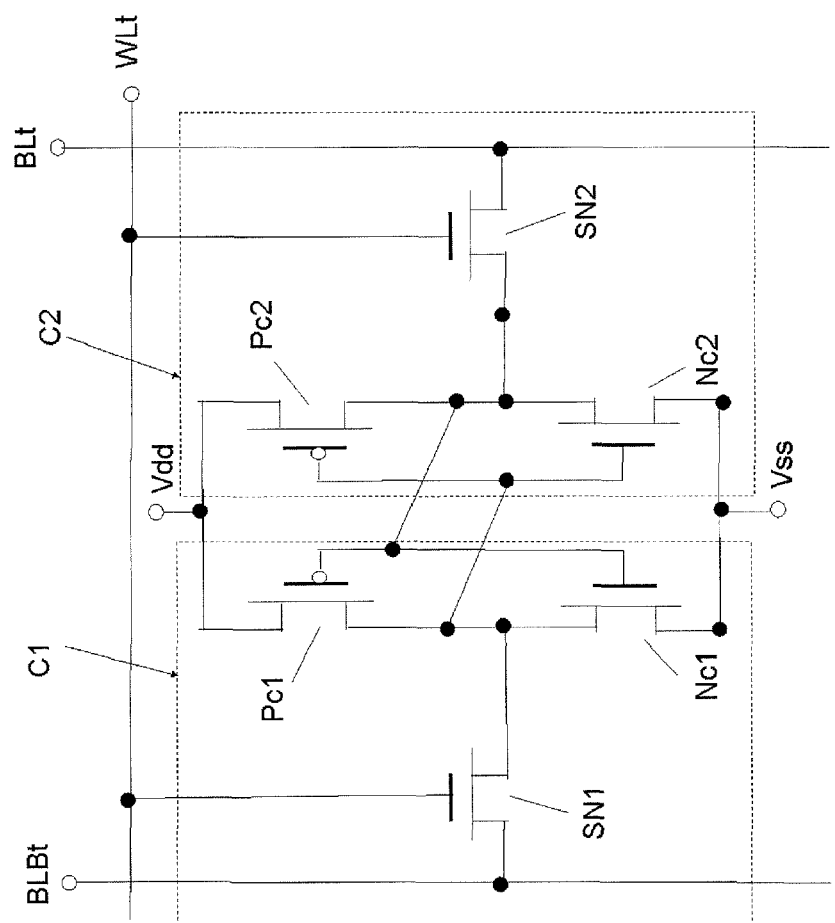
FIG. 1A is a CMOS-type SRAM cell circuit diagram illustrating a method for producing an SGT-including semiconductor device according to a first embodiment.

FIG. 1A is a diagram of an SRAM cell circuit according to this embodiment. This SRAM cell includes two inverter circuits. One of the inverter circuits is constituted by a P-channel SGT Pc1 serving as a load transistor, and an N-channel SGT Nc1 serving as a drive transistor. The other inverter circuit is constituted by a P-channel SGT Pc2 serving as a load transistor, and an N-channel SGT Nc2 serving as a drive transistor. The gate of the P-channel SGT Pc1 is connected to the gate of the N-channel SGT Nc1 and thus the drain of the P-channel SGT Pc2 is connected to the drain of the N-channel SGT Nc2. The gate of the P-channel SGT Pc2 is connected to the gate of the N-channel SGT Nc2 and thus the drain of the P-channel SGT Pa is connected to the drain of the N-channel SGT Nc1.

Referring to FIG. 1A, the sources of the P-channel SGT Pc1 and the P-channel SGT Pc2 are connected to the power supply terminal Vdd. The sources of the N-channel SGT Nc1 and the N-channel SGT Nc2 are connected to a ground terminal Vss. The gates selection N-channel SGTs SN1 and SN2 are connected to a word line terminal WLt. The source and the drain of the selection N channel SGT SN1 are respectively connected to the drains of the N-channel SGT Nc1 and the P-channel SGT Pc1 and to an inversion bit line terminal BLBt. The source and the drain of the selection N-channel SGT SN2 are respectively connected to the drains of the N-channel SGT Nc2 and the P-channel SGT Pc2 and to a bit line terminal BLt. As such, a circuit that includes an SRAM cell (hereinafter referred to as "SRAM cell circuit") according to this embodiment includes a total of six SGTs, namely, two P-channel SGTs Pc1 and Pc2, and four N-channel SGTs Nc1, Nc2, SN1, and SN2. This SRAM cell circuit is divided into a circuit region C1 constituted by the P-channel SGT Pc1 and the N-channel SGTs Nc1 and SN1, and a circuit region C2 constituted by the P-channel SGT Pc2 and the N-channel SGTs Nc2 and SN2.

FIG. 1B is a diagram showing arrangement of devices in the case the SRAM cell circuit shown in FIG. 1A is formed on a semiconductor substrate. An N-channel SGT Nc2 is formed in a Si pillar P1, a P-channel SGT Pc2 is formed in a Si pillar P2, an N-channel SGT SN2 is formed in a Si pillar P3, an N channel SGT SN1 is formed in a Si pillar P4, a P-channel SGT Pc1 is formed in a Si pillar P5, and an N-channel SGT Nc1 is formed in a Si pillar P6. A circuit-forming region IA1 corresponds to the circuit region C1 in FIG. 1A and a circuit-forming region IA2 corresponds to the circuit region C2 in FIG. 1A.

A method for producing an SGT-including CMOS-type SRAM cell circuit shown in FIGS. 1A and 1B will now be described with reference to FIGS. 2A(a) to 2M(c). FIGS. 2A(a), 2B(a) . . . 2M(a) each show a plan view, 2A(b), 2B(b) . . . 2M(b) each show a cross-sectional view taken along line X-X' (corresponds to line X-X' in FIG. 1B), and 2A(c), 2B(c) . . . 2M(c) each show a cross-sectional view taken along line Y-Y' (corresponds to line Y-Y' in FIG. 1B). This applies to other drawings as well.

First, as shown in FIGS. 2A(a), 2A(b) and 2A(c), a SiO$_2$ layer 2 is formed on an i-layer substrate 1 by a thermal oxidation process and a silicon nitride (SiN) layer 3 is formed on the SiO$_2$ layer 2.

Figure 2B:
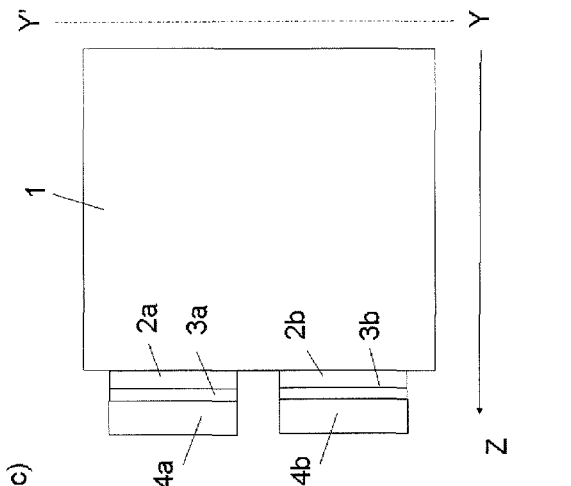
FIG. 2B(a) is a plan view of and FIGS. 2B(b) and 2B(c) are cross-sectional views of a CMOS-type SRAM cell circuit illustrating the method for producing an SGT-including semiconductor device according to the first embodiment.
Figure 2B:
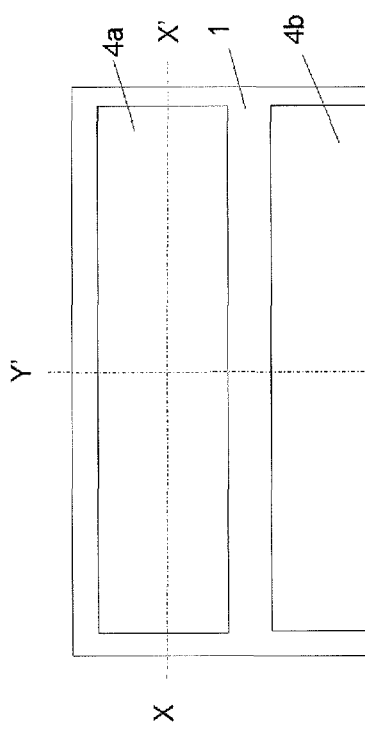
Figure 2B:
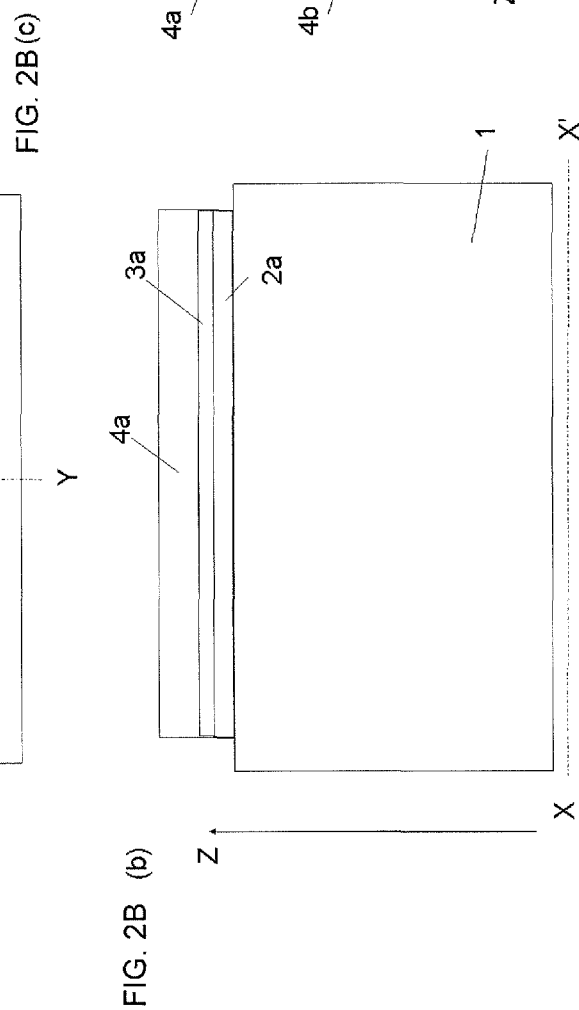

Next, as shown in FIGS. 2B(a), 2B(b) and 2B(c), resist layers 4a and 4b corresponding to the circuit-forming regions IA1 and IA2 in FIG. 1B and each having a rectangular shape in a plan view are formed by lithography. Then the SiO$_2$ layer 2 and the SiN layer 3 are etched by using the resist layers 4a and 4b as a mask so as to form SiO$_2$ layers 2a and 2b on the i-layer substrate 1 and SiN layers 3a and 3b on the SiO$_2$ layers 2a and 2b, respectively. The SiO$_2$ layers 2a and 2b and the SiN layers 3a and 3b have the same rectangular shape in a plan view. The SiO$_2$ layer 2a and the SiN layer 3a are on top of each other and the SiO$_2$ layer 2b and the SiN layer 3b are on top of each other.

Next, as shown in FIGS. 2C(a), 2C(b) and 2C(c), the i-layer substrate 1 is etched by reactive ion etching (RIE) using the resist layers 4a and 4b, the SiO$_2$ layers 2a and 2b, and the SiN layers 3a and 3b as a mask so as to form i-layers 5a and 5b each having a rectangular shape in a plan view. The i-layers 5a and 5b each have an island structure.

Next, as shown in FIGS. 2D(a), 2D(b) and 2D(c), resist layers 6a, 6b, and 6c each having a rectangular shape in a plan view and extending in a direction perpendicular to the i-layers 5a and 5b (Y-Y' direction in (a)) are formed by lithography. The SiN layers 3a and 3b and the SiO$_2$ layers 2a and 2b are etched by using the resist layers 6a, 6b, and 6c as a mask so as to form SiO$_2$ layers 7a, 7b, 7c, 7d, 7e, and 7f, and SiN layers 8a, 8b, 8c, 8d, 8e, and 8f on the i-layers 5a and 5b. Here, as shown in FIGS. 2D(b) and 2D(c), only those sides of the i-layers 5a and 5b, the SiO$_2$ layers 7a, 7b, 7c, 7d, 7e, and 7f, and the SiN layers 8a, 8b, 8c, 8d, 8e, and 8f which extend in the Y-Y' direction align with one another. Then the resist layers 6a, 6b, and 6c are removed. A width La of each of the resist layers 6a, 6b, and 6c in the X-X' direction is preferably equal to a width Lb of each of the i-layers 5a and 5b in the Y-Y' direction. This contributes to making Si pillars P1 to P6 having a circular cross-sectional shape in a plan view.

Next, as shown in FIGS. 2E(a), 2E(b) and 2E(c), the SiO$_2$ layers 7a, 7b, 7c, 7d, 7e, and 7f are etched by an isotropic plasma etching process using the SiN layers 8a, 8b, 8c, 8d, 8e, and 8f as a mask so as to form SiO$_2$ layers 7aa, 7bb, 7cc, 7dd, 7ee, and 7ff. Etching of the SiO$_2$ layers 7a, 7b, 7c, 7d, 7e, and 7*f* proceeds from the outer periphery of the SiN layers 8*a*, 8*b*, 8*c*, 8*d*, 8*e*, and 8*f* having a rectangular shape in a plan view toward the inner side thereof. As a result, each of the SiO$_2$ layers 7*aa*, 7*bb*, 7*cc*, 7*dd*, 7*ee*, and 7*ff* comes to have a circular shape in a plan view. Then the SiN layers 8*a*, 8*b*, 8*c*, 8*d*, 8*e*, and 8*f* are removed.

Next, as shown in FIGS. 2F(a), 2F(b) and 2F(c), Si pillars P1, P2, P3, P4, P5, and P6 are formed by reactive ion etching (RIE) using the SiO$_2$ layers 7*aa*, 7*bb*, 7*cc*, 7*dd*, 7*ee*, and 7*ff* as a mask. As a result, i-layers 5*aa* and 5*bb* corresponding to the regions where SGTs are to be formed and having a rectangular shape in a plan view are formed on the i-layer substrate 1.

Next, as shown in FIGS. 2G(a), 2G(b) and 2G(c), a SiN layer 9 that covers the i-layer substrate 1, the i-layers 5*aa* and 5*bb*, and the Si pillars P1, P2, P3, P4, P5, and P6 is formed by chemical vapor deposition (CVD). Then a SiO$_2$ layer 10 that covers the whole structure is deposited by CVD. The surface of the SiO$_2$ layer 10 is then planarized by chemical mechanical polishing (CMP).

Next, as shown in FIGS. 2H(a), 2H(b) and 2H(c), the SiO$_2$ layer 10 is evenly etched by etch-back so that a SiO$_2$ layer 10*a*, which is a part of the SiO$_2$ layer 10, remains on the i-layer substrate 1 located outside the i-layers 5*aa* and 5*bb*.

Next, as shown in FIGS. 2I(a), 2I(b) and 2I(c), exposed portions of the SiN layer 9 that lie on the SiO$_2$ layers 7*aa*, 7*bb*, 7*cc*, 7*dd*, 7*ee*, and 7*ff* and on side surfaces of the Si pillars P1, P2, P3, P4, P5, and P6 are etched. During etching, the SiO$_2$ layer 10*a* remains intact. A SiN layer 9*a* remains on the i-layer substrate 1 and side surfaces of the i-layers 5*aa* and 5*bb*. A thin SiO$_2$ layer 9*b* is then deposited over the whole structure by atomic layer deposition (ALD). A resist layer 11 having a rectangular shape in a plan view and extending in the Y-Y' direction is formed by lithography so as to cover the Si pillars P2 and P5. N$^+$ regions 12*a*, 12*b*, 12*c*, and 12*d* are formed in the i-layers 5*aa* and 5*bb* by an arsenic (As) ion implantation method using the resist layer 11 and the SiO$_2$ layer 10*a* on the i-layer substrate 1 as a mask. Then the resist layer 11 is removed.

Next, as shown in FIGS. 2J(a), 2J(b) and 2J(c), as with forming the N$^+$ regions 12*a* and 12*b*, a P$^+$ region 13*a* is formed in the i-layer 5*aa* located outside the Si pillar P2 and between the N$^+$ regions 12*a* and 12*b* and a P$^+$ region 13*b* is formed in the i-layer 5*bb* located outside the Si pillar P5 and between the N$^+$ regions 12*c* and 12*d*. Then the SiO$_2$ layers 7*aa*, 7*bb*, 7*cc*, 7*dd*, and 7*ee* in top portions of the Si pillars P1, P2, P3, P4, P5, and P6 are removed by etching. Then the whole structure is covered with a hafnium oxide (HfO$_2$) layer 9*d* and a titanium nitride (TiN) layer 14 by atomic layer deposition (ALD). The outer periphery of the TiN layer 14 surrounding the Si pillars P1 to P6 is located above the i-layers 5*aa* and 5*bb*. Then the whole structure is covered with a resist and the resist is evenly etched back so as to form a resist layer 15 having an upper surface positioned lower than the top portions of the Si pillars P1, P2, P3, P4, P5, and P6. Then the TiN layer 14 and the HfO$_2$ layer 9*d* on the top portions of the Si pillars P1, P2, P3, P4, P5, and P6 are removed by etching using the resist layer 15 as a mask. The resist layer 15 is then removed. The diameter Lc at the outermost periphery (the outermost periphery of the TiN layer 14) of each of the Si pillars P1, P2, P3, P4, P5, and P6 having a circular cross-sectional shape and being covered with the HfO$_2$ layer 9*d* and the TiN layer 14 is preferably smaller than the width Lb of the i-layers 5*a* and 5*b* in the Y-Y' direction. In this manner, the Si pillars P1 to P6 surrounded by the HfO$_2$ layer 9*d* and the TiN layer 14 can be formed on the i-layers 5*aa* and 5*bb* having a rectangular shape in a plan view, without protruding from the outer peripheries of the i-layers 5*aa* and 5*bb*. As a result, the Si pillars P1 to P6 surrounded by the HfO$_2$ layer 9*d* and the TiN layer 14 can be easily formed on the i-layers 5*aa* and 5*bb* having a rectangular shape in a plan view.

Next, as shown in FIGS. 2K(a), 2K(b) and 2K(c), ion-implantation is performed to form N$^+$ regions 16*a*, 16*b*, 16*c*, and 16*d* in the top portions of the Si pillars P1, P3, P4, and P6, and to form P$^+$ regions 17*a* and 17*b* in top portions of the Si pillars P2 and P5. A lithographic process is then performed to form a resist layer 18*a* covering the Si pillars P1 and P2, a resist layer 18*b* covering the Si pillar P3, a resist layer 18*c* covering the Si pillar P4, and a resist layer 18*d* covering the Si pillars P5 and P6. Then the TiN layer 14 is etched by a RIE process using the resist layers 18*a*, 18*b*, 18*c*, and 18*d* as a mask so as to form TiN layers 14*a*, 14*b*, 14*c*, and 14*d* covering the Si pillars P1 to P6. The resist layers 18*a*, 18*b*, 18*c*, and 18*d* are then removed. The HfO$_2$ layer 9*d* serving as a gate insulating layer is formed on the outer peripheries of the Si pillars P1, P2, P3, P4, P5, and P6. A width Ld of the TiN layers 14*a*, 14*b*, 14*c*, and 14*d* in the Y-Y' direction is preferably smaller than a width Lb of the i-layers 5*a* and 5*b* in the Y-Y' direction; moreover, considering the mask alignment margin for lithography, the TiN layers 14*a*, 14*b*, 14*c*, and 14*d* are preferably formed on the i-layers 5*a* and 5*b*.

Figure 2L:
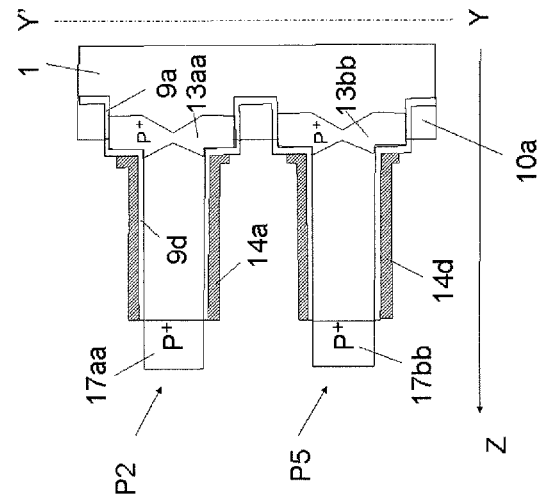
FIG. 2L(a) is a plan view of and FIGS. 2L(b) and 2L(c) are cross-sectional views of a CMOS-type SRAM cell circuit illustrating the method for producing an SGT-including semiconductor device according to the first embodiment.
Figure 2L:
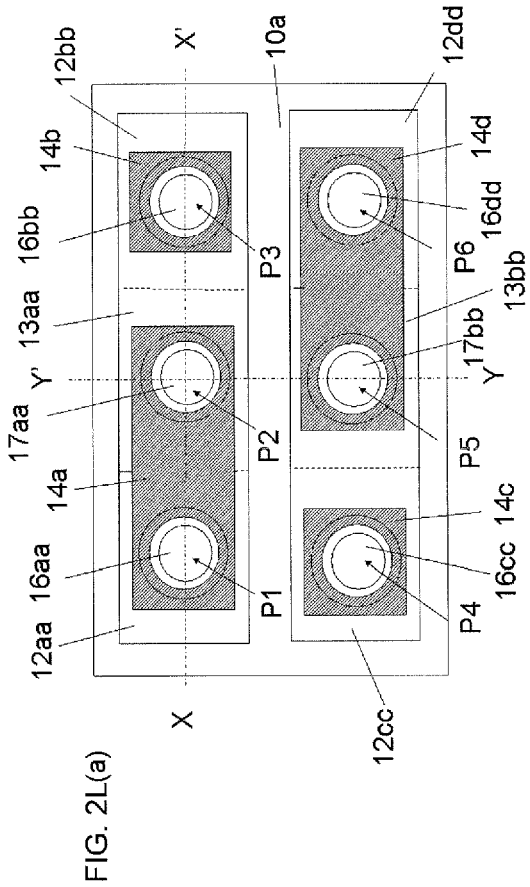
Figure 2L:
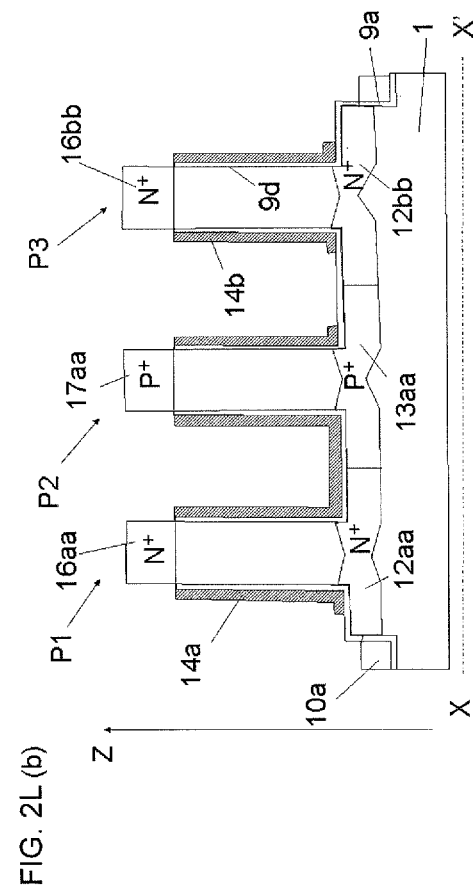

Next, as shown in FIGS. 2L(a), 2L(b) and 2L(c), a heat treatment is performed to thermally diffuse the donor impurity in the N$^+$ regions 12*a*, 12*b*, 12*c*, 12*d*, 16*a*, 16*b*, 16*c*, and 16*d* and the acceptor impurity in the P$^+$ regions 13*a*, 13*b*, 17*a*, and 17*b* so as to form N$^+$ regions 12*aa*, 12*bb*, 12*cc*, 12*dd*, 16*aa*, 16*bb*, 16*cc*, and 16*dd* and P$^+$ regions 13*aa*, 13*bb*, 17*aa*, and 17*bb*.

Next, as shown in FIGS. 2M(a), 2M(b) and 2M(c), a SiO$_2$ layer 19 is formed by CVD and then the surface of the SiO$_2$ layer 19 is planarized by chemical mechanical polishing (CMP). A contact hole 19*a* is formed on the Si pillar P1, a contact hole 19*b* is formed on the Si pillar P6, a contact hole 19*c* is formed on the TiN layer 14*c*, and a contact hole 19*d* is formed on the TiN layer 14*b*. Ground wiring metal layers VSS1 and VSS2 connected to the N$^+$ regions 16*aa* and 16*dd* through the contact holes 19*a* and 19*b* are formed and a word line metal layer WL connected to the TiN layers 14*c* and 14*d* through the contact holes 19*c* and 19*d* is formed. Then a SiO$_2$ layer 20 is formed on the surface layer by a CVD process and the surface of the SiO$_2$ layer 20 is planarized by chemical mechanical polishing (CMP). A contact hole 21*a* is formed on the TiN layer 14*a*, a contact hole 21*b* is formed on the Si pillar P2, a contact hole 21*c* is formed on the border line between the N$^+$ region 12*bb* and the P$^+$ region 13*aa*, a contact hole 21*d* is formed on the Si pillar P3, a contact hole 21*e* is formed on the Si pillar P4, a contact hole 21*f* is formed on the border line between the N$^+$ region 12*cc* and the P$^+$ region 13*bb*, a contact hole 21*g* is formed on the Si pillar P5, and a contact hole 21*h* is formed on the TiN layer 14*d*. An inversion bit line metal layer BLB connected to the N$^+$ region 16*cc* through the contact hole 21*e* is formed and a wiring metal layer 22*a* connected to the TiN layer 14*a*, the N$^+$ region 12*cc*, and the P$^+$ region 13*bb* through contact holes 21*a* and 21*f* is formed. A power supply wiring metal layer VDD connected to the P$^+$ regions 17*aa* and 17*bb* through the contact holes 21*b* and 21*g* is formed. A wiring metal layer 22*b* connected to the TiN layer 14*d*, the N$^+$ region 12*bb*, and the P$^+$ region 13*aa* through the contact holes 21*c* and 21*h* is formed. Then a bit line metal layer BL connected to the N$^+$ region 12*bb* through the contact hole 21*d* is formed. As a result, an SGT-including SRAM cell circuit is formed.

The first embodiment of the present invention has the following effects:

1. The Si pillars P1 to P6 are formed by RIE using, as a mask, the SiO$_2$ layers 7aa, 7bb, 7cc, 7dd, 7ee, and 7ff each having a circular shape in a plan view and being formed on the i-layers 5a and 5b each having an island structure. The positional relationship between the Si pillars P1 to P6 and the i-layers 5aa and 5bb below the Si pillars P1 to P6 is determined by the positional relationship of mask alignment by lithography for the i-layers 5a and 5b and the resist layers 6a, 6b, and 6c, as shown in FIGS. 2D(a), 2D(b) and 2D(c). During mask alignment that proceeds in the Y-Y' direction and the X-X' direction, misalignment occurring in mask alignment in the Y-Y' direction does not affect the positional relationship among the SiO$_2$ layers 7a, 7b, 7c, 7d, 7e, and 7f, the SiN layers 8a, 8b, 8c, 8d, 8e, and 8f, and the i-layers 5a and 5b. As such, the Si pillars P1 to P6 are formed by self-alignment in the Y-Y' direction on the i-layers 5aa and 5bb. As a result, the mask alignment margin for the lithographic process is no longer needed in the Y-Y' direction. Thus, an SRAM cell circuit having a smaller cell area can be realized.

2. Because the width La of the resist layers 6a, 6b, and 6c in the X-X' direction is equal to the width Lb of the i-layers 5a and 5b in the Y-Y' direction, the horizontal cross-sectional shape of each of the Si pillars P1 to P6 can be made circular in a plan view. As a result, SGTs having a concentric potential distribution within the horizontal cross-section of the channel are formed in the Si pillars P1 to P6 and a current drive capability can be enhanced.

3. Because the diameter Lc at the outermost periphery (the outermost periphery of the TiN layer 14) of each of the Si pillars P1 to P6 having a circular cross-sectional shape and being covered with the HfO$_2$ layer 9d and the TiN layer 14 is smaller than the width Lb of the i-layers 5a and 5b in the Y-Y' direction, the Si pillars P1 to P6 surrounded by the HfO$_2$ layer 9d and the TiN layer 14 can be formed on the i-layers 5aa and 5bb having a rectangular shape in a plan view without protruding from the outer peripheries of the i-layers 5aa and 5bb. As a result, the Si pillars P1 to P6 surrounded by the HfO$_2$ layer 9d and the TiN layer 14 can be easily formed on the i-layers 5aa and 5bb having a rectangular shape in a plan view.

Second Embodiment

A method for producing an SGT-including CMOS-type SRAM cell circuit according to a second embodiment of the present invention will now be described with reference to FIGS. 3A(a) to 3G(c).

The second embodiment is useful for forming N-type wells or P-type wells to obtain SGTs with a low OFF current or for forming a circuit that includes a device isolation impurity diffusion layer for ensuring isolation between circuits.

First, as shown in FIGS. 3A(a), 3A(b) and 3A(c), an i-layer 26 is formed on a P-layer substrate 25. Then as in FIGS. 2A(a), 2A(b) and 2A(c), a SiO$_2$ layer 2 is formed on the i-layer 26 by a thermal oxidation process and a SiN layer 3 is formed on the SiO$_2$ layer 2.

Next, as shown in FIGS. 3B(a), 3B(b) and 3B(c), resist layers 4a and 4b corresponding to the circuit-forming regions IA1 and IA2 of FIG. 1B are formed by lithography as in FIGS. 2B(a), 2B(b), 2B(c), 2C(a), 2C(b) and 2C(c). The SiO$_2$ layer 2 and the SiN layer 3 are etched by using the resist layers 4a and 4b as a mask so as to form SiO$_2$ layers 2a and 2b and SiN layers 3a and 3b on the i-layer 26. Then the i-layer 26 is etched by RIE by using the resist layers 4a and 4b, the SiO$_2$ layers 2a and 2b, and the SiN layers 3a and 3b as a mask so as to form i-layers 5a and 5b each having a rectangular shape in a plan view. Then the resist layers 4a and 4b are removed. As shown in FIGS. 3B(b) and 3B(c), those sides of the i-layers 5a and 5b, the SiO$_2$ layers 2a and 2b, and the SiN layers 3a and 3b which extend in the X-X' direction align with one another and those sides of the i-layers 5a and 5b, the SiO$_2$ layers 2a and 2b, and the SiN layers 3a and 3b which extend in the Y-Y' direction also align with one another.

Next, as shown in FIGS. 3C(a), 3C(b) and 3C(c), a SiO$_2$ layer 27 is formed on the surfaces of the i-layer 5a and the i-layer 26 by a thermal oxidation process. Implantation of arsenic (As) ions is performed by using the SiO$_2$ layer 2a and the SiN layer 3a as a mask so as to form an N region 28 ("N region" refers to a region containing a donor impurity) in the surface layer of the i-layer 26 located outside the i-layers 5a and 5b.

Next, as shown in FIGS. 3D(a), 3D(b) and 3D(c), a heat treatment is performed to thermally diffuse the donor impurity in the N region 28 and to thereby form an N region 28a in the surface layer of the i-layer 26 located outside the i-layers 5a and 5b and a region extending inward from side surfaces of bottom portions of the i-layers 5a and 5b. As shown in FIG. 3D(a), inner peripheries 29a and 29b of the N region 28a are within the i-layers 5a and 5b in a plan view.

Figure 3E:
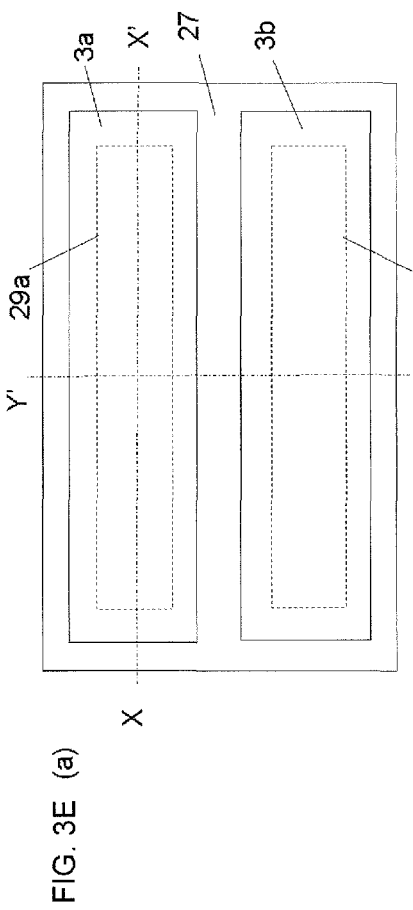
FIG. 3E(a) is a plan view of and FIGS. 3E(b) and 3E(c) are cross-sectional views of a CMOS-type SRAM cell circuit illustrating the method for producing an SGT-including semiconductor device according to the second embodiment.
Figure 3E:
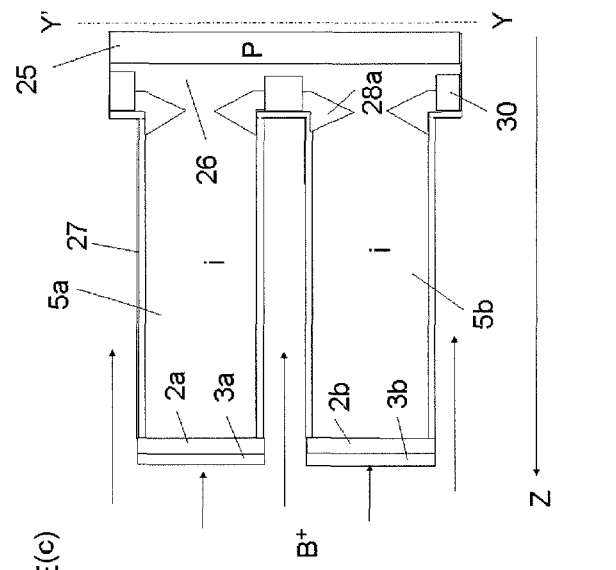
Figure 3E:
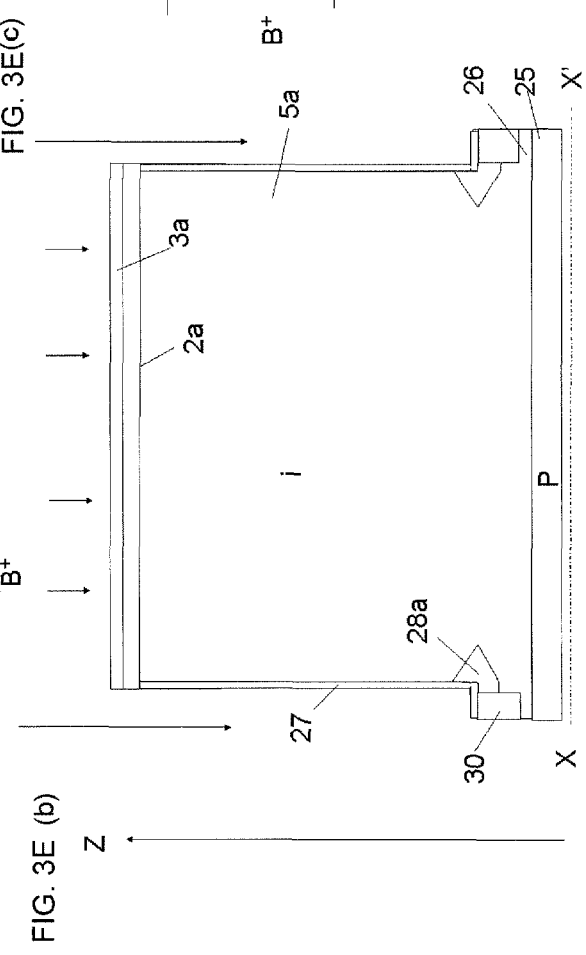

Next, as shown in FIGS. 3E(a), 3E(b) and 3E(c), boron (B) ions are implanted by using the SiO$_2$ layers 2a and 2b and the SiN layers 3a and 3b as a mask so as to form a P$^+$ region 30 in the surface layer of the i-layer 26 located outside the i-layers 5a and 5b. The concentration of the acceptor impurity in the P$^+$ region 30 serving as a channel stopper is larger than the donor impurity concentration in the N region 28 serving as an N well.

Next, as shown in FIGS. 3F(a), 3F(b) and 3F(c), the same process as one shown in FIGS. 2D(a), 2D(b), 2D(c), 2E(a), 2E(b), 2E(c), 2F(a), 2F(b) and 2F(c) is performed. Namely, a RIE process is performed by using the SiO$_2$ layers 7aa, 7bb, 7cc, 7dd, 7ee, and 7ff having a circular shape in a plan view as a mask so as to etch the i-layers 5a and 5b not covered with the SiO$_2$ layers 7aa, 7bb, 7cc, 7dd, 7ee, and 7ff. As a result, Si pillars P1 to P6 are formed and i-layers 5aa and 5bb where SGTs are to be formed are allowed to remain on the i-layer 26. Consequently, the Si pillars P1 to P6 are formed within the inner peripheries 29a and 29b of the N region 28a. When accelerated As and B ions are implanted from the upper surface of the i-layer 26 located outside the i-layers 5a and 5b, some of the As and B ions come to be implanted into surface layers of the side surfaces of the i-layers 5a and 5b due to slight inclination of the side surfaces of the i-layers 5a and 5b with respect to a perpendicular plane or due to reflection at the surface of the i-layer 26. According to the second embodiment, as discussed above, the i-layers 5a and 5b located outside the Si pillars P1 to P6 are etched away after implantation of As and B ions and thus the As and B impurities implanted in the surface layers of the side surfaces of the i-layers 5a and 5b are removed. As a result, variation in characteristics of SGTs caused by As and B impurities penetrating the Si pillars P1 to P6 can be suppressed.

Next, as shown in FIGS. 3G(a), 3G(b) and 3G(c), the same process as one shown in FIGS. 2G(a) to 2M(c) is performed. Namely, a SiO$_2$ layer 10a is formed around the outer peripheries of the i-layers 5aa and 5bb, and a HfO$_2$ layer 9d and TiN layers 14a, 14b, 14c, and 14d are formed so as to surround the outer peripheries of the Si pillars P1 to P6. A SiO$_2$ layer 19 is formed by CVD and the surface of the SiO$_2$ layer 19 is planarized by chemical mechanical polishing (CMP). A contact hole 19a is formed on the Si pillar P1, a contact hole 19b is formed on the Si pillar P6, a contact hole 19c is formed on the TiN layer 14c, and a contact hole 19d is formed on the TiN layer 14b. Ground wiring metal layers VSS1 and VSS2 respectively connected to the N$^+$ regions 16aa and 16dd through the contact holes 19a and 19b are formed and a word line metal layer WL connected to the TiN layers 14c and 14d through the contact holes 19c and 19d is formed. Then a SiO2 layer 20 is formed by CVD and the surface of the SiO$_2$ layer 20 is planarized by CMP. A contact hole 21a is formed on the TiN layer 14a, a contact hole 21b is formed on the Si pillar P2, a contact hole 21c is formed on the border line between the N$^+$ region 12bb and the N$^+$ region 13aa, a contact hole 21d is formed on the Si pillar P3, a contact hole 21e is formed on the Si pillar P4, a contact hole 21f is formed on the border line between the N$^+$ region 12cc and the P$^+$ region 13bb, a contact hole 21g is formed on the Si pillar P5, and a contact hole 21h is formed on the TiN layer 14d. An inversion bit line metal layer BLB connected to the N$^+$ region 16cc through the contact hole 21e is formed, a wiring metal layer 22a connected to the TiN layer 14a, the N$^+$ region 12cc, and the P$^+$ region 13bb through the contact holes 21a and 21f is formed, a power supply wiring metal layer VDD connected to the P$^+$ regions 17aa and 17bb through the contact holes 21b and 21g is formed, a wiring metal layer 22b connected to the TiN layer 14d, the N$^+$ region 12bb, and the P$^+$ region 13aa through the contact holes 21c and 21h is formed, and a bit line metal layer BL connected to the N$^+$ region 12bb through the contact hole 21d is formed.

Next, as shown in FIGS. 3G(a), 3G(b) and 3G(c), the same process as one shown in FIGS. 2G(a) to 2M(c) is performed. Namely, the donor impurity in the N regions 28a and 28b and the acceptor impurity in the P$^+$ region 30 and the P-layer substrate 25 are thermally diffused so as to form N regions 28aa and 28ab, a P$^+$ region 30a, and a P layer substrate 25a. The N regions 28aa and 28ab are N wells respectively formed in the i-layers 5aa and 5bb and the P$^+$ region 30a serves as a device isolation channel stopper region. As a result, device isolation is achieved by the SiO$_2$ layer 10a and the P$^+$ region 30a, and an SGT-including SRAM cell circuit formed on the N regions 28aa and 28ab for N wells is obtained.

The second embodiment of the present invention has the following effects:

1. Arsenic (As) and boron (B) ions are implanted after formation of the i-layers 5a and 5b so as to form an N region 28 for an N well and the P$^+$ region 30 for the device isolation channel stopper region. Then the i-layers 5a and 5b are etched by RIE using, as a mask, the SiO$_2$ layers 7aa, 7bb, 7cc, 7dd, 7ee, and 7ff having a circular shape in a plan view so as to form Si pillars P1 to P6. When accelerated As and B ions are implanted from the upper surface of the i-layer 26 located at the outer peripheries of the i-layers 5a and 5b, some of As and B ions come to be implanted into surface layers of the side surfaces of the i-layers 5a and 5b due to slight inclination of the side surfaces of the i-layers 5a and 5b with respect to a perpendicular plane or due to reflection at the surface of the i-layer 26. In this method, the i-layers 5a and 5b located outside the Si pillars P1 to P6 are etched away after As and B ion implantation. Accordingly, the As and B impurities implanted into the surface layers of the side surfaces of the i-layers 5a and 5b are removed. As a result, variation in characteristics of SGTs caused by As and B impurities penetrating the Si pillars P1 to P6 can be suppressed.

2. As shown in part (a) of FIGS. 3F(a), 3F(b) and 3F(c), the inner peripheries 29a and 29b of the N region 28a are located within the i-layers 5aa and 5bb and outside the Si pillars P1 to P6. Accordingly, when the N region 28a and the P$^+$ region 30 are being formed, the As and B impurities implanted into the surface layers of the side surfaces of the i-layers 5a and 5b are removed along with the Si layers located on the outer sides of the i-layers 5a and 5b during etching of the i-layers 5a and 5b for forming the Si pillars P1 to P6. As a result, variation in characteristics of SGTs caused by As and B impurities remaining in the Si pillars P1 to P6 can be suppressed.

Third Embodiment

A method for producing an SGT-including CMOS-type SRAM cell circuit according to a third embodiment of the present invention will now be described with reference to FIGS. 4A(a) to 4E(c).

According to the third embodiment, penetration of the As and B impurities into Si pillars P1 to P6 can be further suppressed compared to the second embodiment.

Figure 4A:
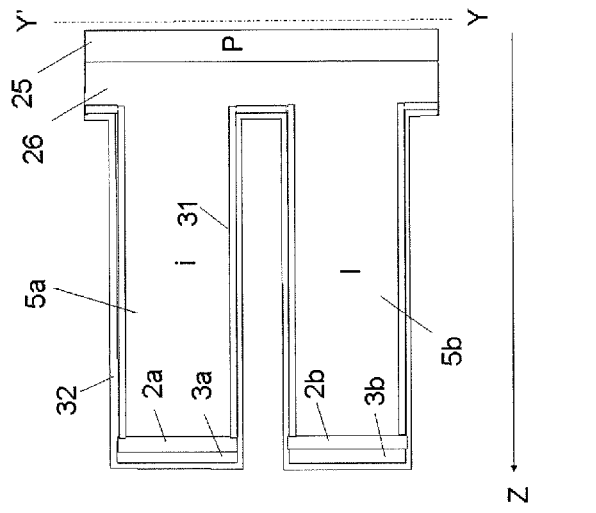
FIG. 4A(a) is a plan view of and FIGS. 4A(b) and 4A(c) are cross-sectional views of a CMOS-type SRAM cell circuit illustrating a method for producing an SGT-including semiconductor device according to a third embodiment.
Figure 4A:
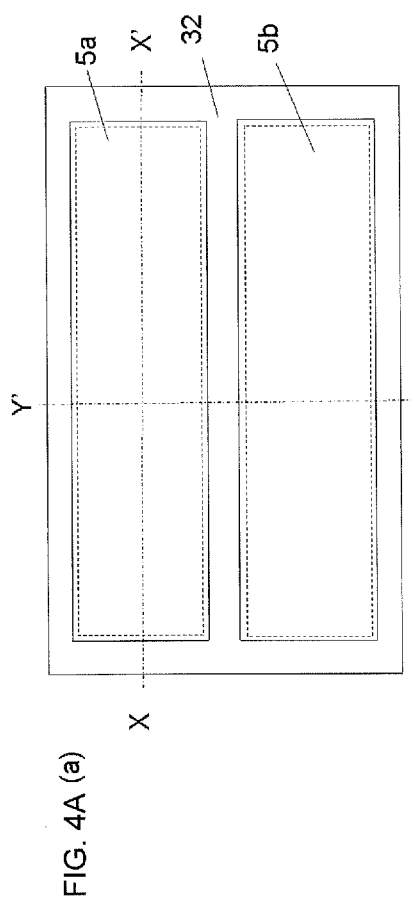
Figure 4A:
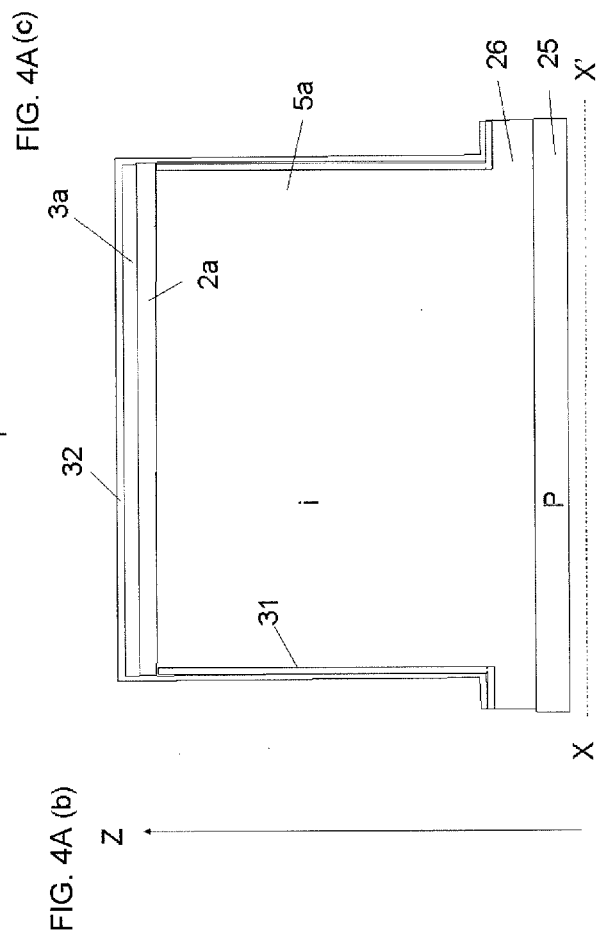

First, as shown in FIGS. 4A(a), 4A(b) and 4A(c), the same process as one shown in FIGS. 2A(a) to 2C(c) is performed and then the resist layers 4a and 4b are removed. As shown in (b) and (c) in FIGS. 4A(a), 4A(b) and 4A(c), those sides of the i-layers 5a and 5b, the SiO$_2$ layers 2a and 2b, and the SiN layers 3a and 3b which extend in the X-X' direction align with one another and those which extend in the Y-Y' direction also align with one another. Then a SiO$_2$ layer 31 is formed on the side surfaces of the i-layers 5a and 5b having a rectangular shape in a plan view and the surface of the i-layer 26. Then atomic layer deposition (ALD) is performed to cover the whole i-layers 5a and 5b and i-layer 26 with a tungsten (W) layer 32 which can withstand heat and has low oxidation rate.

Next, as shown in FIGS. 4B(a), 4B(b) and 4B(c), a resist (not shown) is applied and is evenly etched from the surface layer by an etch back technique so as to form a resist layer 33 on the i-layer 26 located outside the i-layers 5a and 5b. Then isotropic plasma etching is performed so as to remove the SiO$_2$ layer 31 and the W layer 32 not covered with the resist layer 33 and allow a SiO$_2$ layer 31a and a W layer 32a that are covered with the resist layer 33 to remain on the side surfaces of the lower portions of the i-layers 5a and 5b. Then the resist layer 33 is removed.

Next, as shown in FIGS. 4C(a), 4C(b) and 4C(c), thick SiO$_2$ layers 34a and 34b composed of SiO$_2$ having a higher oxidation rate than SiN are formed by a thermal oxidation process on side surfaces of the i-layers 5a and 5b not covered with the SiN layers 3a and 3b, the SiO$_2$ layer 31a, and the W layer 32a. Then the W layer 32a is removed.

Next, as shown in FIGS. 4D(a), 4D(b) and 4D(c), the same process as one shown in FIGS. 3C(a), 3C(b) and 3C(c) is performed to implant As ions and form an N region 28 in the surface layer of the i-layer 26 located outside the i-layers 5a and 5b.

Next, as shown in FIGS. 4E(a), 4E(b) and 4E(c), the same process as one shown in FIGS. 3D(a), 3D(b), 3D(c), 3E(a), 3E(b) and 3E(c) is performed to expand the impurity region, which is the N region 28, to the interiors of the i-layers 5aa and 5bb by thermal diffusion and to thereby form an N region 28a. B ions are then implanted to form a P$^+$ region 29 in the surface layer of the i-layer 26 located outside the i-layers 5aa and 5bb. Then RIE is performed by using the SiO$_2$ layers 7aa, 7bb, 7cc, 7dd, 7ee, and 7ff as a mask so as to form Si pillars P1 to P6. Then the same process as one shown in FIGS. 2G(a) to 2M(c) is performed to obtain an SGT-including CMOS-type SRAM cell circuit.

According to the third embodiment, as shown in FIGS. 4D(a), 4D(b) and 4D(c), thick SiO$_2$ layers 34a and 34b lie on the side surfaces of the i-layers 5a and 5b. Thus, when accelerated As and B ions are implanted from the upper surface of the i-layer 26 located outside the i-layers 5a and 5b, implantation of the ions into the surface layers of the side surfaces of the i-layers 5a and 5b caused by slight inclination of the side surfaces of the i-layers 5a and 5b with respect to a perpendicular plane or by reflection at the surface of the i-layer 26 is prevented. Accordingly, compared with the second embodiment, variation in characteristics of SGTs caused by penetration of As and B impurities into the Si pillars P1 to P6 can be suppressed.

Fourth Embodiment

A method for producing a CMOS-type SRAM cell circuit according to a fourth embodiment of the present invention will now be described with reference to FIGS. 5A(a) to 5E(c).

In the first embodiment, the Si pillars P1 to P6 are formed on the i-layers 5aa and 5bb by self-alignment in the Y-Y' direction but not in the X-X' direction. In contrast, a Si pillar Ps of the fourth embodiment is formed by self-alignment with respect to i-layers 5aa and 5bb in both the X-X' direction and the Y-Y direction.

Figure 5A:
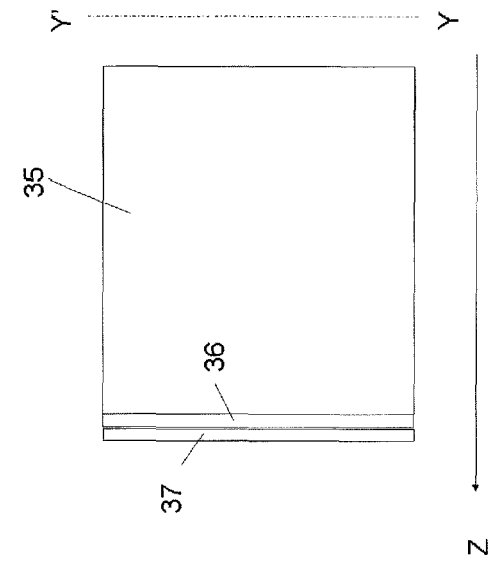
FIG. 5A(a) is a plan view of and FIGS. 5A(b) and 5A(c) are cross-sectional views of an SGT illustrating a method for producing an SGT-including semiconductor device according to a fourth embodiment.
Figure 5A:
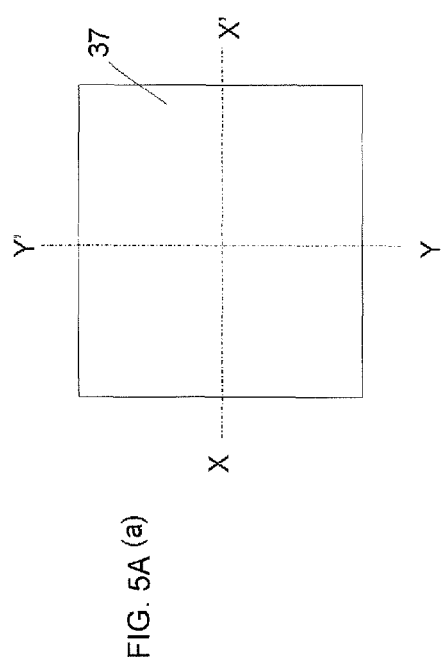
Figure 5A:
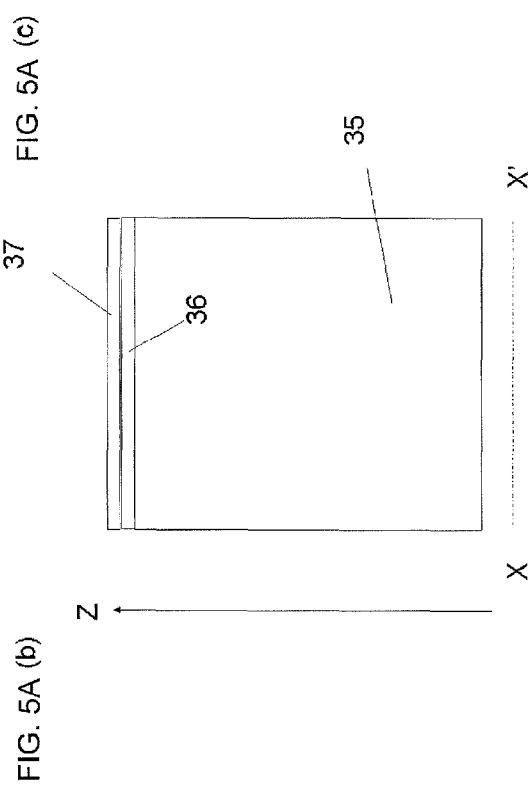

First, as shown in FIGS. 5A(a), 5A(b) and 5A(c), the same process as one shown in FIGS. 2A(a), 2A(b) and 2A(c) is performed to form a $SiO_2$ layer 36 on an i-layer substrate 35 by a thermal oxidation process, and a silicon nitride (SiN) layer 37 is formed on the $SiO_2$ layer 36.

Figure 5B:
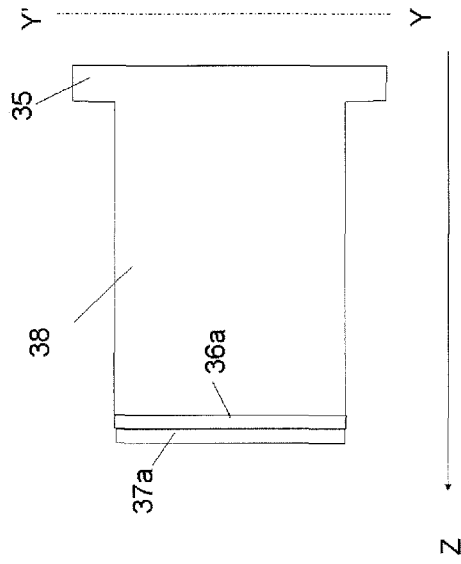
FIG. 5B(a) is a plan view of and FIGS. 5B(b) and 5B(c) are cross-sectional views of an SGT illustrating the method for producing an SGT-including semiconductor device according to the fourth embodiment.
Figure 5B:
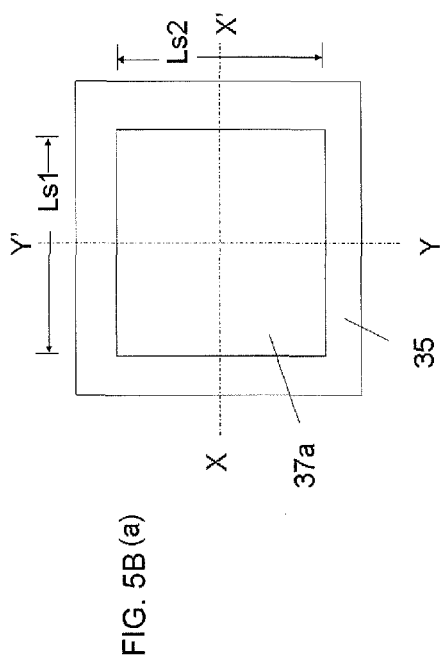
Figure 5B:
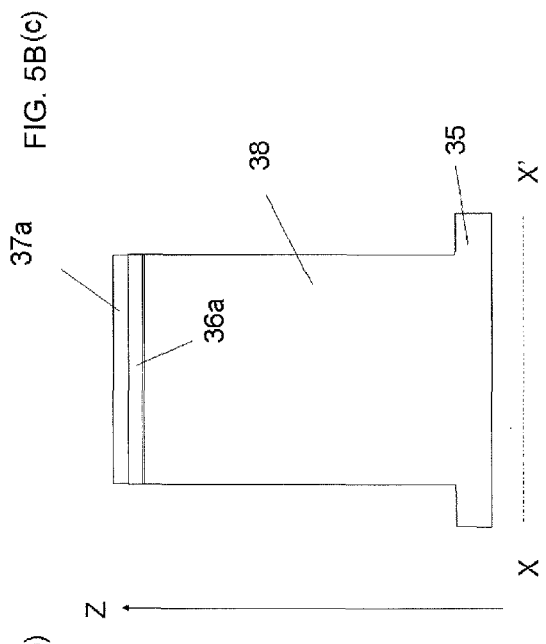

Next, as shown in FIGS. 5B(a), 5B(b) and 5B(c), the SiN layer 37 and the $SiO_2$ layer 36 are etched by using a resist layer formed by lithography as a mask so as to form a $SiO_2$ layer 36a and a SiN layer 37a each having a rectangular shape in a plan view (refer to FIG. 5B (a)). The i-layer substrate 35 is etched by using the $SiO_2$ layer 36a and the SiN layer 37 as a mask to form an i-layer 38 in an upper portion of the i-layer substrate 35. The i-layer 38 has a rectangular shape in a plan view. In the i-layer 38, a length Ls1 of one side in the X-X' direction is preferably equal to a length Ls2 of one side extending in the Y-Y' direction and the shape of the i-layer 38 in a plan view is preferably square. As shown in FIGS. 5B(b) and 5B(c), those sides of the i-layer 38, the $SiO_2$ layer 36a, and the SiN layer 37a which extend in the X-X' direction align with one another and those sides of the i-layer 38, the $SiO_2$ layer 36a, and the SiN layer 37a which extend in the Y-Y' direction align with one another.

Next, as shown in FIGS. 5C(a), 5C(b) and 5C(c), the $SiO_2$ layer 36a is etched by an isotropic plasma etching process by using the SiN layer 37a as a mask so as to form a $SiO_2$ layer 36b having a circular shape in a plan view.

Figure 5D:
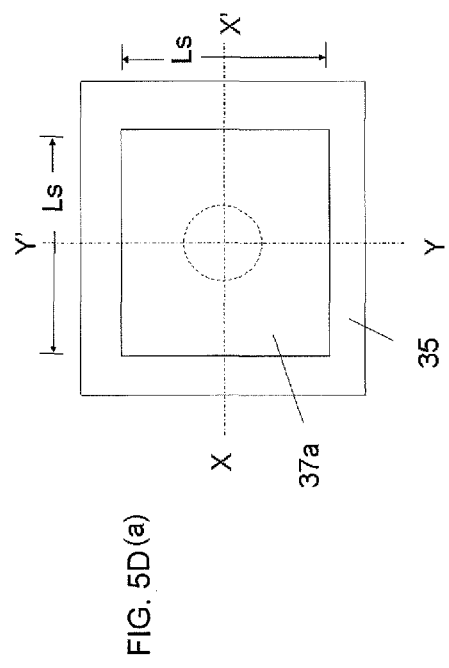
FIG. 5D(a) is a plan view of and FIGS. 5D(b) and 5D(c) are cross-sectional views of an SGT illustrating the method for producing an SGT-including semiconductor device according to the fourth embodiment.
Figure 5D:
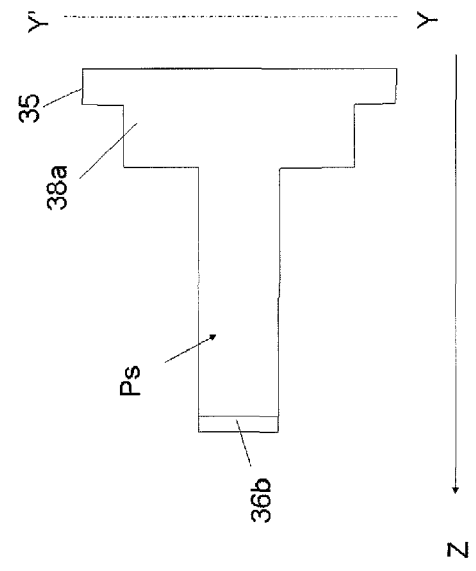
Figure 5D:
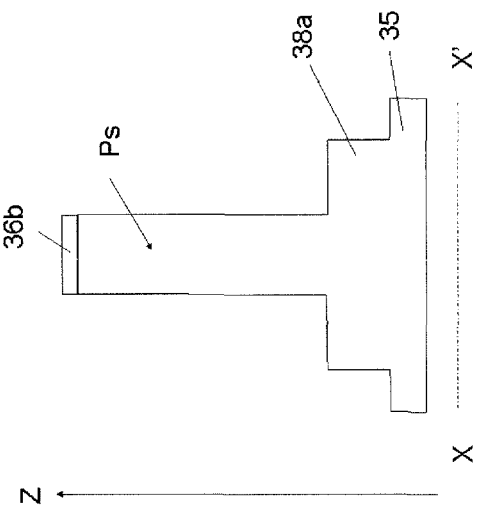

Next, as shown in FIGS. 5D(a), 5D(b) and 5D(c), the SiN layer 37a is removed and the i-layer 38 is etched by using the $SiO_2$ layer 36b as a mask so as to form a Si pillar Ps. As a result, an i-layer 38a is formed below the Si pillar Ps.

Figure 5E:
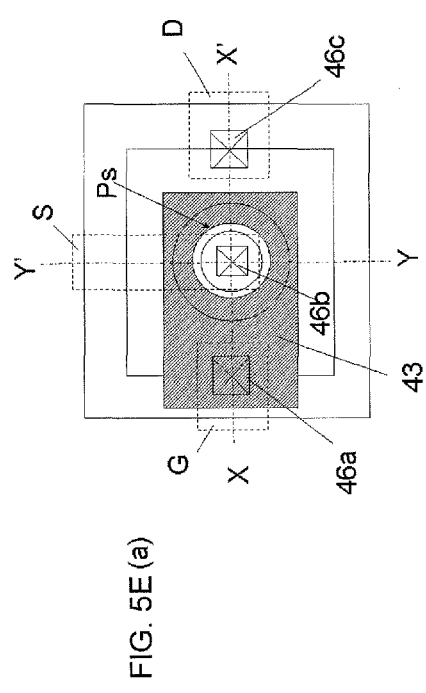
FIG. 5E(a) is a plan view of and FIGS. 5E(b) and 5E(c) are cross-sectional views of an SGT illustrating the method for producing an SGT-including semiconductor device according to the fourth embodiment.
Figure 5E:
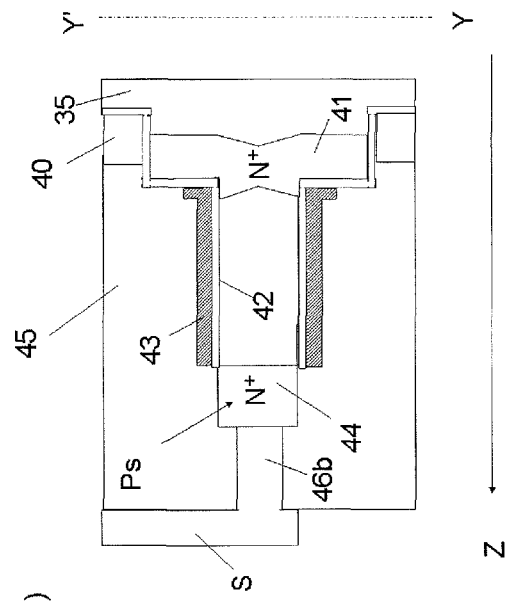
Figure 5E:
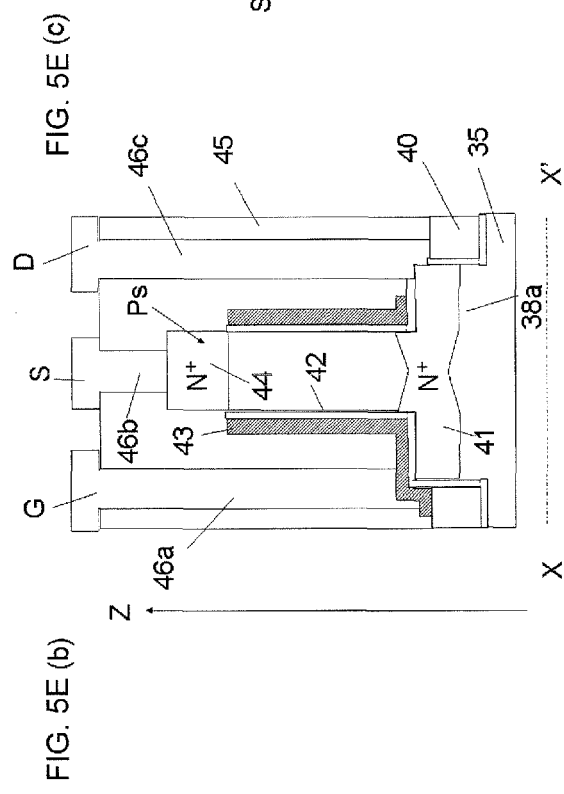

Then the same process as one shown in FIGS. 2G(a) to 2M(c) is performed to form a $SiO_2$ layer 40 on the i-layer substrate 35 located outside the i-layer 38a as shown in FIGS. 5E(a), 5E(b) and 5E(c). An $N^+$ region (this region will be expanded into an $N^+$ region 41 at the bottom of the Si pillar Ps by thermal diffusion in a subsequent step) is formed in the i-layer 38a located outside the Si pillar Ps. A $SiO_2$ layer 42 that serves as a gate is formed so as to surround the outer periphery of the Si pillar Ps. A TiN layer 43 that serves as a gate is formed so as to surround the $SiO_2$ layer 42. An $N^+$ region 44 is formed in a top portion of the Si pillar Ps. A $SiO_2$ layer 45 is formed by CVD. A contact hole 46a connected to the TiN layer 43, a contact hole 46b connected to the $N^+$ region 44, and a contact hole 46c connected to the $N^+$ region 41 are formed. A metal wiring layer G connected to the TiN layer 43 serving as a gate through the contact hole 46a, a metal wiring layer S connected to the $N^+$ region 44 through the contact hole 46b, and a metal wiring layer D connected to the $N^+$ region 41 through the contact hole 46c are formed so that wiring is formed on the $SiO_2$ layer 45. As a result, an N-channel SGT that includes an $N^+$ region 41 and an $N^+$ region 44 that respectively serve as a source and a drain or vice versa, a Si pillar Ps lying between the $N^+$ region 41 and the $N^+$ region 44 and serving as a channel, and a $SiO_2$ layer 42 and a TiN layer 43 disposed on the outer side of the Si pillar Ps is obtained.

The fourth embodiment of the present invention has the following effects.

1. The i-layer 38a that serves as a base of the Si pillar Ps and has a rectangular shape in a plan view and the $SiO_2$ layer 36b that serves as an etching mask for forming the Si pillar Ps and has a circular shape in a plan view are both formed by using the SiN layer 37a having a rectangular shape in a plan view as an etching mask. Accordingly, the positional relationship between the Si pillar Ps and the i-layer 38a is defined without requiring any mask alignment process. In other words, the Si pillar Ps and the i-layer 38a are formed by self-alignment in both the X-X' direction and the Y-Y' direction. As a result, the density of the SGT-including CMOS-type SRAM cell circuit is increased.

2. The i-layer 38a that serves as the base of the Si pillar Ps and has a rectangular shape in a plan view and the $SiO_2$ layer 36b that serves as an etching mask for forming the Si pillar Ps and has a circular shape in a plan view are both formed by using the SiN layer 37a having a rectangular shape in a plan view as an etching mask. In contrast, in the first embodiment, the i-layers 5a and 5b each having a rectangular shape in a plan view are formed and then the $SiO_2$ layers 7a, 7b, 7c, 7d, 7e, and 7f and the SiN layers 8a, 8b, 8c, 8d, 8e, and 8f each having a rectangular shape in a plan view and used to form Si pillars P1 to P6 are formed. Thus, the number of times the lithographic process is performed is one less in the fourth embodiment than in the first embodiment. Due to this streamlining, cost for producing SGT-including CMOS-type SRAM cell circuits is reduced.

Note that in the fourth embodiment, the SiN layer 37a has been described as having a rectangular shape in a plan view. This also means that the SiN layer 37a may have a square shape in a plan view. In general, the corners of a resist serving as an etching mask for the SiN layer 37a and having a rectangular shape in a plan view are rounded. As the processing size of the resist decreases, the resist becomes more and more circular in shape in a plan view. As a result, the shape of the $SiO_2$ layer 36b for forming the Si pillar Ps becomes circular in a plan view, which is desirable. Accordingly, the shapes of the SiN layer 37a and the $SiO_2$ layer 36a may be any as long as a $SiO_2$ layer 36b having a circular shape in a plan view can be formed by isotropic plasma etching.

Fifth Embodiment

A method for producing an SGT-including CMOS inverter circuit according to a fifth embodiment of the present invention will now be described with reference to FIGS. 6A(a) to 6G(c).

The fifth embodiment is characterized in that, in forming a CMOS-type inverter circuit including an N channel SGT and a P channel SGT on an i-layer substrate 50 serving as a base, Si pillars 55 and 56 that respectively constitute the N channel SGT and the P channel SGT are formed by self-alignment in both the X-X' direction and the Y-Y' direction with respect to the i-layer substrate 50 serving as the base.

First, as shown in FIGS. 6A(a), 6A(b) and 6A(c), a $SiO_2$ layer 51 is formed on the i-layer substrate 50 by a thermal oxidation process and a SiN layer 52 is formed on the SiO$_2$ layer 51. A HfO$_2$ layer 53 is formed on the SiN layer 52 by an ALD technique.

Next, as shown in FIGS. 6B(a), 6B(b) and 6B(c), a SiO$_2$ layer 51a, a SiN layer 52a, and a HfO$_2$ layer 53a that have the same rectangular shape in a plan view and are disposed on top of one another are formed by RIE using a resist (not shown) formed by lithography as a mask. Then the i-layer substrate 50 is etched by using the SiO$_2$ layer 51a, the SiN layer 52a, and the HfO$_2$ layer 53a as a mask to form an i-layer 54 having a rectangular shape in a plan view. Each of the SiO$_2$ layer 51a, the SiN layer 52a, and the HfO$_2$ layer 53a preferably has a square shape in a plan view so that a side extending in the X-X' direction has the same length as a side extending in the Y-Y' direction. Here, as shown in (b) and (c) in FIGS. 6B(a), 6B(b) and 6B(c), those sides of the i-layer 54, the SiO$_2$ layer 51a, and the SiN layer 52a which extend in the X-X' direction are aligned with one another and those which extend in the Y-Y' direction are aligned with one another.

Next, as shown in FIGS. 6C(a), 6C(b) and 6C(c), the SiO$_2$ layer 51a and the SiN layer 52a are etched by isotropic plasma etching using the HfO$_2$ layer 53a as a mask so that the etching proceeds from the outer periphery of the HfO$_2$ layer 53a toward the inner side. As a result, a SiO$_2$ layer 51b and a SiN layer 52b each having a circular shape in a plan view are formed. Then the HfO$_2$ layer 53a is removed.

Figure 6D:
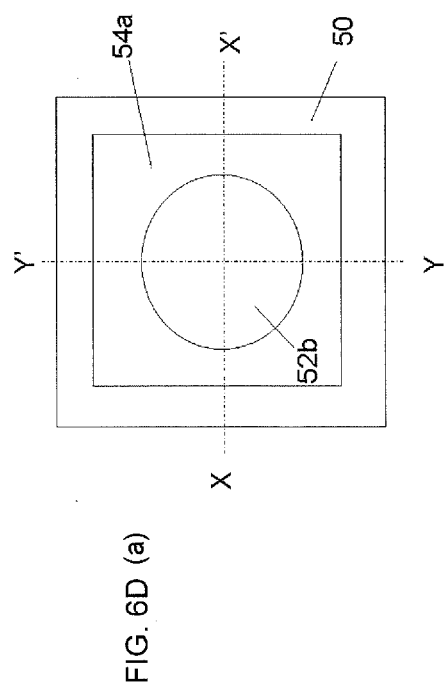
FIG. 6D(a) is a plan view of and FIGS. 6D(b) and 6D(c) are cross-sectional views of a CMOS-type inverter circuit illustrating the method for producing an SGT-including semiconductor device according to the fifth embodiment.
Figure 6D:
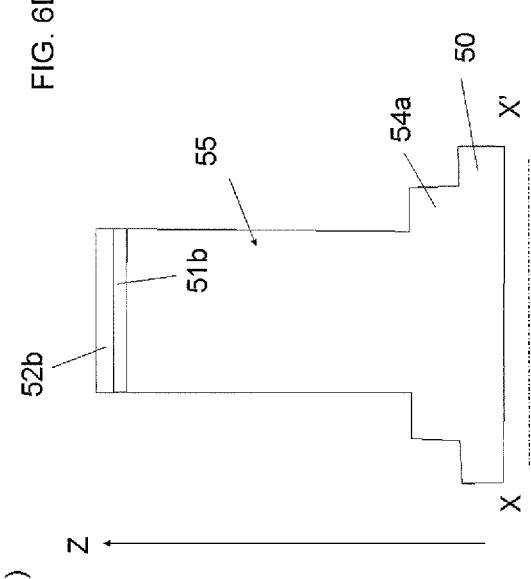
Figure 6D:
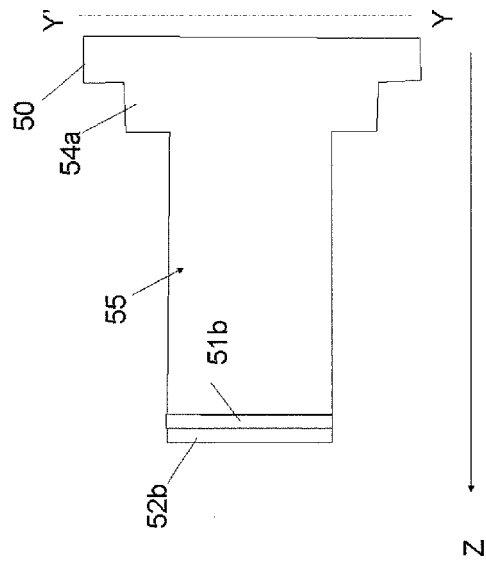

Next, as shown in FIGS. 6D(a), 6D(b) and 6D(c), the i-layer 54 is etched using the SiO$_2$ layer 51a and the SiN layer 52a as a mask to form a Si pillar 55. A Si pillar 54a having a rectangular shape in a plan view is formed under the Si pillar 55.

Figure 6E:
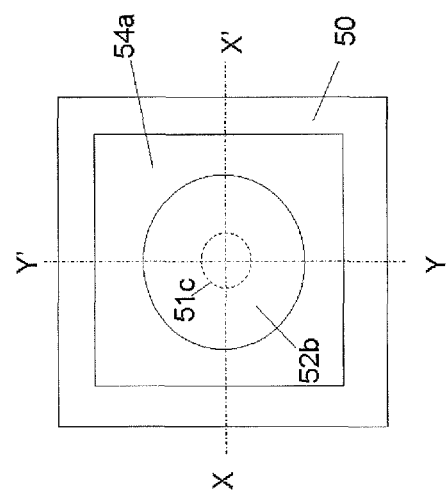
FIG. 6E(a) is a plan view of and FIGS. 6E(b) and 6E(c) are cross-sectional views of a CMOS-type inverter circuit illustrating the method for producing an SGT-including semiconductor device according to the fifth embodiment.
Figure 6E:
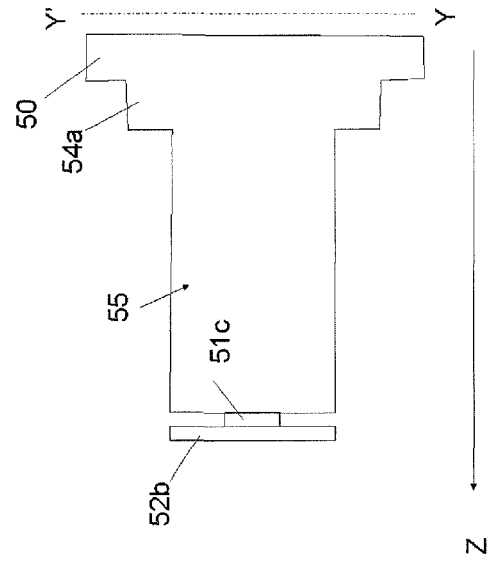
Figure 6E:
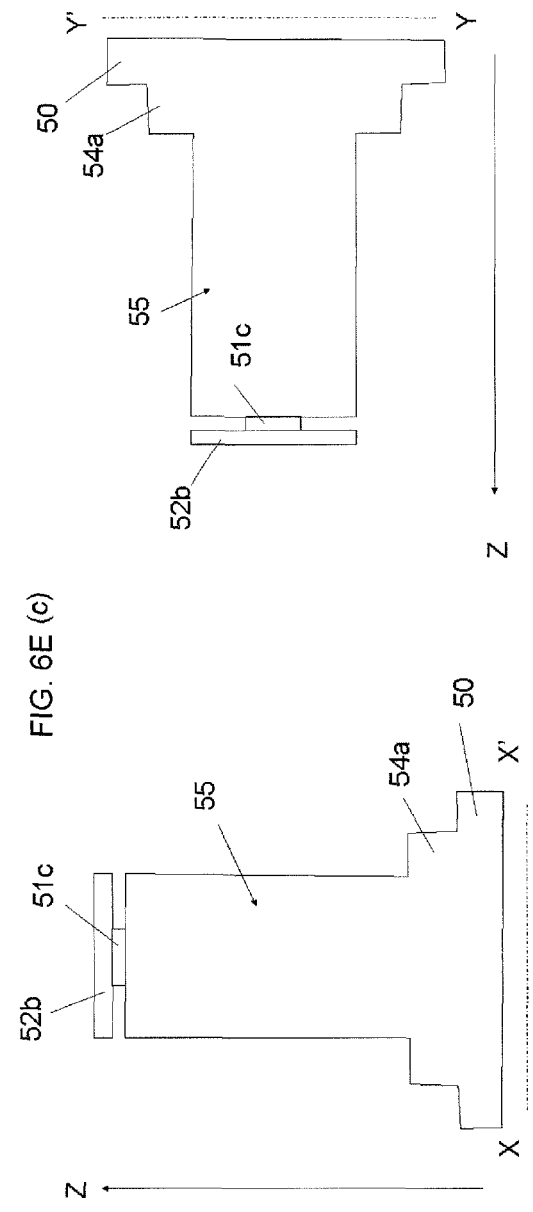

Next, as shown in FIGS. 6E(a), 6E(b) and 6E(c), the SiO$_2$ layer 51a is etched by isotropic plasma etching using the SiN layer 52b as a mask so that the etching proceeds from the outer periphery of the SiN layer 52a toward the inner side. As a result, a SiO$_2$ layer 51c having a smaller diameter than the SiO$_2$ layer 51b and a circular shape in a plan view is formed. Then the SiN layer 52b is removed.

Next, as shown in FIGS. 6F(a), 6F(b) and 6F(c), the Si pillar 55 is etched using the SiO$_2$ layer 51c as a mask so as to form a Si pillar 56. A Si pillar 55a is formed under the Si pillar 56. As a result, a Si pillar 55a constituting a first SGT (N channel SGT in FIGS. 6G(a), 6G(b) and 6G(c)) is formed on the Si pillar 54a having a rectangular shape in a plan view and a Si pillar 56 constituting a second SGT (P channel SGT in FIGS. 6G(a), 6G(b) and 6G(c)) is formed on the Si pillar 55a.

Figure 6G:
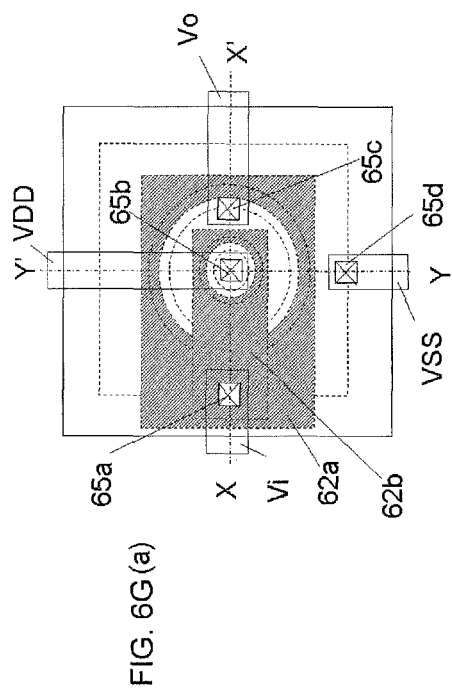
FIG. 6G(a) is a plan view of and FIGS. 6G(b) and 6G(c) are cross-sectional views of a CMOS-type inverter circuit illustrating the method for producing an SGT-including semiconductor device according to the fifth embodiment.
Figure 6G:
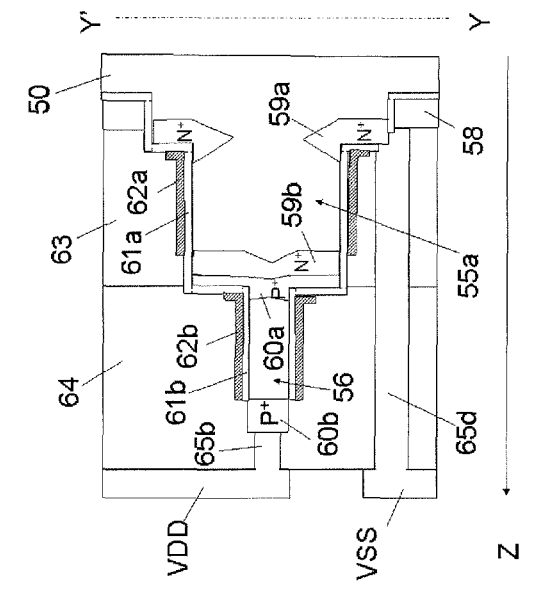
Figure 6G:
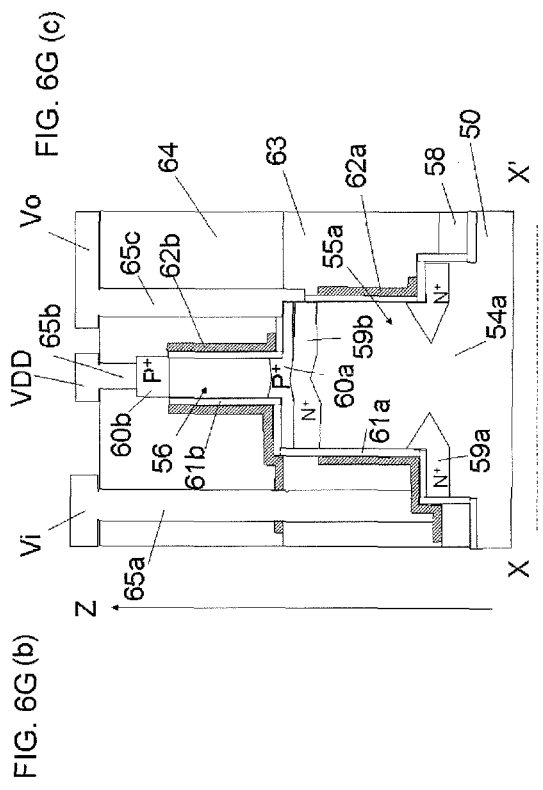
Figure 7:
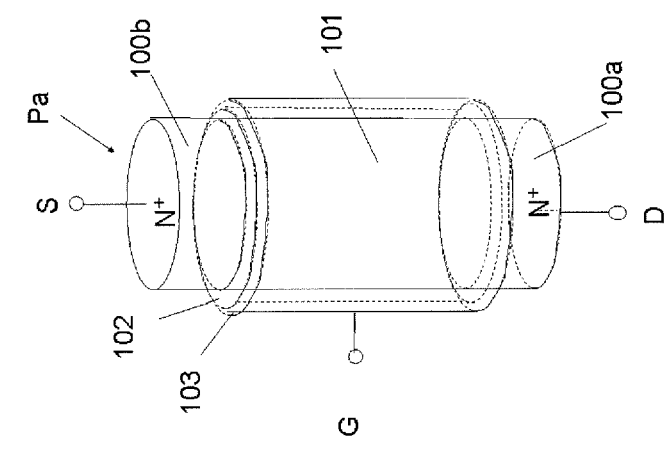
FIG. 7 is a schematic diagram showing an SGT according to related art.
Figure 8:
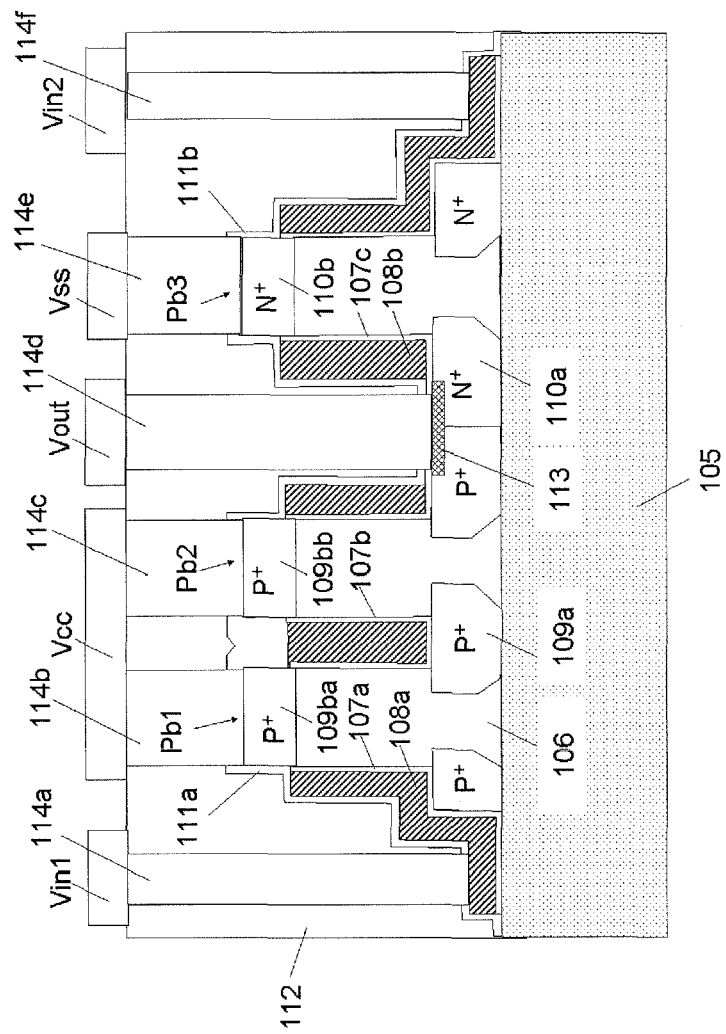
FIG. 8 is a diagram showing arrangement of Si pillars of an SGT-including CMOS inverter circuit according to related art.

Next, as shown in FIGS. 6G(a), 6G(b) and 6G(c), a SiO$_2$ layer 58 is formed on the i-layer substrate 50 located outside the Si pillar 54a. An N$^+$ region (this region will form an N$^+$ region 59a by being expanded into the interior of the Si pillar 55a by thermal diffusion by a heat treatment in a subsequent step) is formed in the Si pillar 54a located outside the Si pillar 55a. An N$^+$ region (this region will form an N$^+$ region 59b by being expanded in the upper portion of the Si pillar 55a by thermal diffusion by a heat treatment in a subsequent step) is formed in an upper portion of the Si pillar 55a. A P$^+$ region (this region will form P$^+$ region 60a by being expanded at the bottom of the Si pillar 56 by thermal diffusion by a heat treatment in a subsequent step) is formed in a top portion of the Si pillar 55a located outside the Si pillar 56. Then a SiO$_2$ layer 61a that serves as a gate insulating layer is formed so as to surround the outer periphery of the Si pillar 55a, a TiN layer 62a that serves as a gate conductor layer is formed so as to surround the SiO$_2$ layer 61a, and then a SiO$_2$ layer 63 is formed by CVD so as to surround the outer periphery of the TiN layer 62a. A SiO$_2$ layer 61b that serves as a gate insulating layer is formed so as to surround the outer periphery of the Si pillar 56, and a TiN layer 62b that serves as a gate conductor layer is formed so as to surround the SiO$_2$ layer 61b. A P$^+$ region 60b is formed in a top portion of the Si pillar 56. A SiO$_2$ layer 64 is then formed by CVD so as to surround the outer periphery of the TiN layer 62b. Then contact holes 65a, 65b, 65c, and 65d are formed in the SiO$_2$ layers 63 and 64. The contact hole 65a penetrates through the SiO$_2$ layers 63 and 64 and the TiN layer 62b and reaches the surface of the TiN layer 62a below the SiO$_2$ layer 63. Then an input wiring metal layer Vi connected to the TiN layers 62a and 62b through the contact hole 65a is formed on the SiO$_2$ layer 64, and a power supply wiring metal layer VDD connected to the P$^+$ region 60b through the contact hole 65b is formed. An output wiring metal layer Vo connected to the P$^+$ region 60a and the N$^+$ region 59b through the contact hole 65c is formed, and a ground wiring metal layer VSS connected to the N$^+$ region 59a through the contact hole 65d is formed. As a result, a CMOS-type inverter circuit that includes an N channel SGT formed in the Si pillar 55a and a P channel SGT formed in the Si pillar 56 is formed.

The fifth embodiment of the present invention has the following effects:

1. The Si pillar 55a constituting the N channel SGT is constituted by a SiO$_2$ layer 51b and a SiN layer 52b having a circular shape in a plan view and being formed by using a HfO$_2$ layer 53a having a rectangular shape in a plan view as an etching mask. Consequently, the Si pillar 54a having a rectangular shape in a plan view and the Si pillar 55a are formed by self-alignment in both the X-X' direction and the Y-Y' direction. The Si pillar 56 constituting the P channel SGT is formed by the SiO$_2$ layer 51c having a circular shape in a plan view and being formed by using the SiN layer 52b as an etching mask. As a result, the Si pillar 55a and the Si pillar 56 are formed by self-alignment in both the X-X' direction and the Y-Y' direction. Since the Si pillar 55a is formed by self-alignment with the Si pillar 54a having a rectangular shape in a plan view and the Si pillar 56 in both the X-X' direction and the Y-Y' direction, all of the Si pillar 54a having a rectangular shape in a plan view, the Si pillar 55a, and the Si pillar 56 are formed by self-alignment. As a result, the density of an SGT-including CMOS inverter circuit is increased.

2. The number of times a lithographic process is performed to form the Si pillar 54a, the Si pillar 55a, and the Si pillar 56 is one since the SiO$_2$ layer 51a, the SiN layer 52a, and the HfO$_2$ layer 53a are formed simultaneously. There is no need to perform a lithographic process for forming a Si pillar 55a on a Si pillar 54a or a lithographic process for forming a Si pillar 56 on a Si pillar 55a. Because of such streamlining of the production process, the cost of SGT-including CMOS inverter circuits can be reduced.

It should be understood that in the respective embodiments described above, Si pillars are used as semiconductor pillars constituting the SGTs. The technical idea of the present invention is also applicable to SGTs that use semiconductor pillars composed of other materials.

In each of the embodiments described above, a silicon-on-insulator (SOI) substrate that includes an i-layer substrate 1 and an insulating substrate at the bottom of the i-layer substrate 1 can be used instead of the i-layer substrate 1.

In the first embodiment, resist layers 4a and 4b formed by lithography are used as an etching mask in order to form SiO$_2$ layers 2a and 2b and SiN layers 3a and 3b on the i-layer substrate 1. The etching mask used for this need not be the resist layers 4a and 4b. For example, a HfO$_2$ layer may be formed on the SiN layer 3, resist layers 4a and 4b may be formed thereon by lithography, and the HfO$_2$ layer may be etched by using the resist layers HfO$_2$ layer as a mask. In such a case, the resist layers 4a and 4b are removed and then the HfO$_2$ layer is used as a mask to form the SiO$_2$ layers 2a and 2b and the SiN layers 3a and 3b. The HfO$_2$ layer may be a layer composed of other materials.

In the embodiments described above, the materials constituting the resist layers 4a and 4b, the SiO$_2$ layers 2a and 2b, and the SiN layers 3a and 3b may be any materials that satisfy the following requirements. That is, the SiO$_2$ layer 2 and the SiN layer 3 can be etched by using, as a mask, material layers corresponding to the resist layers 4a and 4b; material layers corresponding to the SiO$_2$ layers 2a and 2b can be formed by isotropic etching of the material layer corresponding to the SiO$_2$ layer 2 by using, as a mask, material layers corresponding to the SiN layers 3a and 3b; and i-layers 5a and 5b can be formed by etching the i-layer substrate 1 by using, as a mask, material layers corresponding to the SiO$_2$ layers 2a and 2b. As such, for the etching mask material layers and the material layers to be etched by using these etching mask material layers in the embodiments, any material can be freely selected as long as the requirements above are satisfied.

In the first embodiment, SiO$_2$ layers 7aa, 7bb, 7cc, 7dd, 7ee, and 7ff having a circular shape in a plan view are formed by isotropic plasma etching by using SiN layers 8a, 8b, 8c, 8d, 8e, and 8f as a mask. However, any isotropic etching process other than the plasma etching process may be employed as long as etching of the SiO$_2$ layers 7a, 7b, 7c, 7d, 7e, and 7f proceeds from the outer peripheries of the SiN layers 8a, 8b, 8c, 8d, 8e, and 8f toward the inner side. This applies to other embodiments as well.

In the second and third embodiments, a CMOS-type SRAM cell circuit is used as in the first embodiment. However, the CMOS-type SRAM cell circuit of the same type as the first embodiment can be applied to forming an SGT-including circuit of another embodiment in which a region for forming a well or a channel stopper impurity region is formed in a device isolation region (a region corresponding to where the N region 28 or the P$^+$ region 30 is formed in FIGS. 2C(a), 2C(b), 2C(c), 2E(a), 2E(b) and FIG. 2E(c)) outside the Si pillar.

In the first embodiment, the HfO$_2$ layer 9d is used as a gate insulating layer and the TiN layer 14 is used as a gate conductor layer. Alternatively, the gate insulating layer and the gate conductor layer may be layers composed of other materials. The structure of each layer is not limited to a single layer structure composed of a single material and may be a multi-layer structure. This applies to other embodiments as well.

The technical idea of the present invention is characterized by the method for producing Si pillars P1 to P6, a Si pillar Ps, a Si pillar 55a, and a Si pillar 56. The steps other than those for forming the Si pillars P1 to P6, Ps, 55a, and 56 may employ a semiconductor device production method other than those described in the embodiments described above.

In the fifth embodiment, a two-step structure constituted by the Si pillars 54a and 55 is formed on the i-layer substrate 50. The structure is not limited to this and the technical idea of the present invention can be applied to the cases in which a Si column having a three- or higher step structure is to be formed on the i-layer substrate 50 by self-alignment.

In the embodiments described above, CMOS-type SRAM cell circuits, a CMOS-type inverter circuit, and a single SGT are formed. The technical idea of the present invention is also applicable to forming other SGT-including circuits.

An SGT has a structure in which a gate insulating film is formed on the outer periphery of a semiconductor pillar and a gate conductor layer is formed on the outer periphery of the gate insulating film. A flash memory device having a conductor layer electrically floating between a gate conductor layer and a gate insulating layer is also a type of SGTs and the technical idea of the present invention can be applied to such a flash memory device.

In the first embodiment, the case in which one SGT is formed for each of the Si pillars P1 to P6 has been described. Alternatively, the technical idea of the present invention is applicable to a method for producing a semiconductor device in which a plurality of SGTs or an SGT and other elements (for example, a photodiode) are formed for each of the Si pillars P1 to P6. The same applies to other embodiments related to the first embodiment.

In the fourth embodiment, corners of a resist having a rectangular shape in a plan view and being used as an etching mask for the SiN layer 37a having a rectangular or square shape in a plan view are rounded. As the processing size of the resist decreases, the shape of the resist in a plan view approaches to a circle. As a result, the SiO$_2$ layer 36b for forming the Si pillar Ps comes to have a circular shape in a plan view, which is desirable. Accordingly, the shapes of the SiN layer 37a and the SiO$_2$ layer 36a may be any as long as the shape of the SiO$_2$ layer 36b in a plan view formed by isotropic plasma etching is circular in a plan view. This applies to other embodiments as well.

It should be noted here that various other embodiments and modifications are possible without departing from the broad spirit and scope of the present invention. The embodiments described above are merely exemplary and do not limit the scope of the present invention. Embodiments and modifications can be freely combined. Omitting some parts of the features of the present invention as occasion demands is also within the technical scope of the present invention.

The present invention provides a high-density, SGT-including semiconductor device.

What is claimed is:

1. A method for producing an SGT-including semiconductor device, the method comprising:
    a first and second material layers forming step of forming a first material layer on a semiconductor substrate and forming a second material layer on the first material layer;
    a third and fourth material layers forming step of etching the first material layer and the second material layer by using a mask having a rectangular shape in a plan view so as to form a third material layer and a fourth material layer that have the same rectangular shape in a plan view and that are on top of each other;
    a first island-shaped semiconductor layer forming step of etching the semiconductor substrate, the third material layer, and the fourth material layer by using a mask having a rectangular shape extending in a lengthwise direction or a crosswise direction in a plan view or a mask having a square shape in a plan view so as to form the third material layer and the fourth material layer that have the same rectangular shape in a plan view and are on top of each other and form a first island-shaped semiconductor layer that has at least one side that extends in the lengthwise or crosswise direction and aligns with at least one side of the third material layer and at least one side of the fourth material layer that extend in the lengthwise or crosswise direction;
    a fifth material layer forming step of isotropically etching the third material layer by using the fourth material layer as a mask so that etching proceeds from an outer periphery of the fourth material layer toward an inner side of the fourth material layer so as to form a fifth material layer having a circular shape in a plan view;

a material layer removing step of removing the fourth material layer;

a first semiconductor pillar forming step of etching the first island-shaped semiconductor layer by using the fifth material layer as a mask so as to form, from the first island-shaped semiconductor layer, a first semiconductor pillar having a circular shape in a plan view and a second island-shaped semiconductor layer located below the first semiconductor pillar;

a first gate insulating layer forming step of forming a first gate insulating layer on an outer periphery of the first semiconductor pillar;

a first gate conductor layer forming step of forming a first gate conductor layer on an outer periphery of the first gate insulating layer;

a first and second impurity regions forming step of forming a first impurity region in the semiconductor substrate located below the first semiconductor pillar, the first impurity region containing a donor or acceptor impurity, and forming a second impurity region inside the first semiconductor pillar and at a position distant from and above the first impurity region, the second impurity region having the same conductivity type as the first impurity region;

wherein a first surrounding gate MOS transistor (SGT) is configured in which one of the first impurity region and the second impurity region serves as a source while the other serves as a drain, the first semiconductor pillar that lies between the first impurity region and the second impurity region serves as a first channel, the first gate insulating layer formed on the outer periphery of the first semiconductor pillar surrounds the first channel, and the first gate conductor layer is formed on the outer periphery of the first gate insulating layer.

2. The method for producing an SGT-including semiconductor device according to claim 1, further comprising:

a third impurity region forming step of forming a third impurity region containing a donor or acceptor impurity by implanting ions into a surface of the semiconductor substrate located at an outer periphery of the first island-shaped semiconductor layer, wherein the third impurity region forming step is performed after the first island-shaped semiconductor layer forming step and before the first semiconductor pillar forming step.

3. The method for producing an SGT-including semiconductor device according to claim 2, further comprising:

a sixth material layer forming step of forming a sixth material layer having a low oxidation rate so as to cover the first island-shaped semiconductor layer and the semiconductor substrate located at the outer periphery of the first island-shaped semiconductor layer;

a sixth material layer processing step of causing the sixth material layer to remain at a side surface of a lower portion of the first island-shaped semiconductor layer; and an oxide layer forming step of forming an oxide layer on a side surface of the first island-shaped semiconductor layer not covered with the sixth material layer, wherein the sixth material layer forming step, the sixth material layer processing step, and the oxide layer forming step are performed after the first island-shaped semiconductor forming step and before the first semiconductor pillar forming step, and the third impurity region forming step is performed after the oxide layer forming step.

4. The method for producing an SGT-including semiconductor device according to claim 2, wherein the first semiconductor pillar is formed so as to be within an inner periphery of the third impurity region that has thermally diffused into an interior of the first island-shaped semiconductor layer after the third impurity region forming step.

5. The method for producing an SGT-including semiconductor device according to claim 1, wherein shapes of the third material layer and the fourth material layer that are on top of each other are square shapes in a plan view.

6. The method for producing an SGT-including semiconductor device according to claim 1, wherein the outer periphery of the first gate conductor layer surrounding the first semiconductor pillar is located above the second island-shaped semiconductor layer.

7. The method for producing an SGT-including semiconductor device according to claim 1, wherein the first island-shaped semiconductor layer is formed so as to have a side extending in the lengthwise direction and aligning with sides of the third material layer and the fourth material layer extending in the lengthwise direction, and have a side extending in the crosswise direction and aligning with sides of the third material layer and the fourth material layer extending in the crosswise direction.

8. A method for producing an SGT-including semiconductor device, the method comprising:

a first and second material layers forming step of forming a first material layer on a semiconductor substrate and a second material layer on the first material layer;

a sixth material layer forming step of forming a sixth material layer on the second material layer;

a third, fourth, and seventh material layers forming step of forming a third material layer, a fourth material layer, and a seventh material layer that have the same square shape in a plan view and are on top of one another, by etching the first material layer, the second material layer, and the sixth material layer by using a mask having a square shape in a plan view;

a third island-shaped semiconductor layer forming step of forming a third island-shaped semiconductor layer by etching the semiconductor substrate by using the third material layer, the fourth material layer, and the seventh material layer as a mask so that the third island-shaped semiconductor layer has a side extending in a lengthwise direction and aligning with sides of the third material layer, the fourth material layer, and the seventh material layer extending in the lengthwise direction, and has a side extending in a crosswise direction and aligning with sides of the third material layer, the fourth material layer, and the seventh material layer extending in the crosswise direction;

an eighth and ninth material layers forming step of forming an eighth material layer having a circular shape in a plan view and a ninth material having a circular shape in a plan view by isotropically etching the third material layer and the fourth material layer by using the seventh material layer as a mask so that etching proceeds from an outer periphery of the seventh material layer toward an inner side of the seventh material layer;

a seventh material layer removing step of removing the seventh material layer;

a second semiconductor pillar forming step of forming a second semiconductor pillar from the third island-shaped semiconductor layer by etching the third island-shaped semiconductor layer by using the eighth material layer and the ninth material layer as a mask;

a tenth material layer forming step of forming a tenth material layer from the eighth material layer by isotropically etching the eighth material layer by using the ninth material layer as a mask so that etching proceeds from an outer periphery of the ninth material layer toward an inner side of the ninth material layer;

a ninth material layer removing step of removing the ninth material layer;

a third and fourth semiconductor pillars forming step of forming a third semiconductor pillar having a circular shape in a plan view and a fourth semiconductor pillar having a circular shape in a plan view by etching the second semiconductor pillar by using the tenth material layer as a mask;

a fourth and fifth impurity regions forming step of forming a fourth impurity region in a bottom portion of the fourth semiconductor pillar and forming a fifth impurity region inside the fourth semiconductor pillar and at a position distant from and above the fourth impurity region, the fourth impurity region containing a donor or acceptor impurity, the fifth impurity region having the same conductivity type as the fourth impurity region;

a sixth and seventh impurity regions forming step of forming a sixth impurity region in a bottom portion of the third semiconductor pillar and forming a seventh impurity region inside the third semiconductor pillar and at a position distant from and above the sixth impurity region, the sixth impurity region containing a donor or acceptor impurity, the seventh impurity region having the same conductivity type as the sixth impurity region;

a second gate insulating layer forming step of forming a second gate insulating layer between the fourth impurity region and the fifth impurity region and on an outer periphery of the fourth semiconductor pillar;

a second gate conductor layer forming step of forming a second gate conductor layer on an outer periphery of the second gate insulating layer;

a third gate insulating layer forming step of forming a third gate insulating layer between the sixth impurity region and the seventh impurity region and on an outer periphery of the third semiconductor pillar; and a third gate conductor layer forming step of forming a third gate conductor layer on an outer periphery of the third gate insulating layer, wherein a second SGT is formed in which one of the fourth impurity region and the fifth impurity region serves as a source while the other serves as a drain, the fourth semiconductor pillar that lies between the fourth impurity region and the fifth impurity region serves as a second channel, the second gate insulating layer on the outer periphery of the fourth semiconductor pillar surrounds the second channel, and the second gate conductor layer is formed on the outer periphery of the second gate insulating layer, and a third SGT is formed in which one of the sixth impurity region and the seventh impurity region serves as a source while the other serves as a drain, the third semiconductor pillar that lies between the sixth impurity region and the seventh impurity region serves as a third channel, the third gate insulating layer on the outer periphery of the third semiconductor pillar surrounds the third channel, and the third gate conductor layer is formed on the outer periphery of the third gate insulating layer.

* * * * *